US011451419B2

(12) United States Patent
    Li et al.

(10) Patent No.: US 11,451,419 B2
(45) Date of Patent: Sep. 20, 2022

(54) INTEGRATING VOLTERRA SERIES MODEL AND DEEP NEURAL NETWORKS TO EQUALIZE NONLINEAR POWER AMPLIFIERS

(71) Applicant: The Research Foundation for The State University of New York, Binghamton, NY (US)

(72) Inventors: Xiaohua Li, Johnson City, NY (US); Robert Thompson, Quakertown, PA (US)

(73) Assignee: The Research Foundation for The State University, Binghamton, NY (US)

( * ) Notice: Subject to any disclaimer, the term of this patent is extended or adjusted under 35 U.S.C. 154(b) by 0 days.

(21) Appl. No.: 17/234,102

(22) Filed: Apr. 19, 2021

(65) Prior Publication Data
    US 2021/0243056 A1    Aug. 5, 2021

Related U.S. Application Data

(63) Continuation of application No. 16/812,229, filed on Mar. 6, 2020, now Pat. No. 10,985,951.
    (Continued)

(51) Int. Cl.
    H03H 7/30         (2006.01)
    H03H 7/40         (2006.01)
    (Continued)

(52) U.S. Cl.
    CPC ......... H04L 25/03165 (2013.01); G06N 3/04 (2013.01); G06N 3/08 (2013.01);
    (Continued)

(58) Field of Classification Search
    CPC ......... H04L 25/03165; H04L 25/03133; H04L 27/2646; H04B 1/16; H04B 1/0028;
    (Continued)

(56) References Cited

U.S. PATENT DOCUMENTS 4,615,038 A    9/1986   Lim et al.
    4,669,116 A    5/1987   Agazzi et al.
    (Continued)

OTHER PUBLICATIONS

U.S. Appl. No. 10/003,364, filed Jun. 19, 2018, Willis III et al.
    (Continued)

*Primary Examiner* — Phuong Phu
    (74) *Attorney, Agent, or Firm* — Hoffberg & Associates; Steven M. Hoffberg

(57) ABSTRACT

The nonlinearity of power amplifiers (PAs) has been a severe constraint in performance of modern wireless transceivers. This problem is even more challenging for the fifth generation (5G) cellular system since 5G signals have extremely high peak to average power ratio. Non-linear equalizers that exploit both deep neural networks (DNNs) and Volterra series models are provided to mitigate PA nonlinear distortions. The DNN equalizer architecture consists of multiple convolutional layers. The input features are designed according to the Volterra series model of nonlinear PAs. This enables the DNN equalizer to effectively mitigate nonlinear PA distortions while avoiding over-fitting under limited training data. The non-linear equalizers demonstrate superior performance over conventional nonlinear equalization approaches.

20 Claims, 11 Drawing Sheets

System block diagram with nonlinear power amplifier and deep neural network equalizer.

Related U.S. Application Data

(60) Provisional application No. 62/819,054, filed on Mar. 15, 2019.

(51) Int. Cl.

| | | |
|---|---|---|
| *H03K 5/159* | (2006.01) | |
| *H04L 25/03* | (2006.01) | |
| *H04B 1/16* | (2006.01) | |
| *H03F 3/20* | (2006.01) | |
| *G06N 3/04* | (2006.01) | |
| *G06N 3/08* | (2006.01) | |
| *H03F 1/32* | (2006.01) | |

(52) U.S. Cl.
 CPC ............... *H03F 1/32* (2013.01); *H03F 3/20* (2013.01); *H04B 1/16* (2013.01); *H03F 2200/451* (2013.01)

(58) Field of Classification Search
 CPC ........ H03F 3/20; H03F 1/32; H03F 2200/451; H03F 1/3258; G06N 3/04; G06N 3/08
 USPC ....... 375/229, 231, 232, 316, 329, 320, 262, 375/264
 See application file for complete search history.

(56) References Cited

U.S. PATENT DOCUMENTS

| | | | |
|---|---|---|---|
| 4,870,371 | A | 9/1989 | Gottwald et al. |
| 5,038,187 | A | 8/1991 | Zhou |
| 5,309,481 | A | 5/1994 | Viviano et al. |
| 5,329,586 | A | 7/1994 | Agazzi |
| 5,424,680 | A | 6/1995 | Nazarathy et al. |
| 5,438,625 | A | 8/1995 | Klippel |
| 5,539,774 | A | 7/1996 | Nobakht et al. |
| 5,647,023 | A | 7/1997 | Agazzi et al. |
| 5,692,011 | A | 11/1997 | Nobakht et al. |
| 5,694,476 | A | 12/1997 | Klippel |
| 5,744,969 | A | 4/1998 | Grochowski et al. |
| 5,745,597 | A | 4/1998 | Agazzi et al. |
| 5,790,692 | A | 8/1998 | Price et al. |
| 5,792,062 | A | 8/1998 | Poon et al. |
| 5,815,585 | A | 9/1998 | Klippel |
| 5,889,823 | A | 3/1999 | Agazzi et al. |
| 5,924,086 | A | 7/1999 | Mathur et al. |
| 5,938,594 | A | 8/1999 | Poon et al. |
| 5,991,023 | A | 11/1999 | Morawski et al. |
| 6,002,479 | A | 12/1999 | Barwicz et al. |
| 6,005,952 | A | 12/1999 | Klippel |
| 6,064,265 | A | 5/2000 | Yun et al. |
| 6,166,599 | A | 12/2000 | Aparin et al. |
| 6,181,754 | B1 | 1/2001 | Chen |
| 6,201,455 | B1 | 3/2001 | Kusunoki |
| 6,201,839 | B1 | 3/2001 | Kavcic et al. |
| 6,236,837 | B1 | 5/2001 | Midya |
| 6,240,278 | B1 | 5/2001 | Midya et al. |
| 6,288,610 | B1 | 9/2001 | Miyashita |
| 6,335,767 | B1 | 1/2002 | Twitchell et al. |
| 6,351,740 | B1 | 2/2002 | Rabinowitz |
| 6,381,212 | B1 | 4/2002 | Larkin |
| 6,393,259 | B1 | 5/2002 | Kusunoki |
| 6,406,438 | B1 | 6/2002 | Thornton |
| 6,408,079 | B1 | 6/2002 | Katayama et al. |
| 6,438,180 | B1 | 8/2002 | Kavcic et al. |
| 6,453,308 | B1 | 9/2002 | Zhao et al. |
| 6,504,885 | B1 | 1/2003 | Chen |
| 6,510,257 | B1 | 1/2003 | Barwicz et al. |
| 6,512,417 | B2 | 1/2003 | Booth et al. |
| 6,532,272 | B1 | 3/2003 | Ryan et al. |
| 6,563,870 | B1 | 5/2003 | Schenk |
| 6,600,794 | B1 | 7/2003 | Agarossi et al. |
| 6,633,208 | B2 | 10/2003 | Salkola et al. |
| 6,636,115 | B2 | 10/2003 | Kim et al. |
| 6,668,256 | B1 | 12/2003 | Lynch |
| 6,675,125 | B2 | 1/2004 | Bizjak |
| 6,687,235 | B1 | 2/2004 | Chu |
| 6,690,693 | B1 | 2/2004 | Crowder |
| 6,697,768 | B2 | 2/2004 | Jones et al. |
| 6,711,094 | B1 | 3/2004 | Katz et al. |
| 6,714,481 | B1 | 3/2004 | Katz et al. |
| 6,718,087 | B2 | 4/2004 | Cho |
| 6,775,646 | B1 | 8/2004 | Tufillaro et al. |
| 6,778,966 | B2 | 8/2004 | Bizjak |
| 6,788,719 | B2 | 9/2004 | Crowder |
| 6,812,792 | B2 | 11/2004 | Mattsson et al. |
| 6,826,331 | B2 | 11/2004 | Barwicz et al. |
| 6,839,657 | B2 | 1/2005 | Verbeyst et al. |
| 6,850,871 | B1 | 2/2005 | Barford et al. |
| 6,868,380 | B2 | 3/2005 | Kroeker |
| 6,885,954 | B2 | 4/2005 | Jones et al. |
| 6,895,262 | B2 | 5/2005 | Cortes et al. |
| 6,922,552 | B2 | 7/2005 | Noori |
| 6,934,655 | B2 | 8/2005 | Jones et al. |
| 6,940,790 | B1 | 9/2005 | Powelson et al. |
| 6,947,857 | B2 | 9/2005 | Jones et al. |
| 6,951,540 | B2 | 10/2005 | Ebbini et al. |
| 6,954,476 | B2 | 10/2005 | Coldren et al. |
| 6,956,433 | B2 | 10/2005 | Kim et al. |
| 6,982,939 | B2 | 1/2006 | Powelson et al. |
| 6,992,519 | B2 | 1/2006 | Vilander et al. |
| 6,999,201 | B1 | 2/2006 | Shimizu |
| 6,999,510 | B2 | 2/2006 | Batruni |
| 7,007,253 | B2 | 2/2006 | Gullapalli et al. |
| 7,016,823 | B2 | 3/2006 | Yang |
| 7,027,981 | B2 | 4/2006 | Bizjak |
| 7,061,943 | B2 | 6/2006 | Coldren et al. |
| 7,065,511 | B2 | 6/2006 | Zhao et al. |
| 7,071,797 | B2 | 7/2006 | Ye |
| 7,084,974 | B1 | 8/2006 | Barwicz et al. |
| 7,092,043 | B2 | 8/2006 | Vorenkamp et al. |
| 7,113,037 | B2 | 9/2006 | Nezami |
| 7,123,663 | B2 | 10/2006 | De Gaudenzi et al. |
| 7,151,405 | B2 | 12/2006 | Nezami |
| 7,176,757 | B2 | 2/2007 | Nakatani |
| 7,190,292 | B2 | 3/2007 | Bizjak |
| 7,206,420 | B2 | 4/2007 | Bizjak |
| 7,209,566 | B2 | 4/2007 | Griniasty |
| 7,212,640 | B2 | 5/2007 | Bizjak |
| 7,212,933 | B2 | 5/2007 | Kouri et al. |
| 7,236,156 | B2 | 6/2007 | Liberty et al. |
| 7,236,212 | B2 | 6/2007 | Carr et al. |
| 7,239,301 | B2 | 7/2007 | Liberty et al. |
| 7,239,668 | B2 | 7/2007 | De Gaudenzi et al. |
| 7,251,297 | B2 | 7/2007 | Agazzi |
| 7,268,620 | B2 | 9/2007 | Nygren et al. |
| 7,272,594 | B1 | 9/2007 | Lynch et al. |
| 7,286,009 | B2 | 10/2007 | Andersen et al. |
| 7,295,961 | B2 | 11/2007 | Root et al. |
| 7,304,591 | B2 | 12/2007 | Raphaeli |
| 7,305,639 | B2 | 12/2007 | Floyd et al. |
| 7,308,032 | B2 | 12/2007 | Capofreddi |
| 7,333,559 | B2 | 2/2008 | Song et al. |
| 7,348,844 | B2 | 3/2008 | Jaenecke |
| 7,400,807 | B2 | 7/2008 | Minelly et al. |
| 7,403,884 | B2 | 7/2008 | Hemmett |
| 7,412,469 | B2 | 8/2008 | Dalipi |
| 7,423,699 | B2 | 9/2008 | Vorenkamp et al. |
| 7,436,883 | B2 | 10/2008 | Batruni |
| 7,443,326 | B2 | 10/2008 | Raphaeli |
| 7,489,298 | B2 | 2/2009 | Liberty et al. |
| 7,512,900 | B2 | 3/2009 | Lynch et al. |
| 7,542,518 | B2 | 6/2009 | Kim et al. |
| 7,551,668 | B2 | 6/2009 | Higashino et al. |
| 7,558,391 | B2 | 7/2009 | Bizjak |
| 7,570,856 | B1 | 8/2009 | Minelly et al. |
| 7,571,401 | B1 | 8/2009 | Rao et al. |
| 7,576,606 | B2 | 8/2009 | Andersen et al. |
| 7,589,725 | B2 | 9/2009 | Snyder et al. |
| 7,590,518 | B2 | 9/2009 | Phillips |
| 7,602,240 | B2 | 10/2009 | Gao et al. |
| 7,606,539 | B2 | 10/2009 | Singerl et al. |
| 7,610,183 | B2 | 10/2009 | Danko |
| 7,657,405 | B2 | 2/2010 | Singerl et al. |

(56) References Cited

U.S. PATENT DOCUMENTS

| | | |
|---|---|---|
| 7,720,232 B2 | 5/2010 | Oxford |
| 7,720,236 B2 | 5/2010 | Oxford |
| 7,728,658 B2 | 6/2010 | Andersen et al. |
| 7,729,446 B2 | 6/2010 | Copeland |
| 7,733,177 B1 | 6/2010 | Borkar et al. |
| 7,746,955 B2 | 6/2010 | Rexberg |
| 7,755,425 B2 | 7/2010 | Klingberg et al. |
| 7,760,887 B2 | 7/2010 | Oxford |
| 7,773,692 B2 | 8/2010 | Copeland et al. |
| 7,774,176 B2 | 8/2010 | Rao et al. |
| 7,795,858 B2 | 9/2010 | Tufillaro et al. |
| 7,796,960 B1 | 9/2010 | Rashev et al. |
| 7,808,315 B2 | 10/2010 | Goodman et al. |
| 7,812,666 B2 | 10/2010 | Chieng et al. |
| 7,821,337 B2 | 10/2010 | Yamanouchi et al. |
| 7,821,581 B2 | 10/2010 | Vorenkamp et al. |
| 7,822,146 B2 | 10/2010 | Copeland |
| 7,826,624 B2 | 11/2010 | Oxford |
| 7,847,631 B2 | 12/2010 | Jiang et al. |
| 7,852,913 B2 | 12/2010 | Agazzi et al. |
| 7,853,443 B2 | 12/2010 | Hemmett |
| 7,864,881 B2 | 1/2011 | Hori et al. |
| 7,865,177 B2 | 1/2011 | Sorrells et al. |
| 7,873,172 B2 | 1/2011 | Lashkari |
| 7,885,025 B2 | 2/2011 | Eppler et al. |
| 7,885,797 B2 | 2/2011 | Koppl et al. |
| 7,889,007 B2 | 2/2011 | Kim et al. |
| 7,894,788 B2 | 2/2011 | Keehr et al. |
| 7,895,006 B2 | 2/2011 | Thompson |
| 7,899,416 B2 | 3/2011 | McCallister et al. |
| 7,902,925 B2 | 3/2011 | Kim et al. |
| 7,903,137 B2 | 3/2011 | Oxford et al. |
| 7,924,942 B2 | 4/2011 | Rexberg |
| 7,929,375 B2 | 4/2011 | Nuttall et al. |
| 7,932,782 B2 | 4/2011 | Lau et al. |
| 7,970,150 B2 | 6/2011 | Oxford |
| 7,970,151 B2 | 6/2011 | Oxford et al. |
| 7,979,837 B1 | 7/2011 | Rao et al. |
| 7,991,073 B2 | 8/2011 | Utsunomiya et al. |
| 7,991,167 B2 | 8/2011 | Oxford |
| 7,995,674 B2 | 8/2011 | Hori et al. |
| 8,005,858 B1 | 8/2011 | Lynch et al. |
| 8,023,668 B2 | 9/2011 | Pfaffinger |
| 8,031,882 B2 | 10/2011 | Ding |
| 8,039,871 B2 | 10/2011 | Nogami |
| 8,045,066 B2 | 10/2011 | Vorenkamp et al. |
| 8,046,199 B2 | 10/2011 | Copeland |
| 8,065,060 B2 | 11/2011 | Danko |
| 8,085,943 B2 | 12/2011 | Bizjak |
| 8,089,689 B1 | 1/2012 | Savage-Leuchs |
| 8,105,270 B2 | 1/2012 | Hunter |
| 8,139,630 B2 | 3/2012 | Agazzi et al. |
| 8,148,983 B2 | 4/2012 | Biber et al. |
| 8,149,950 B2 | 4/2012 | Kim et al. |
| 8,160,191 B2 | 4/2012 | Row et al. |
| 8,165,854 B1 | 4/2012 | Wei |
| 8,170,508 B2 | 5/2012 | Davies |
| 8,185,853 B2 | 5/2012 | Kim et al. |
| 8,193,566 B2 | 6/2012 | Nogami |
| 8,195,103 B2 | 6/2012 | Waheed et al. |
| 8,199,399 B1 | 6/2012 | Savage-Leuchs |
| 8,213,880 B2 | 7/2012 | van Zelm et al. |
| 8,244,787 B2 | 8/2012 | Principe et al. |
| 8,260,732 B2 | 9/2012 | Al-Duwaish et al. |
| 8,265,583 B1 | 9/2012 | Venkataraman |
| 8,270,530 B2 | 9/2012 | Hamada et al. |
| 8,294,605 B1 | 10/2012 | Pagnanelli |
| 8,295,790 B2 | 10/2012 | Koren et al. |
| 8,306,488 B2 | 11/2012 | Rashev et al. |
| 8,310,312 B2 | 11/2012 | Lee et al. |
| 8,315,970 B2 | 11/2012 | Zalay et al. |
| 8,331,511 B2 | 12/2012 | Beidas et al. |
| 8,331,879 B2 | 12/2012 | van Zelm et al. |
| 8,345,348 B1 | 1/2013 | Savage-Leuchs |
| 8,346,692 B2 | 1/2013 | Rouat et al. |
| 8,346,693 B2 | 1/2013 | Al-Duwaish et al. |
| 8,346,711 B2 | 1/2013 | Al-Duwaish et al. |
| 8,346,712 B2 | 1/2013 | Rizvi et al. |
| 8,351,876 B2 | 1/2013 | McCallister et al. |
| 8,354,884 B2 | 1/2013 | Braithwaite |
| 8,355,684 B2 | 1/2013 | Yu et al. |
| 8,358,169 B2 | 1/2013 | Sen et al. |
| 8,364,095 B2 | 1/2013 | van Zelm et al. |
| 8,369,447 B2 | 2/2013 | Fuller et al. |
| 8,369,595 B1 | 2/2013 | Derakhshani et al. |
| 8,380,773 B2 | 2/2013 | Batruni |
| 8,390,375 B2 | 3/2013 | Miyashita |
| 8,390,376 B2 | 3/2013 | Bai |
| 8,396,693 B2 | 3/2013 | Danko |
| 8,410,843 B2 | 4/2013 | Goodman et al. |
| 8,410,850 B2 | 4/2013 | Mazzucco et al. |
| 8,412,133 B2 | 4/2013 | Davies |
| 8,421,534 B2 | 4/2013 | Kim et al. |
| 8,432,220 B2 | 4/2013 | Peyresoubes et al. |
| 8,437,513 B1 | 5/2013 | Derakhshani et al. |
| 8,463,582 B2 | 6/2013 | Song et al. |
| 8,467,438 B2 | 6/2013 | Beidas |
| 8,477,581 B1 | 7/2013 | Liu et al. |
| 8,483,343 B2 | 7/2013 | Agazzi et al. |
| 8,483,450 B1 | 7/2013 | Derakhshani et al. |
| 8,487,706 B2 | 7/2013 | Li et al. |
| 8,489,047 B2 | 7/2013 | McCallister et al. |
| 8,494,463 B2 | 7/2013 | Davies |
| 8,498,369 B2 | 7/2013 | Forrester et al. |
| 8,509,347 B2 | 8/2013 | Kim et al. |
| 8,509,712 B2 | 8/2013 | van Zelm et al. |
| 8,519,440 B2 | 8/2013 | Nogami |
| 8,532,215 B2 | 9/2013 | Huang et al. |
| 8,532,964 B2 | 9/2013 | Wei |
| 8,538,039 B2 | 9/2013 | Pfaffinger |
| 8,564,368 B1 | 10/2013 | Bai |
| 8,565,343 B1 | 10/2013 | Husted et al. |
| 8,577,311 B2 | 11/2013 | Wolf et al. |
| 8,587,375 B2 | 11/2013 | Kim et al. |
| 8,599,014 B2 | 12/2013 | Prykari et al. |
| 8,599,050 B2 | 12/2013 | Rachid et al. |
| 8,605,814 B2 | 12/2013 | McCallister et al. |
| 8,605,819 B2 | 12/2013 | Lozhkin |
| 8,611,190 B2 | 12/2013 | Hughes et al. |
| 8,611,459 B2 | 12/2013 | McCallister |
| 8,611,820 B2 | 12/2013 | Gilmore |
| 8,615,208 B2 | 12/2013 | McCallister et al. |
| 8,619,905 B2 | 12/2013 | Ishikawa et al. |
| 8,620,631 B2 | 12/2013 | Al-Duwaish |
| 8,626,089 B2 | 1/2014 | Singerl et al. |
| 8,649,743 B2 | 2/2014 | McCallister et al. |
| 8,675,925 B2 | 3/2014 | Derakhshani et al. |
| 8,704,595 B2 | 4/2014 | Kim et al. |
| 8,705,166 B1 | 4/2014 | Savage-Leuchs |
| 8,712,345 B2 | 4/2014 | Ishikawa et al. |
| 8,718,178 B1 | 5/2014 | Carbone et al. |
| 8,718,209 B2 | 5/2014 | Lozhkin |
| 8,724,857 B2 | 5/2014 | Derakhshani et al. |
| 8,725,706 B2 | 5/2014 | Arrasvuori et al. |
| 8,737,937 B2 | 5/2014 | Ishikawa et al. |
| 8,737,938 B2 | 5/2014 | Rashev et al. |
| 8,744,141 B2 | 6/2014 | Derakhshani et al. |
| 8,744,377 B2 | 6/2014 | Rimini et al. |
| 8,758,271 B2 | 6/2014 | Hunter et al. |
| 8,761,409 B2 | 6/2014 | Pfaffinger |
| 8,766,917 B2 | 7/2014 | Liberty et al. |
| 8,767,869 B2 | 7/2014 | Rimini et al. |
| 8,776,625 B2 | 7/2014 | Questo et al. |
| 8,780,693 B2 | 7/2014 | Kim et al. |
| 8,787,628 B1 | 7/2014 | Derakhshani et al. |
| 8,798,559 B2 | 8/2014 | Kilambi et al. |
| 8,804,807 B2 | 8/2014 | Liu et al. |
| 8,804,871 B2 | 8/2014 | Rimini et al. |
| 8,811,532 B2 | 8/2014 | Bai |
| 8,823,452 B2 | 9/2014 | Chen et al. |
| 8,831,074 B2 | 9/2014 | Agazzi et al. |
| 8,831,133 B2 | 9/2014 | Azadet et al. |
| 8,831,135 B2 | 9/2014 | Utsunomiya et al. |
| 8,838,218 B2 | 9/2014 | Khair |

(56) References Cited

U.S. PATENT DOCUMENTS

| | | |
|---|---|---|
| 8,843,088 B2 | 9/2014 | van Zelm et al. |
| 8,843,089 B2 | 9/2014 | Davies |
| 8,849,611 B2 | 9/2014 | Haviland et al. |
| 8,855,175 B2 | 10/2014 | Wyville et al. |
| 8,855,234 B2 | 10/2014 | Kim et al. |
| 8,867,601 B2 | 10/2014 | Beidas |
| 8,874,411 B2 | 10/2014 | Ishikawa et al. |
| 8,885,765 B2 | 11/2014 | Zhang et al. |
| 8,886,341 B1 | 11/2014 | van Zelm et al. |
| 8,891,701 B1 | 11/2014 | Eliaz et al. |
| 8,896,471 B1 | 11/2014 | Pagnanelli |
| 8,897,351 B2 | 11/2014 | Kravtsov |
| 8,898,567 B2 | 11/2014 | Arrasvuori et al. |
| 8,903,192 B2 | 12/2014 | Malik et al. |
| 8,909,176 B2 | 12/2014 | van Zelm et al. |
| 8,909,328 B2 | 12/2014 | Chon |
| 8,933,752 B2 | 1/2015 | Nagatani et al. |
| 8,934,573 B2 | 1/2015 | McCallister et al. |
| 8,958,470 B2 | 2/2015 | Bolstad et al. |
| 8,964,901 B2 | 2/2015 | Kim et al. |
| 8,964,996 B2 | 2/2015 | Klippel et al. |
| 8,971,834 B2 | 3/2015 | Keehr et al. |
| 8,976,896 B2 | 3/2015 | McCallister et al. |
| 8,989,762 B1 | 3/2015 | Negus et al. |
| 8,994,657 B2 | 3/2015 | Liberty et al. |
| 8,995,571 B2 | 3/2015 | Chen |
| 8,995,835 B2 | 3/2015 | Yan et al. |
| 9,008,153 B2 | 4/2015 | Pang et al. |
| 9,014,299 B2 | 4/2015 | Teterwak |
| 9,019,643 B2 | 4/2015 | Medard et al. |
| 9,020,454 B2 | 4/2015 | Waheed et al. |
| 9,025,607 B2 | 5/2015 | Zeger et al. |
| 9,031,168 B1 | 5/2015 | Liu |
| 9,036,734 B1 | 5/2015 | Mauer et al. |
| 9,048,865 B2 | 6/2015 | Pagnanelli |
| 9,048,900 B2 | 6/2015 | Pratt et al. |
| 9,071,313 B2 | 6/2015 | Monsen |
| 9,077,508 B2 | 7/2015 | Koike-Akino et al. |
| 9,088,472 B1 | 7/2015 | Jain et al. |
| 9,094,036 B2 | 7/2015 | Rachid et al. |
| 9,094,151 B2 | 7/2015 | Perez De Aranda Alonso et al. |
| 9,104,921 B2 | 8/2015 | Derakhshani et al. |
| 9,106,304 B2 | 8/2015 | Row et al. |
| 9,130,628 B1 | 9/2015 | Mittal et al. |
| 9,137,082 B1 * | 9/2015 | Ali .................. H04L 27/2646 |
| 9,137,492 B2 | 9/2015 | Lima et al. |
| 9,143,274 B2 | 9/2015 | Zeger et al. |
| 9,160,280 B1 | 10/2015 | Abdelhafiz et al. |
| 9,160,310 B2 | 10/2015 | Velazquez et al. |
| 9,160,579 B1 | 10/2015 | Tan et al. |
| 9,160,687 B2 | 10/2015 | Haeupler et al. |
| 9,166,610 B2 | 10/2015 | Klippel |
| 9,166,635 B2 | 10/2015 | Carbone et al. |
| 9,166,698 B2 | 10/2015 | Bae et al. |
| 9,171,534 B2 | 10/2015 | Tronchin et al. |
| 9,184,784 B2 | 11/2015 | Ding et al. |
| 9,185,529 B2 | 11/2015 | Medard et al. |
| 9,189,458 B1 | 11/2015 | Langer et al. |
| 9,191,041 B2 | 11/2015 | Mkadem et al. |
| 9,191,049 B2 | 11/2015 | Mikhemar et al. |
| 9,199,860 B2 | 12/2015 | MacArthur |
| 9,203,654 B2 | 12/2015 | Terry |
| 9,209,753 B2 | 12/2015 | Xiao et al. |
| 9,209,841 B2 | 12/2015 | Yu et al. |
| 9,214,968 B2 | 12/2015 | Wang |
| 9,214,969 B2 | 12/2015 | Hammi |
| 9,225,295 B2 | 12/2015 | Ishikawa et al. |
| 9,225,501 B2 | 12/2015 | Azadet |
| 9,231,530 B1 | 1/2016 | Kaushik et al. |
| 9,231,647 B2 | 1/2016 | Polydoros et al. |
| 9,231,801 B2 | 1/2016 | Rimini et al. |
| 9,235,268 B2 | 1/2016 | Arrasvuori et al. |
| 9,236,996 B2 | 1/2016 | Khandani |
| 9,246,525 B2 | 1/2016 | Breynaert et al. |
| 9,246,731 B2 | 1/2016 | Kim et al. |
| 9,252,798 B2 | 2/2016 | Rachid et al. |
| 9,252,821 B2 | 2/2016 | Shor et al. |
| 9,253,608 B2 | 2/2016 | Medard et al. |
| 9,257,943 B2 | 2/2016 | Onishi |
| 9,258,156 B2 | 2/2016 | Wloczysiak |
| 9,261,978 B2 | 2/2016 | Liberty et al. |
| 9,264,153 B2 | 2/2016 | Kim et al. |
| 9,265,461 B2 | 2/2016 | Hunter et al. |
| 9,270,304 B2 | 2/2016 | Monsen |
| 9,270,512 B2 | 2/2016 | Eliaz et al. |
| 9,271,123 B2 | 2/2016 | Medard et al. |
| 9,276,602 B1 | 3/2016 | Pagnanelli |
| 9,294,113 B2 | 3/2016 | Feizi-Khankandi et al. |
| 9,304,501 B2 | 4/2016 | Danko |
| 9,306,606 B2 | 4/2016 | Zhang |
| 9,311,535 B2 | 4/2016 | Derakhshani et al. |
| 9,312,892 B2 | 4/2016 | Chang |
| 9,314,623 B2 | 4/2016 | Bardakjian et al. |
| 9,322,906 B2 | 4/2016 | Seppa et al. |
| 9,337,781 B2 | 5/2016 | Hammi |
| 9,337,783 B2 | 5/2016 | Matsubara et al. |
| 9,352,155 B2 | 5/2016 | Moehlis et al. |
| 9,361,681 B2 | 6/2016 | Derakhshani et al. |
| 9,361,936 B2 | 6/2016 | Medard et al. |
| 9,362,869 B2 | 6/2016 | Dechen et al. |
| 9,362,942 B1 | 6/2016 | Hammler |
| 9,363,068 B2 | 6/2016 | Azadet et al. |
| 9,369,093 B2 | 6/2016 | Gustavsson |
| 9,369,255 B2 | 6/2016 | Medard et al. |
| 9,369,541 B2 | 6/2016 | Medard et al. |
| 9,397,516 B2 | 7/2016 | Hunter et al. |
| 9,401,823 B2 | 7/2016 | Terry |
| 9,404,950 B2 | 8/2016 | Lafontaine et al. |
| 9,413,516 B2 | 8/2016 | Khandani |
| 9,419,722 B2 | 8/2016 | Winzer et al. |
| 9,431,972 B1 | 8/2016 | Xu |
| 9,432,564 B2 | 8/2016 | Nurmenniemi |
| 9,438,178 B1 | 9/2016 | Sulimarski et al. |
| 9,438,356 B2 | 9/2016 | Kim et al. |
| 9,439,597 B2 | 9/2016 | Warrick et al. |
| 9,451,920 B2 | 9/2016 | Khair |
| 9,460,246 B2 | 10/2016 | Williams |
| 9,460,617 B2 | 10/2016 | Beaurepaire et al. |
| 9,461,597 B2 | 10/2016 | Abdelrahman et al. |
| 9,461,676 B2 | 10/2016 | Santucci et al. |
| 9,473,077 B2 | 10/2016 | Feldman et al. |
| 9,479,322 B2 | 10/2016 | Khandani |
| 9,509,331 B1 | 11/2016 | Pagnanelli |
| 9,509,350 B1 | 11/2016 | Magesacher et al. |
| 9,517,030 B2 | 12/2016 | Hunter et al. |
| 9,531,427 B2 | 12/2016 | Henry et al. |
| 9,531,475 B2 | 12/2016 | Agazzi et al. |
| 9,536,539 B2 | 1/2017 | Chang et al. |
| 9,537,759 B2 | 1/2017 | Calmon et al. |
| 9,544,006 B2 | 1/2017 | Henry et al. |
| 9,544,126 B2 | 1/2017 | Zeger et al. |
| 9,559,831 B2 | 1/2017 | Zeger et al. |
| 9,564,876 B2 | 2/2017 | Kim et al. |
| 9,564,927 B2 | 2/2017 | Fonseka et al. |
| 9,565,045 B2 | 2/2017 | Terry |
| 9,571,312 B2 | 2/2017 | Brandt-Pearce et al. |
| 9,575,570 B2 | 2/2017 | Liberty et al. |
| 9,590,664 B2 | 3/2017 | Rexberg et al. |
| 9,590,668 B1 | 3/2017 | Kim et al. |
| 9,595,920 B2 | 3/2017 | Li et al. |
| 9,595,982 B2 | 3/2017 | Weber et al. |
| 9,607,003 B2 | 3/2017 | Medard et al. |
| 9,607,628 B2 | 3/2017 | Gautama |
| 9,608,676 B2 | 3/2017 | Chen |
| 9,608,718 B2 | 3/2017 | Monsen et al. |
| 9,613,408 B2 | 4/2017 | Micovic et al. |
| 9,614,554 B2 | 4/2017 | Beidas et al. |
| 9,621,387 B1 | 4/2017 | Magers |
| 9,628,119 B2 | 4/2017 | Gal et al. |
| 9,628,120 B2 | 4/2017 | Yu et al. |
| 9,646,116 B2 | 5/2017 | Liu et al. |
| 9,647,717 B2 | 5/2017 | Xiong et al. |
| 9,654,211 B2 | 5/2017 | Zhao et al. |
| 9,654,216 B2 | 5/2017 | Nakashima et al. |

(56) References Cited

U.S. PATENT DOCUMENTS

| | | |
|---|---|---|
| 9,659,120 B2 | 5/2017 | Fehri et al. |
| 9,660,593 B2 | 5/2017 | Abdelrahman et al. |
| 9,660,730 B1 | 5/2017 | Rope |
| 9,660,851 B2 | 5/2017 | Hadani et al. |
| 9,665,510 B2 | 5/2017 | Kaushik et al. |
| 9,667,292 B2 | 5/2017 | Xue et al. |
| 9,674,368 B2 | 6/2017 | Kechichian et al. |
| 9,680,423 B2 | 6/2017 | Chen |
| 9,680,497 B2 | 6/2017 | Pagnanelli |
| 9,680,670 B2 | 6/2017 | Henry et al. |
| 9,686,112 B2 | 6/2017 | Terry |
| 9,697,845 B2 | 7/2017 | Hammarqvist |
| 9,705,477 B2 | 7/2017 | Velazquez |
| 9,706,296 B2 | 7/2017 | Uhle et al. |
| 9,712,179 B2 | 7/2017 | Rachid et al. |
| 9,712,233 B1 | 7/2017 | Deng et al. |
| 9,712,238 B2 | 7/2017 | Ashrafi et al. |
| 9,712,350 B2 | 7/2017 | Henry et al. |
| 9,712,354 B2 | 7/2017 | Hadani et al. |
| 9,713,010 B2 | 7/2017 | Khandani |
| 9,713,019 B2 | 7/2017 | Negus et al. |
| 9,722,318 B2 | 8/2017 | Adriazola et al. |
| 9,722,646 B1 | 8/2017 | Matthews et al. |
| 9,722,691 B2 | 8/2017 | Colavolpe et al. |
| 9,726,701 B2 | 8/2017 | Lafontaine et al. |
| 9,727,677 B2 | 8/2017 | Fehri et al. |
| 9,729,281 B2 | 8/2017 | Hadani et al. |
| 9,729,378 B1 | 8/2017 | Ahmed |
| 9,735,741 B2 | 8/2017 | Pratt et al. |
| 9,735,800 B2 | 8/2017 | Pagnanelli |
| 9,735,811 B2 | 8/2017 | Dalipi et al. |
| 9,735,876 B2 | 8/2017 | Duthel |
| 9,737,258 B2 | 8/2017 | Poon et al. |
| 9,742,521 B2 | 8/2017 | Henry et al. |
| 9,742,599 B2 | 8/2017 | Iyer Seshadri et al. |
| 9,746,506 B2 | 8/2017 | Lafontaine et al. |
| 9,749,083 B2 | 8/2017 | Henry et al. |
| 9,749,161 B1 | 8/2017 | Gal et al. |
| 9,755,691 B2 | 9/2017 | Kim et al. |
| 9,762,268 B2 | 9/2017 | Yang et al. |
| 9,768,891 B2 | 9/2017 | Ishikawa et al. |
| 9,774,476 B2 | 9/2017 | Nammi et al. |
| 9,778,902 B2 | 10/2017 | Azadet et al. |
| 9,780,869 B2 | 10/2017 | Rope |
| 9,780,881 B1 | 10/2017 | Rope et al. |
| 9,787,351 B2 | 10/2017 | Martineau et al. |
| 9,787,459 B2 | 10/2017 | Azadet |
| 9,794,000 B2 | 10/2017 | Ling |
| 9,800,437 B2 | 10/2017 | Kingery et al. |
| 9,800,734 B2 | 10/2017 | Kechichian et al. |
| 9,820,311 B2 | 11/2017 | Khandani |
| 9,831,899 B1 | 11/2017 | Boghrat et al. |
| 9,837,970 B2 | 12/2017 | Hammi et al. |
| 9,843,346 B1 | 12/2017 | Mundarath et al. |
| 9,859,845 B2 | 1/2018 | Sarbishaei et al. |
| 9,859,981 B2 | 1/2018 | Ashrafi et al. |
| 9,866,183 B2 | 1/2018 | Magesacher et al. |
| 9,871,679 B2 | 1/2018 | Henry et al. |
| 9,876,530 B2 | 1/2018 | Negus et al. |
| 9,877,206 B2 | 1/2018 | Henry et al. |
| 9,877,265 B2 | 1/2018 | Kim et al. |
| 9,882,608 B2 | 1/2018 | Adriazola et al. |
| 9,882,648 B2 | 1/2018 | Agazzi et al. |
| 9,887,862 B2 | 2/2018 | Zhou et al. |
| 9,893,919 B2 | 2/2018 | Kim et al. |
| 9,899,182 B2 | 2/2018 | Borodovsky |
| 9,900,048 B2 | 2/2018 | Hadani et al. |
| 9,900,088 B2 | 2/2018 | Rope |
| 9,900,122 B2 | 2/2018 | Henry et al. |
| 9,900,123 B2 | 2/2018 | Henry et al. |
| 9,900,190 B2 | 2/2018 | Henry et al. |
| 9,912,435 B2 | 3/2018 | Kim et al. |
| 9,912,436 B2 | 3/2018 | Henry et al. |
| 9,913,194 B2 | 3/2018 | Kim et al. |
| 9,923,524 B2 | 3/2018 | Carbone et al. |
| 9,923,640 B2 | 3/2018 | Okabe et al. |
| 9,923,714 B2 | 3/2018 | Lima et al. |
| 9,928,212 B2 | 3/2018 | Agee |
| 9,929,755 B2 | 3/2018 | Henry et al. |
| 9,935,590 B2 | 4/2018 | Sulimarski et al. |
| 9,935,645 B1 | 4/2018 | Tangudu et al. |
| 9,935,715 B2 | 4/2018 | Duthel |
| 9,935,761 B2 | 4/2018 | Azadet |
| 9,940,938 B2 | 4/2018 | Dick et al. |
| 9,941,963 B2 | 4/2018 | Magri et al. |
| 9,942,074 B1 | 4/2018 | Luo et al. |
| 9,953,656 B2 | 4/2018 | Dick et al. |
| 9,954,384 B2 | 4/2018 | Hunter et al. |
| 9,960,794 B2 | 5/2018 | Weissman et al. |
| 9,960,804 B2 | 5/2018 | Kim et al. |
| 9,960,900 B2 | 5/2018 | Azadet |
| 9,971,920 B2 | 5/2018 | Derakhshani et al. |
| 9,973,279 B2 | 5/2018 | Shen |
| 9,974,957 B2 | 5/2018 | Choi et al. |
| 9,983,243 B2 | 5/2018 | Lafontaine et al. |
| 9,998,172 B1 | 6/2018 | Barzegar et al. |
| 9,998,187 B2 | 6/2018 | Ashrafi et al. |
| 9,998,223 B2 | 6/2018 | Zhao et al. |
| 9,998,406 B2 | 6/2018 | Haeupler et al. |
| 9,999,780 B2 | 6/2018 | Weyh et al. |
| 10,985,951 B2 * | 4/2021 | Li .................... G06N 3/08 |
| 2001/0051871 A1 | 3/2001 | Kroeker |
| 2001/0036334 A1 | 11/2001 | Choa |
| 2002/0041210 A1 | 4/2002 | Booth et al. |
| 2002/0051546 A1 | 5/2002 | Bizjak |
| 2002/0060827 A1 | 5/2002 | Agazzi |
| 2002/0075918 A1 | 6/2002 | Crowder |
| 2002/0085725 A1 | 7/2002 | Bizjak |
| 2002/0103619 A1 | 8/2002 | Bizjak |
| 2002/0126604 A1 | 9/2002 | Powelson et al. |
| 2002/0146993 A1 | 10/2002 | Persico et al. |
| 2002/0161539 A1 | 10/2002 | Jones et al. |
| 2002/0161542 A1 | 10/2002 | Jones et al. |
| 2002/0169585 A1 | 11/2002 | Jones et al. |
| 2002/0172374 A1 | 11/2002 | Bizjak |
| 2002/0172376 A1 | 11/2002 | Bizjak |
| 2002/0172378 A1 | 11/2002 | Bizjak |
| 2002/0178133 A1 | 11/2002 | Zhao et al. |
| 2002/0181521 A1 | 12/2002 | Crowder et al. |
| 2002/0186874 A1 | 12/2002 | Price et al. |
| 2003/0035549 A1 | 2/2003 | Bizjak et al. |
| 2003/0046045 A1 | 3/2003 | Pileggi et al. |
| 2003/0055635 A1 | 3/2003 | Bizjak |
| 2003/0057963 A1 | 3/2003 | Verbeyst et al. |
| 2003/0063854 A1 | 4/2003 | Barwicz et al. |
| 2003/0071684 A1 | 4/2003 | Noori |
| 2003/0098805 A1 | 5/2003 | Bizjak |
| 2003/0112088 A1 | 6/2003 | Bizjak |
| 2003/0142832 A1 | 7/2003 | Meerkoetter et al. |
| 2003/0195706 A1 | 10/2003 | Korenberg |
| 2003/0223507 A1 | 12/2003 | De Gaudenzi et al. |
| 2004/0019443 A1 | 1/2004 | Jones et al. |
| 2004/0044489 A1 | 3/2004 | Jones et al. |
| 2004/0130394 A1 | 7/2004 | Mattsson et al. |
| 2004/0136423 A1 | 7/2004 | Coldren et al. |
| 2004/0155707 A1 | 8/2004 | Kim et al. |
| 2004/0179629 A1 | 9/2004 | Song et al. |
| 2004/0208242 A1 | 10/2004 | Batruni |
| 2004/0258176 A1 | 12/2004 | Mattsson et al. |
| 2005/0021266 A1 | 1/2005 | Kouri et al. |
| 2005/0021319 A1 | 1/2005 | Li et al. |
| 2005/0031117 A1 | 2/2005 | Browning et al. |
| 2005/0031131 A1 | 2/2005 | Browning et al. |
| 2005/0031132 A1 | 2/2005 | Browning et al. |
| 2005/0031133 A1 | 2/2005 | Browning et al. |
| 2005/0031134 A1 | 2/2005 | Leske |
| 2005/0031137 A1 | 2/2005 | Browning et al. |
| 2005/0031138 A1 | 2/2005 | Browning et al. |
| 2005/0031139 A1 | 2/2005 | Browning et al. |
| 2005/0031140 A1 | 2/2005 | Browning |
| 2005/0049838 A1 | 3/2005 | Danko |
| 2005/0100065 A1 | 5/2005 | Coldren et al. |
| 2005/0141637 A1 | 6/2005 | Domokos |
| 2005/0141659 A1 | 6/2005 | Capofreddi |

(56) References Cited

U.S. PATENT DOCUMENTS

| | | |
|---|---|---|
| 2005/0174167 A1 | 8/2005 | Vilander et al. |
| 2005/0177805 A1 | 8/2005 | Lynch et al. |
| 2005/0180526 A1 | 8/2005 | Kim et al. |
| 2005/0226316 A1 | 10/2005 | Higashino et al. |
| 2005/0237111 A1 | 10/2005 | Nygren et al. |
| 2005/0243061 A1 | 11/2005 | Liberty et al. |
| 2005/0253806 A1 | 11/2005 | Liberty et al. |
| 2005/0270094 A1 | 12/2005 | Nakatani |
| 2005/0271216 A1 | 12/2005 | Lashkari |
| 2005/0273188 A1 | 12/2005 | Barwicz et al. |
| 2006/0039498 A1 | 2/2006 | de Figueiredo et al. |
| 2006/0052988 A1 | 3/2006 | Farahani et al. |
| 2006/0083389 A1 | 4/2006 | Oxford et al. |
| 2006/0093128 A1 | 5/2006 | Oxford |
| 2006/0095236 A1 | 5/2006 | Phillips |
| 2006/0104395 A1 | 5/2006 | Batruni |
| 2006/0104451 A1 | 5/2006 | Browning et al. |
| 2006/0133536 A1 | 6/2006 | Rexberg |
| 2006/0209982 A1 | 9/2006 | De Gaudenzi et al. |
| 2006/0222128 A1 | 10/2006 | Raphaeli |
| 2006/0239443 A1 | 10/2006 | Oxford et al. |
| 2006/0256974 A1 | 11/2006 | Oxford |
| 2006/0262942 A1 | 11/2006 | Oxford |
| 2006/0262943 A1 | 11/2006 | Oxford |
| 2006/0264187 A1 | 11/2006 | Singerl et al. |
| 2006/0269074 A1 | 11/2006 | Oxford |
| 2006/0269080 A1 | 11/2006 | Oxford et al. |
| 2006/0274904 A1 | 12/2006 | Lashkari |
| 2007/0005326 A1 | 1/2007 | Koppl et al. |
| 2007/0018722 A1 | 1/2007 | Jaenecke |
| 2007/0030076 A1 | 2/2007 | Kim et al. |
| 2007/0033000 A1 | 2/2007 | Farahani et al. |
| 2007/0063770 A1 | 3/2007 | Rexberg |
| 2007/0080841 A1 | 4/2007 | Raphaeli |
| 2007/0133713 A1 | 6/2007 | Dalipi |
| 2007/0133719 A1 | 6/2007 | Agazzi et al. |
| 2007/0136018 A1 | 6/2007 | Fernandez et al. |
| 2007/0136045 A1 | 6/2007 | Rao et al. |
| 2007/0152750 A1 | 7/2007 | Andersen et al. |
| 2007/0160221 A1 | 7/2007 | Pfaffinger |
| 2007/0168100 A1 | 7/2007 | Danko |
| 2007/0190952 A1 | 8/2007 | Waheed et al. |
| 2007/0229154 A1 | 10/2007 | Kim et al. |
| 2007/0237260 A1 | 10/2007 | Hori et al. |
| 2007/0247425 A1 | 10/2007 | Liberty et al. |
| 2007/0252651 A1 | 11/2007 | Gao et al. |
| 2007/0252813 A1 | 11/2007 | Liberty et al. |
| 2007/0276610 A1 | 11/2007 | Korenberg |
| 2008/0001947 A1 | 1/2008 | Snyder et al. |
| 2008/0032642 A1 | 2/2008 | Singerl et al. |
| 2008/0129379 A1 | 6/2008 | Copeland |
| 2008/0130787 A1 | 6/2008 | Copeland |
| 2008/0130788 A1 | 6/2008 | Copeland |
| 2008/0130789 A1 | 6/2008 | Copeland et al. |
| 2008/0152037 A1 | 6/2008 | Kim et al. |
| 2008/0158154 A1 | 7/2008 | Liberty et al. |
| 2008/0158155 A1 | 7/2008 | Liberty et al. |
| 2008/0180178 A1 | 7/2008 | Gao et al. |
| 2008/0240325 A1 | 10/2008 | Agazzi et al. |
| 2008/0261541 A1 | 10/2008 | Langer |
| 2008/0283882 A1 | 11/2008 | Nogami |
| 2008/0285640 A1 | 11/2008 | McCallister et al. |
| 2008/0293372 A1 | 11/2008 | Principe et al. |
| 2009/0003134 A1 | 1/2009 | Nuttall et al. |
| 2009/0027117 A1 | 1/2009 | Andersen et al. |
| 2009/0027118 A1 | 1/2009 | Andersen et al. |
| 2009/0058521 A1 | 3/2009 | Fernandez |
| 2009/0067643 A1 | 3/2009 | Ding |
| 2009/0072901 A1 | 3/2009 | Yamanouchi et al. |
| 2009/0075610 A1 | 3/2009 | Keehr et al. |
| 2009/0094304 A1 | 4/2009 | Batruni |
| 2009/0146740 A1 | 6/2009 | Lau et al. |
| 2009/0153132 A1 | 6/2009 | Tufillaro et al. |
| 2009/0185613 A1 | 7/2009 | Agazzi et al. |
| 2009/0221257 A1 | 9/2009 | Sorrells et al. |
| 2009/0256632 A1 | 10/2009 | Klingberg et al. |
| 2009/0287624 A1 | 11/2009 | Rouat et al. |
| 2009/0289706 A1 | 11/2009 | Goodman et al. |
| 2009/0291650 A1 | 11/2009 | Singerl et al. |
| 2009/0302938 A1 | 12/2009 | Andersen et al. |
| 2009/0302940 A1 | 12/2009 | Fuller et al. |
| 2009/0318983 A1 | 12/2009 | Armoundas et al. |
| 2010/0007489 A1 | 1/2010 | Misra et al. |
| 2010/0033180 A1 | 2/2010 | Biber et al. |
| 2010/0060355 A1 | 3/2010 | Hamada et al. |
| 2010/0090762 A1 | 4/2010 | van Zelm et al. |
| 2010/0093290 A1 | 4/2010 | van Zelm et al. |
| 2010/0094603 A1 | 4/2010 | Danko |
| 2010/0097714 A1 | 4/2010 | Eppler et al. |
| 2010/0114813 A1 | 5/2010 | Zalay et al. |
| 2010/0135449 A1 | 6/2010 | Row et al. |
| 2010/0148865 A1 | 6/2010 | Borkar et al. |
| 2010/0152547 A1 | 6/2010 | Sterling et al. |
| 2010/0156530 A1 | 6/2010 | Utsunomiya et al. |
| 2010/0183106 A1 | 7/2010 | Beidas et al. |
| 2010/0194474 A1 | 8/2010 | Ishikawa et al. |
| 2010/0199237 A1 | 8/2010 | Kim et al. |
| 2010/0254450 A1 | 10/2010 | Narroschke et al. |
| 2010/0283540 A1 | 11/2010 | Davies |
| 2010/0292602 A1 | 11/2010 | Worrell et al. |
| 2010/0292752 A1 | 11/2010 | Bardakjian et al. |
| 2010/0311361 A1 | 12/2010 | Rashev et al. |
| 2010/0312495 A1 | 12/2010 | Haviland et al. |
| 2011/0003570 A1 | 1/2011 | Yu et al. |
| 2011/0025414 A1 | 2/2011 | Wolf et al. |
| 2011/0028859 A1 | 2/2011 | Chian |
| 2011/0037518 A1 | 2/2011 | Lee et al. |
| 2011/0054354 A1 | 3/2011 | Hunter et al. |
| 2011/0054355 A1 | 3/2011 | Hunter et al. |
| 2011/0064171 A1 | 3/2011 | Huang et al. |
| 2011/0069749 A1 | 3/2011 | Forrester et al. |
| 2011/0081152 A1 | 4/2011 | Agazzi et al. |
| 2011/0085678 A1 | 4/2011 | Pfaffinger |
| 2011/0087341 A1 | 4/2011 | Pfaffinger |
| 2011/0096865 A1 | 4/2011 | Hori et al. |
| 2011/0102080 A1 | 5/2011 | Chatterjee et al. |
| 2011/0103455 A1 | 5/2011 | Forrester et al. |
| 2011/0110473 A1 | 5/2011 | Keehr et al. |
| 2011/0121897 A1 | 5/2011 | Braithwaite |
| 2011/0125684 A1 | 5/2011 | Al-Duwaish et al. |
| 2011/0125685 A1 | 5/2011 | Rizvi et al. |
| 2011/0125686 A1 | 5/2011 | Al-Duwaish et al. |
| 2011/0125687 A1 | 5/2011 | Al-Duwaish et al. |
| 2011/0140779 A1 | 6/2011 | Koren et al. |
| 2011/0144961 A1 | 6/2011 | Ishikawa et al. |
| 2011/0149714 A1 | 6/2011 | Rimini et al. |
| 2011/0177956 A1 | 7/2011 | Korenberg |
| 2011/0181360 A1 | 7/2011 | Li et al. |
| 2011/0204975 A1 | 8/2011 | Miyashita |
| 2011/0211842 A1 | 9/2011 | Agazzi et al. |
| 2011/0238690 A1 | 9/2011 | Arrasvuori et al. |
| 2011/0249024 A1 | 10/2011 | Arrasvuori et al. |
| 2011/0252320 A1 | 10/2011 | Arrasvuori et al. |
| 2011/0268226 A1 | 11/2011 | Lozhkin |
| 2011/0270590 A1* | 11/2011 | Aparin ............... H03F 1/3258 |
| | | 703/2 |
| 2011/0288457 A1 | 11/2011 | Questo et al. |
| 2011/0293051 A1* | 12/2011 | Lozhkin ......... H04L 25/03133 |
| | | 375/346 |
| 2012/0007153 A1 | 1/2012 | Nogami |
| 2012/0007672 A1 | 1/2012 | Peyresoubes et al. |
| 2012/0027070 A1 | 2/2012 | Beidas |
| 2012/0029663 A1 | 2/2012 | Danko |
| 2012/0086504 A1* | 4/2012 | Tsukamoto ......... H04B 1/0028 |
| | | 327/551 |
| 2012/0086507 A1 | 4/2012 | Kim et al. |
| 2012/0093376 A1 | 4/2012 | Malik et al. |
| 2012/0098481 A1 | 4/2012 | Hunter et al. |
| 2012/0098596 A1 | 4/2012 | Nagatani et al. |
| 2012/0112908 A1 | 5/2012 | Prykari et al. |
| 2012/0119810 A1 | 5/2012 | Bai |
| 2012/0140860 A1 | 6/2012 | Rimini et al. |
| 2012/0147993 A1 | 6/2012 | Kim et al. |
| 2012/0154040 A1 | 6/2012 | Kim et al. |

(56) References Cited

U.S. PATENT DOCUMENTS

| | | |
|---|---|---|
| 2012/0154041 A1 | 6/2012 | Kim et al. |
| 2012/0158384 A1 | 6/2012 | Wei |
| 2012/0165633 A1 | 6/2012 | Khair |
| 2012/0176190 A1 | 7/2012 | Goodman et al. |
| 2012/0176609 A1 | 7/2012 | Seppa et al. |
| 2012/0217557 A1 | 8/2012 | Nogami |
| 2012/0229206 A1 | 9/2012 | van Zelm et al. |
| 2012/0256687 A1 | 10/2012 | Davies |
| 2012/0259600 A1 | 10/2012 | Al-Duwaish |
| 2012/0263256 A1 | 10/2012 | Waheed et al. |
| 2012/0306573 A1 | 12/2012 | Mazzucco et al. |
| 2012/0328128 A1 | 12/2012 | Tronchin et al. |
| 2013/0005283 A1 | 1/2013 | van Zelm et al. |
| 2013/0009702 A1 | 1/2013 | Davies |
| 2013/0015917 A1 | 1/2013 | Ishikawa et al. |
| 2013/0030239 A1 | 1/2013 | Weyh et al. |
| 2013/0034188 A1 | 2/2013 | Rashev et al. |
| 2013/0040587 A1 | 2/2013 | Ishikawa et al. |
| 2013/0044791 A1 | 2/2013 | Rimini et al. |
| 2013/0044836 A1 | 2/2013 | Koren et al. |
| 2013/0093676 A1 | 4/2013 | Liberty et al. |
| 2013/0110974 A1 | 5/2013 | Arrasvuori et al. |
| 2013/0113559 A1 | 5/2013 | Koren et al. |
| 2013/0114762 A1 | 5/2013 | Azadet et al. |
| 2013/0166259 A1 | 6/2013 | Weber et al. |
| 2013/0170842 A1 | 7/2013 | Koike-Akino et al. |
| 2013/0176153 A1 | 7/2013 | Rachid et al. |
| 2013/0201316 A1 | 8/2013 | Binder et al. |
| 2013/0207723 A1 | 8/2013 | Chen et al. |
| 2013/0222059 A1 | 8/2013 | Kilambi et al. |
| 2013/0243119 A1 | 9/2013 | Dalipi et al. |
| 2013/0243122 A1 | 9/2013 | Bai |
| 2013/0243135 A1 | 9/2013 | Row et al. |
| 2013/0257530 A1 | 10/2013 | Davies |
| 2013/0271212 A1 | 10/2013 | Bai |
| 2013/0272367 A1 | 10/2013 | Beidas |
| 2013/0285742 A1 | 10/2013 | van Zelm et al. |
| 2013/0301487 A1 | 11/2013 | Khandani |
| 2013/0303103 A1 | 11/2013 | Mikhemar et al. |
| 2013/0315291 A1 | 11/2013 | Kim et al. |
| 2013/0321078 A1 | 12/2013 | Ishikawa et al. |
| 2013/0330082 A1 | 12/2013 | Perez De Aranda Alonso et al. |
| 2013/0336377 A1 | 12/2013 | Liu et al. |
| 2014/0009224 A1 | 1/2014 | van Zelm et al. |
| 2014/0029658 A1 | 1/2014 | Kim et al. |
| 2014/0029660 A1 | 1/2014 | Bolstad et al. |
| 2014/0030995 A1 | 1/2014 | Kim et al. |
| 2014/0031651 A1 | 1/2014 | Chon |
| 2014/0036969 A1 | 2/2014 | Wyville et al. |
| 2014/0044318 A1 | 2/2014 | Derakhshani et al. |
| 2014/0044319 A1 | 2/2014 | Derakhshani et al. |
| 2014/0044320 A1 | 2/2014 | Derakhshani et al. |
| 2014/0044321 A1 | 2/2014 | Derakhshani et al. |
| 2014/0072074 A1 | 3/2014 | Utsunomiya et al. |
| 2014/0077981 A1 | 3/2014 | Rachid et al. |
| 2014/0081157 A1 | 3/2014 | Joeken |
| 2014/0086356 A1 | 3/2014 | Azadet et al. |
| 2014/0086361 A1 | 3/2014 | Azadet et al. |
| 2014/0095129 A1 | 4/2014 | Liu et al. |
| 2014/0107832 A1 | 4/2014 | Danko |
| 2014/0126670 A1 | 5/2014 | Monsen |
| 2014/0126675 A1 | 5/2014 | Monsen |
| 2014/0133848 A1 | 5/2014 | Koike-Akino et al. |
| 2014/0140250 A1 | 5/2014 | Kim et al. |
| 2014/0161207 A1 | 6/2014 | Teterwak |
| 2014/0167704 A1 | 6/2014 | Lafontaine et al. |
| 2014/0172338 A1 | 6/2014 | Lafontaine et al. |
| 2014/0198959 A1 | 7/2014 | Derakhshani et al. |
| 2014/0213919 A1 | 7/2014 | Poon et al. |
| 2014/0225451 A1 | 8/2014 | Lafontaine et al. |
| 2014/0226035 A1 | 8/2014 | Nurmenniemi |
| 2014/0226828 A1 | 8/2014 | Klippel et al. |
| 2014/0229132 A1 | 8/2014 | Lafontaine et al. |
| 2014/0247906 A1 | 9/2014 | Pang et al. |
| 2014/0266431 A1 | 9/2014 | Chen |
| 2014/0269857 A1 | 9/2014 | Rimini et al. |
| 2014/0269970 A1 | 9/2014 | Pratt et al. |
| 2014/0269989 A1 | 9/2014 | Santucci et al. |
| 2014/0269990 A1 | 9/2014 | Chen |
| 2014/0270405 A1 | 9/2014 | Derakhshani et al. |
| 2014/0278303 A1 | 9/2014 | Larimore |
| 2014/0279778 A1 | 9/2014 | Lazar et al. |
| 2014/0292406 A1 | 10/2014 | Dechen et al. |
| 2014/0292412 A1 | 10/2014 | Feldman et al. |
| 2014/0294119 A1 | 10/2014 | Sochacki |
| 2014/0294252 A1 | 10/2014 | Derakhshani et al. |
| 2014/0313946 A1 | 10/2014 | Azadet |
| 2014/0314176 A1 | 10/2014 | Azadet |
| 2014/0314181 A1 | 10/2014 | Azadet |
| 2014/0314182 A1 | 10/2014 | Azadet |
| 2014/0317163 A1 | 10/2014 | Azadet et al. |
| 2014/0323891 A1 | 10/2014 | Sterling et al. |
| 2014/0333376 A1 | 11/2014 | Hammi |
| 2014/0372091 A1 | 12/2014 | Larimore |
| 2015/0003625 A1 | 1/2015 | Uhle et al. |
| 2015/0005902 A1 | 1/2015 | van Zelm et al. |
| 2015/0016567 A1 | 1/2015 | Chen |
| 2015/0018632 A1 | 1/2015 | Khair |
| 2015/0025328 A1 | 1/2015 | Khair |
| 2015/0031317 A1 | 1/2015 | Wang |
| 2015/0031969 A1 | 1/2015 | Khair |
| 2015/0032788 A1 | 1/2015 | Velazquez et al. |
| 2015/0043678 A1 | 2/2015 | Hammi |
| 2015/0051513 A1 | 2/2015 | Hunter et al. |
| 2015/0061911 A1 | 3/2015 | Pagnanelli |
| 2015/0070089 A1 | 3/2015 | Eliaz et al. |
| 2015/0077180 A1 | 3/2015 | Matsubara et al. |
| 2015/0078484 A1 | 3/2015 | Xiao et al. |
| 2015/0092830 A1 | 4/2015 | Kim et al. |
| 2015/0098710 A1 | 4/2015 | Agazzi et al. |
| 2015/0104196 A1 | 4/2015 | Bae et al. |
| 2015/0131757 A1 | 5/2015 | Carbone et al. |
| 2015/0146805 A1 | 5/2015 | Terry |
| 2015/0146806 A1 | 5/2015 | Terry |
| 2015/0156003 A1 | 6/2015 | Khandani |
| 2015/0156004 A1 | 6/2015 | Khandani |
| 2015/0162881 A1 | 6/2015 | Hammi |
| 2015/0172081 A1 | 6/2015 | Wloczysiak |
| 2015/0180495 A1 | 6/2015 | Klippel |
| 2015/0193565 A1 | 7/2015 | Kim et al. |
| 2015/0193666 A1 | 7/2015 | Derakhshani et al. |
| 2015/0194989 A1 | 7/2015 | Mkadem et al. |
| 2015/0202440 A1 | 7/2015 | Moehlis et al. |
| 2015/0214987 A1 | 7/2015 | Yu et al. |
| 2015/0215937 A1 | 7/2015 | Khandani |
| 2015/0223748 A1 | 8/2015 | Warrick et al. |
| 2015/0230105 A1 | 8/2015 | Negus et al. |
| 2015/0241996 A1 | 8/2015 | Liberty et al. |
| 2015/0249889 A1 | 9/2015 | Iyer et al. |
| 2015/0256216 A1 | 9/2015 | Ding et al. |
| 2015/0270856 A1 | 9/2015 | Breynaert et al. |
| 2015/0270865 A1 | 9/2015 | Polydoros et al. |
| 2015/0280945 A1 | 10/2015 | Tan et al. |
| 2015/0288375 A1 | 10/2015 | Rachid et al. |
| 2015/0295643 A1 | 10/2015 | Zhao et al. |
| 2015/0310739 A1 | 10/2015 | Beaurepaire et al. |
| 2015/0311927 A1 | 10/2015 | Beidas et al. |
| 2015/0311973 A1 | 10/2015 | Colavolpe et al. |
| 2015/0311985 A1 | 10/2015 | Kim et al. |
| 2015/0322647 A1 | 11/2015 | Danko |
| 2015/0326190 A1 | 11/2015 | Gustavsson |
| 2015/0333781 A1 | 11/2015 | Alon et al. |
| 2015/0357975 A1 | 12/2015 | Avniel et al. |
| 2015/0358042 A1 | 12/2015 | Zhang |
| 2015/0358191 A1 | 12/2015 | Eliaz et al. |
| 2015/0381216 A1 | 12/2015 | Shor et al. |
| 2015/0381220 A1 | 12/2015 | Gal et al. |
| 2015/0381821 A1 | 12/2015 | Kechichian et al. |
| 2016/0005419 A1 | 1/2016 | Chang et al. |
| 2016/0022161 A1 | 1/2016 | Khair |
| 2016/0028433 A1 | 1/2016 | Ding et al. |
| 2016/0034421 A1 | 2/2016 | Magesacher et al. |
| 2016/0036472 A1 | 2/2016 | Chang |
| 2016/0036528 A1 | 2/2016 | Zhao et al. |

(56) References Cited

U.S. PATENT DOCUMENTS

| | | |
|---|---|---|
| 2016/0065311 A1 | 3/2016 | Winzer et al. |
| 2016/0079933 A1 | 3/2016 | Fehri et al. |
| 2016/0087604 A1 | 3/2016 | Kim et al. |
| 2016/0087657 A1 | 3/2016 | Yu et al. |
| 2016/0093029 A1 | 3/2016 | Micovic et al. |
| 2016/0099776 A1 | 4/2016 | Nakashima et al. |
| 2016/0111110 A1 | 4/2016 | Gautama |
| 2016/0117430 A1 | 4/2016 | Fehri et al. |
| 2016/0124903 A1 | 5/2016 | Agee |
| 2016/0126903 A1 | 5/2016 | Abdelrahman et al. |
| 2016/0127113 A1 | 5/2016 | Khandani |
| 2016/0132735 A1 | 5/2016 | Derakhshani et al. |
| 2016/0134380 A1 | 5/2016 | Kim et al. |
| 2016/0149665 A1 | 5/2016 | Henry et al. |
| 2016/0149731 A1 | 5/2016 | Henry et al. |
| 2016/0156375 A1 | 6/2016 | Yang et al. |
| 2016/0162042 A1 | 6/2016 | Liberty et al. |
| 2016/0173117 A1 | 6/2016 | Rachid et al. |
| 2016/0191020 A1 | 6/2016 | Velazquez |
| 2016/0197642 A1 | 7/2016 | Henry et al. |
| 2016/0218752 A1 | 7/2016 | Liu |
| 2016/0218891 A1 | 7/2016 | Nammi et al. |
| 2016/0225385 A1 | 8/2016 | Hammarqvist |
| 2016/0226681 A1 | 8/2016 | Henry et al. |
| 2016/0241277 A1 | 8/2016 | Rexberg et al. |
| 2016/0248531 A1 | 8/2016 | Eliaz et al. |
| 2016/0259960 A1 | 9/2016 | Derakhshani et al. |
| 2016/0261241 A1 | 9/2016 | Hammi et al. |
| 2016/0269210 A1 | 9/2016 | Kim et al. |
| 2016/0287871 A1 | 10/2016 | Bardakjian et al. |
| 2016/0308619 A1 | 10/2016 | Ling |
| 2016/0309042 A1 | 10/2016 | Kechichian et al. |
| 2016/0316283 A1 | 10/2016 | Kim et al. |
| 2016/0317096 A1* | 11/2016 | Adams ............... A61B 5/02438 |
| 2016/0329927 A1 | 11/2016 | Xiong et al. |
| 2016/0334466 A1 | 11/2016 | Rivoir |
| 2016/0336762 A1 | 11/2016 | Hunter et al. |
| 2016/0352361 A1 | 12/2016 | Fonseka et al. |
| 2016/0352362 A1 | 12/2016 | Fonseka et al. |
| 2016/0352419 A1 | 12/2016 | Fonseka et al. |
| 2016/0352427 A1 | 12/2016 | Anandakumar et al. |
| 2016/0359552 A1 | 12/2016 | Monsen et al. |
| 2016/0373212 A1 | 12/2016 | Ling et al. |
| 2016/0380661 A1 | 12/2016 | Xue et al. |
| 2016/0380700 A1 | 12/2016 | Shen |
| 2017/0012585 A1 | 1/2017 | Sarbishaei et al. |
| 2017/0012709 A1 | 1/2017 | Duthel |
| 2017/0012862 A1 | 1/2017 | Terry |
| 2017/0014032 A1 | 1/2017 | Khair |
| 2017/0018851 A1 | 1/2017 | Henry et al. |
| 2017/0018852 A1 | 1/2017 | Adriazola et al. |
| 2017/0019131 A1 | 1/2017 | Henry et al. |
| 2017/0026095 A1 | 1/2017 | Ashrafi et al. |
| 2017/0032129 A1 | 2/2017 | Linde et al. |
| 2017/0032184 A1 | 2/2017 | Derakhshani et al. |
| 2017/0033465 A1 | 2/2017 | Henry et al. |
| 2017/0033466 A1 | 2/2017 | Henry et al. |
| 2017/0033809 A1 | 2/2017 | Liu |
| 2017/0033953 A1 | 2/2017 | Henry et al. |
| 2017/0033954 A1 | 2/2017 | Henry et al. |
| 2017/0041124 A1 | 2/2017 | Khandani |
| 2017/0043166 A1 | 2/2017 | Choi et al. |
| 2017/0047899 A1 | 2/2017 | Abdelrahman et al. |
| 2017/0061045 A1 | 3/2017 | Okuyama et al. |
| 2017/0063312 A1 | 3/2017 | Sulimarski et al. |
| 2017/0063430 A1 | 3/2017 | Henry et al. |
| 2017/0077944 A1 | 3/2017 | Pagnanelli |
| 2017/0077945 A1 | 3/2017 | Pagnanelli |
| 2017/0078023 A1 | 3/2017 | Magri et al. |
| 2017/0078027 A1 | 3/2017 | Okabe et al. |
| 2017/0078400 A1 | 3/2017 | Binder et al. |
| 2017/0085003 A1 | 3/2017 | Johnson et al. |
| 2017/0085336 A1 | 3/2017 | Henry et al. |
| 2017/0093497 A1 | 3/2017 | Ling et al. |
| 2017/0093693 A1 | 3/2017 | Barzegar et al. |
| 2017/0095195 A1 | 4/2017 | Hunter et al. |
| 2017/0104503 A1 | 4/2017 | Pratt et al. |
| 2017/0104617 A1 | 4/2017 | Magers |
| 2017/0108943 A1 | 4/2017 | Liberty et al. |
| 2017/0110795 A1 | 4/2017 | Henry et al. |
| 2017/0110804 A1 | 4/2017 | Henry et al. |
| 2017/0111805 A1 | 4/2017 | Barzegar et al. |
| 2017/0117854 A1 | 4/2017 | Ben Smida et al. |
| 2017/0134205 A1 | 5/2017 | Kim et al. |
| 2017/0141807 A1 | 5/2017 | Chen et al. |
| 2017/0141938 A1 | 5/2017 | Chen et al. |
| 2017/0163465 A1 | 6/2017 | Piazza et al. |
| 2017/0170999 A1 | 6/2017 | Zhou et al. |
| 2017/0180061 A1 | 6/2017 | Ishikawa et al. |
| 2017/0195053 A1 | 7/2017 | Duthel |
| 2017/0201288 A1 | 7/2017 | Magers |
| 2017/0207934 A1 | 7/2017 | Iyer Seshadri et al. |
| 2017/0214468 A1 | 7/2017 | Agazzi et al. |
| 2017/0214470 A1 | 7/2017 | Nishihara et al. |
| 2017/0222717 A1 | 8/2017 | Rope |
| 2017/0229782 A1 | 8/2017 | Adriazola et al. |
| 2017/0230083 A1 | 8/2017 | Adriazola et al. |
| 2017/0244582 A1 | 8/2017 | Gal et al. |
| 2017/0245054 A1 | 8/2017 | Sheen et al. |
| 2017/0245079 A1 | 8/2017 | Sheen et al. |
| 2017/0245157 A1 | 8/2017 | Henry et al. |
| 2017/0255593 A9 | 9/2017 | Agee |
| 2017/0269481 A1 | 9/2017 | Borodovsky |
| 2017/0271117 A1 | 9/2017 | Borodovsky |
| 2017/0272283 A1 | 9/2017 | Kingery et al. |
| 2017/0288917 A1 | 10/2017 | Henry et al. |
| 2017/0295048 A1 | 10/2017 | Terry |
| 2017/0304625 A1 | 10/2017 | Buschman |
| 2017/0311307 A1 | 10/2017 | Negus et al. |
| 2017/0317781 A1 | 11/2017 | Henry et al. |
| 2017/0317782 A1 | 11/2017 | Henry et al. |
| 2017/0317783 A1 | 11/2017 | Henry et al. |
| 2017/0317858 A1 | 11/2017 | Henry et al. |
| 2017/0318482 A1 | 11/2017 | Negus et al. |
| 2017/0322243 A1 | 11/2017 | Lafontaine et al. |
| 2017/0324421 A1 | 11/2017 | Tangudu et al. |
| 2017/0331899 A1 | 11/2017 | Binder et al. |
| 2017/0338841 A1 | 11/2017 | Pratt |
| 2017/0338842 A1 | 11/2017 | Pratt |
| 2017/0339569 A1 | 11/2017 | Khandani |
| 2017/0346510 A1 | 11/2017 | Chen et al. |
| 2017/0366209 A1 | 12/2017 | Weissman et al. |
| 2017/0366259 A1 | 12/2017 | Rope |
| 2017/0373647 A1 | 12/2017 | Chang et al. |
| 2017/0373759 A1 | 12/2017 | Rope et al. |
| 2018/0013452 A9 | 1/2018 | Henry et al. |
| 2018/0013456 A1 | 1/2018 | Miyazaki et al. |
| 2018/0013495 A1 | 1/2018 | Ling |
| 2018/0026586 A1 | 1/2018 | Carbone et al. |
| 2018/0026673 A1 | 1/2018 | Kim et al. |
| 2018/0034912 A1 | 2/2018 | Binder et al. |
| 2018/0041219 A1 | 2/2018 | Rachid et al. |
| 2018/0048497 A1 | 2/2018 | Henry et al. |
| 2018/0054232 A1 | 2/2018 | Henry et al. |
| 2018/0054233 A1 | 2/2018 | Henry et al. |
| 2018/0054234 A1 | 2/2018 | Stuckman et al. |
| 2018/0054268 A1 | 2/2018 | Abdoli et al. |
| 2018/0062674 A1 | 3/2018 | Boghrat et al. |
| 2018/0062886 A1 | 3/2018 | Henry et al. |
| 2018/0069594 A1 | 3/2018 | Henry et al. |
| 2018/0069731 A1 | 3/2018 | Henry et al. |
| 2018/0070394 A1 | 3/2018 | Khandani |
| 2018/0076947 A1 | 3/2018 | Kazakevich et al. |
| 2018/0076979 A1 | 3/2018 | Lomayev et al. |
| 2018/0076982 A1 | 3/2018 | Henry et al. |
| 2018/0076988 A1 | 3/2018 | Willis et al. |
| 2018/0091195 A1 | 3/2018 | Carvalho et al. |
| 2018/0102850 A1 | 4/2018 | Agazzi et al. |
| 2018/0115040 A1 | 4/2018 | Bennett et al. |
| 2018/0115058 A1 | 4/2018 | Henry et al. |
| 2018/0123256 A1 | 5/2018 | Henry et al. |
| 2018/0123257 A1 | 5/2018 | Henry et al. |
| 2018/0123749 A1 | 5/2018 | Azizi et al. |
| 2018/0123836 A1 | 5/2018 | Henry et al. |

(56) References Cited

U.S. PATENT DOCUMENTS

| | | |
|---|---|---|
| 2018/0123856 A1 | 5/2018 | Qu et al. |
| 2018/0123897 A1 | 5/2018 | Lee et al. |
| 2018/0124181 A1 | 5/2018 | Binder et al. |
| 2018/0131406 A1 | 5/2018 | Adriazola et al. |
| 2018/0131502 A1 | 5/2018 | Askar et al. |
| 2018/0131541 A1 | 5/2018 | Henry et al. |
| 2018/0145411 A1 | 5/2018 | Henry et al. |
| 2018/0145412 A1 | 5/2018 | Henry et al. |
| 2018/0145414 A1 | 5/2018 | Henry et al. |
| 2018/0145415 A1 | 5/2018 | Henry et al. |
| 2018/0151957 A1 | 5/2018 | Bennett et al. |
| 2018/0152262 A1 | 5/2018 | Henry et al. |
| 2018/0152330 A1 | 5/2018 | Chritz et al. |
| 2018/0152925 A1 | 5/2018 | Nammi et al. |
| 2018/0159195 A1 | 6/2018 | Henry et al. |
| 2018/0159196 A1 | 6/2018 | Henry et al. |
| 2018/0159197 A1 | 6/2018 | Henry et al. |
| 2018/0159228 A1 | 6/2018 | Britz et al. |
| 2018/0159229 A1 | 6/2018 | Britz |
| 2018/0159230 A1 | 6/2018 | Henry et al. |
| 2018/0159232 A1 | 6/2018 | Henry et al. |
| 2018/0159240 A1 | 6/2018 | Henry et al. |
| 2018/0159243 A1 | 6/2018 | Britz et al. |
| 2018/0159615 A1 | 6/2018 | Kim |
| 2018/0166761 A1 | 6/2018 | Henry et al. |
| 2018/0166784 A1 | 6/2018 | Johnson et al. |
| 2018/0166785 A1 | 6/2018 | Henry et al. |
| 2018/0166787 A1 | 6/2018 | Johnson et al. |
| 2018/0167042 A1 | 6/2018 | Nagasaku |
| 2018/0167092 A1 | 6/2018 | Hausmair et al. |
| 2018/0167093 A1 | 6/2018 | Miyazaki et al. |
| 2018/0167105 A1 | 6/2018 | Vannucci et al. |
| 2018/0167148 A1 | 6/2018 | Vannucci et al. |
| 2018/0175892 A1 | 6/2018 | Henry et al. |
| 2018/0175978 A1 | 6/2018 | Beidas et al. |
| 2018/0180420 A1 | 6/2018 | Korenberg |
| 2018/0191448 A1 | 7/2018 | Kaneda et al. |
| 2018/0198668 A1 | 7/2018 | Kim et al. |
| 2018/0205399 A1 | 7/2018 | Baringer et al. |
| 2018/0205481 A1 | 7/2018 | Shlomo et al. |
| 2018/0219566 A1 | 8/2018 | Weissman et al. |
| 2018/0227158 A1 | 8/2018 | Luo et al. |
| 2018/0248592 A1 | 8/2018 | Ashrafi |
| 2018/0254754 A1 | 9/2018 | Carvalho et al. |
| 2018/0254769 A1 | 9/2018 | Alic et al. |
| 2018/0254924 A1 | 9/2018 | Berardinelli et al. |
| 2018/0262217 A1 | 9/2018 | Hassan |
| 2018/0262243 A1 | 9/2018 | Ashrafi et al. |
| 2018/0262370 A1 | 9/2018 | Al-Mufti et al. |
| 2018/0269988 A1 | 9/2018 | Yu et al. |
| 2018/0278693 A1 | 9/2018 | Binder et al. |
| 2018/0278694 A1 | 9/2018 | Binder et al. |
| 2018/0279197 A1 | 9/2018 | Kim et al. |
| 2018/0294879 A1 | 10/2018 | Anandakumar et al. |
| 2018/0294884 A1 | 10/2018 | Rope et al. |
| 2018/0294897 A1 | 10/2018 | Vannucci et al. |
| 2018/0301812 A1 | 10/2018 | Henry et al. |
| 2018/0302111 A1 | 10/2018 | Chen et al. |
| 2018/0302145 A1 | 10/2018 | Kim |
| 2018/0309206 A1 | 10/2018 | Henry et al. |
| 2018/0309465 A1 | 10/2018 | Pratt |
| 2018/0316320 A1 | 11/2018 | Soubercazf-Pun et al. |
| 2018/0323826 A1 | 11/2018 | Vannucci et al. |
| 2018/0324005 A1 | 11/2018 | Kim et al. |
| 2018/0324006 A1 | 11/2018 | Henry et al. |
| 2018/0324021 A1 | 11/2018 | Chritz et al. |
| 2018/0324601 A1 | 11/2018 | Barzegar et al. |
| 2018/0331413 A1 | 11/2018 | Adriazola et al. |
| 2018/0331720 A1 | 11/2018 | Adriazola et al. |
| 2018/0331721 A1 | 11/2018 | Adriazola et al. |
| 2018/0331814 A1 | 11/2018 | Khandani |
| 2018/0331871 A1 | 11/2018 | Martinez |
| 2018/0333580 A1 | 11/2018 | Choi et al. |
| 2018/0343304 A1 | 11/2018 | Binder et al. |
| 2018/0351687 A1 | 12/2018 | Henry et al. |
| 2018/0358678 A1 | 12/2018 | Henry et al. |
| 2018/0359126 A1 | 12/2018 | Wang |
| 2018/0367219 A1 | 12/2018 | Dar et al. |
| 2018/0375940 A1 | 12/2018 | Binder et al. |
| 2019/0007075 A1 | 1/2019 | Kim et al. |
| 2019/0013577 A1 | 1/2019 | Henry et al. |
| 2019/0013837 A1 | 1/2019 | Henry et al. |
| 2019/0013838 A1 | 1/2019 | Henry et al. |
| 2019/0013867 A1 | 1/2019 | Ling et al. |
| 2019/0013874 A1 | 1/2019 | Ling |
| 2019/0013991 A1 | 1/2019 | Duyck et al. |
| 2019/0020415 A1 | 1/2019 | Agazzi et al. |
| 2019/0020530 A1 | 1/2019 | Au et al. |
| 2019/0028131 A1 | 1/2019 | Wang |
| 2019/0030334 A1 | 1/2019 | Lerman et al. |
| 2019/0036222 A1 | 1/2019 | Henry et al. |
| 2019/0036622 A1 | 1/2019 | Lagoy et al. |
| 2019/0042536 A1 | 2/2019 | Agee |
| 2019/0052505 A1 | 2/2019 | Baldemair et al. |
| 2019/0074563 A1 | 3/2019 | Henry et al. |
| 2019/0074564 A1 | 3/2019 | Henry et al. |
| 2019/0074565 A1 | 3/2019 | Henry et al. |
| 2019/0074568 A1 | 3/2019 | Henry et al. |
| 2019/0074580 A1 | 3/2019 | Henry et al. |
| 2019/0074584 A1 | 3/2019 | Henry et al. |
| 2019/0074597 A1 | 3/2019 | Vannucci et al. |
| 2019/0074598 A1 | 3/2019 | Henry et al. |
| 2019/0074864 A1 | 3/2019 | Henry et al. |
| 2019/0074865 A1 | 3/2019 | Henry et al. |
| 2019/0074878 A1 | 3/2019 | Henry et al. |
| 2019/0109568 A1 | 4/2019 | Ben Smida et al. |
| 2019/0115877 A1 | 4/2019 | Ben Smida et al. |
| 2019/0150774 A1 | 5/2019 | Brinkmann et al. |
| 2019/0199365 A1 | 6/2019 | Rachid et al. |
| 2019/0204369 A1 | 7/2019 | Lafontaine et al. |
| 2019/0207589 A1 | 7/2019 | Alic et al. |
| 2019/0215073 A1 | 7/2019 | Schmogrow et al. |
| 2019/0222179 A1 | 7/2019 | Doi |
| 2019/0222326 A1 | 7/2019 | Dunworth et al. |
| 2019/0260401 A1 | 8/2019 | Megretski et al. |
| 2019/0260402 A1 | 8/2019 | Chuang et al. |
| 2019/0268026 A1 | 8/2019 | Liu |
| 2019/0280730 A1 | 9/2019 | Zhang et al. |
| 2019/0280778 A1 | 9/2019 | Zhu et al. |
| 2019/0312552 A1 | 10/2019 | Chan et al. |
| 2019/0312571 A1 | 10/2019 | Hovakimyan et al. |
| 2019/0312648 A1 | 10/2019 | Cavaliere et al. |
| 2019/0326942 A1 | 10/2019 | Spring et al. |
| 2019/0348956 A1 | 11/2019 | Megretski et al. |
| 2019/0386621 A1 | 12/2019 | Alon et al. |
| 2019/0386750 A1 | 12/2019 | Wang et al. |
| 2020/0000355 A1 | 1/2020 | Khair |
| 2020/0008686 A1 | 1/2020 | Khair |
| 2020/0012754 A1 | 1/2020 | Larimore |
| 2020/0028476 A1 | 1/2020 | Kim et al. |
| 2020/0064406 A1 | 2/2020 | Ritzberger et al. |
| 2020/0067543 A1 | 2/2020 | Kim et al. |
| 2020/0067600 A1 | 2/2020 | Agazzi et al. |
| 2020/0076379 A1 | 3/2020 | Tanio et al. |
| 2020/0091608 A1 | 3/2020 | Alpman et al. |
| 2020/0110474 A1 | 4/2020 | Liberty et al. |
| 2020/0119756 A1 | 4/2020 | Boghrat et al. |
| 2020/0145033 A1 | 5/2020 | Rafique |
| 2020/0145112 A1 | 5/2020 | Wang et al. |
| 2020/0162035 A1 | 5/2020 | Gorbachov |
| 2020/0169227 A1 | 5/2020 | Megretski et al. |
| 2020/0169334 A1 | 5/2020 | Li et al. |
| 2020/0169937 A1 | 5/2020 | Kim et al. |
| 2020/0174514 A1 | 6/2020 | Amiralizadeh Asl et al. |
| 2020/0186103 A1 | 6/2020 | Weber et al. |
| 2020/0195296 A1 | 6/2020 | Sarkas et al. |
| 2020/0225308 A1 | 7/2020 | Dosenbach et al. |
| 2020/0244232 A1 | 7/2020 | Cope et al. |
| 2020/0252032 A1 | 8/2020 | Faig et al. |
| 2020/0259465 A1 | 8/2020 | Wu et al. |
| 2020/0266768 A1 | 8/2020 | Chen et al. |
| 2020/0274560 A1 | 8/2020 | Pratt |
| 2020/0279546 A1 | 9/2020 | Chase |
| 2020/0295975 A1 | 9/2020 | Li et al. |

(56) References Cited

U.S. PATENT DOCUMENTS

| | | | |
|---|---|---|---|
| 2020/0313763 | A1 | 10/2020 | Wang et al. |
| 2020/0321920 | A1 | 10/2020 | Chiron |
| 2020/0333295 | A1 | 10/2020 | Schiffres et al. |
| 2020/0351072 | A1 | 11/2020 | Khandani |
| 2020/0366253 | A1 | 11/2020 | Megretski et al. |
| 2020/0382147 | A1 | 12/2020 | Menkhoff et al. |
| 2020/0389207 | A1 | 12/2020 | Taniguchi et al. |
| 2020/0395662 | A1 | 12/2020 | Tervo et al. |
| 2021/0006207 | A1 | 1/2021 | Carvalho et al. |
| 2021/0013843 | A1 | 1/2021 | Cohen et al. |
| 2021/0021238 | A1 | 1/2021 | Chan et al. |
| 2021/0044461 | A1 | 2/2021 | Groen et al. |
| 2021/0075464 | A1 | 3/2021 | Luo |
| 2021/0075649 | A1 | 3/2021 | Mahmood et al. |
| 2021/0097128 | A1 | 4/2021 | Murase |

OTHER PUBLICATIONS

U.S. Appl. No. 10/008,218, filed Jun. 26, 2018, Wu et al.
U.S. Appl. No. 10/009,050, filed Jun. 26, 2018, Chen et al.
U.S. Appl. No. 10/009,109, filed Jun. 26, 2018, Rope et al.
U.S. Appl. No. 10/009,259, filed Jun. 26, 2018, Calmon et al.
U.S. Appl. No. 10/013,515, filed Jul. 3, 2018, Williams.
U.S. Appl. No. 10/015,593, filed Jul. 3, 2018, Iyer et al.
U.S. Appl. No. 10/027,397, filed Jul. 17, 2018, Kim.
U.S. Appl. No. 10/027,427, filed Jul. 17, 2018, Vannucci et al.
U.S. Appl. No. 10/027,523, filed Jul. 17, 2018, Chritz et al.
U.S. Appl. No. 10/033,107, filed Jul. 24, 2018, Henry et al.
U.S. Appl. No. 10/033,108, filed Jul. 24, 2018, Henry et al.
U.S. Appl. No. 10/033,413, filed Jul. 24, 2018, Pratt.
U.S. Appl. No. 10/033,568, filed Jul. 24, 2018, Piazza et al.
U.S. Appl. No. 10/050,636, filed Aug. 14, 2018, Tangudu et al.
U.S. Appl. No. 10/050,710, filed Aug. 14, 2018, Anandakumar et al.
U.S. Appl. No. 10/050,714, filed Aug. 14, 2018, Nishihara et al.
U.S. Appl. No. 10/050,815, filed Aug. 14, 2018, Henry et al.
U.S. Appl. No. 10/051,483, filed Aug. 14, 2018, Barzegar et al.
U.S. Appl. No. 10/051,488, filed Aug. 14, 2018, Vannucci et al.
U.S. Appl. No. 10/062,970, filed Aug. 28, 2018, Vannucci et al.
U.S. Appl. No. 10/063,265, filed Aug. 28, 2018, Pratt et al.
U.S. Appl. No. 10/063,354, filed Aug. 28, 2018, Hadani et al.
U.S. Appl. No. 10/063,364, filed Aug. 28, 2018, Khandani.
U.S. Appl. No. 10/069,467, filed Sep. 4, 2018, Carvalho et al.
U.S. Appl. No. 10/069,535, filed Sep. 4, 2018, Vannucci et al.
U.S. Appl. No. 10/075,201, filed Sep. 11, 2018, Gazneli et al.
U.S. Appl. No. 10/079,652, filed Sep. 18, 2018, Henry et al.
U.S. Appl. No. 10/084,562, filed Sep. 25, 2018, Abdoli et al.
U.S. Appl. No. 10/090,594, filed Oct. 2, 2018, Henry et al.
U.S. Appl. No. 10/095,927, filed Oct. 9, 2018, Derakhshani et al.
U.S. Appl. No. 10/096,883, filed Oct. 9, 2018, Henry et al.
U.S. Appl. No. 10/097,273, filed Oct. 9, 2018, Agazzi et al.
U.S. Appl. No. 10/097,939, filed Oct. 9, 2018, Sheen et al.
U.S. Appl. No. 10/101,370, filed Oct. 16, 2018, Lafontaine et al.
U.S. Appl. No. 10/103,777, filed Oct. 16, 2018, Henry et al.
U.S. Appl. No. 10/108,858, filed Oct. 23, 2018, Derakhshani et al.
U.S. Appl. No. 10/110,315, filed Oct. 23, 2018, Ling.
U.S. Appl. No. 10/116,390, filed Oct. 30, 2018, Ling et al.
U.S. Appl. No. 10/123,217, filed Nov. 6, 2018, Barzegar et al.
U.S. Appl. No. 10/128,955, filed Nov. 13, 2018, Rope et al.
U.S. Appl. No. 10/129,057, filed Nov. 13, 2018, Willis III et al.
U.S. Appl. No. 10/135,145, filed Nov. 20, 2018, Henry et al.
U.S. Appl. No. 10/141,944, filed Nov. 27, 2018, Rachid et al.
U.S. Appl. No. 10/142,754, filed Nov. 27, 2018, Sheen et al.
U.S. Appl. No. 10/147,431, filed Dec. 4, 2018, Dick et al.
U.S. Appl. No. 10/148,016, filed Dec. 4, 2018, Johnson et al.
U.S. Appl. No. 10/148,360, filed Dec. 4, 2018, Ashrafi.
U.S. Appl. No. 10/148,417, filed Dec. 4, 2018, Ling et al.
U.S. Appl. No. 10/153,793, filed Dec. 11, 2018, Hausmair et al.
U.S. Appl. No. 10/168,501, filed Jan. 1, 2019, Ashrafi.
U.S. Appl. No. 10/170,840, filed Jan. 1, 2019, Henry et al.
U.S. Appl. No. 10/171,158, filed Jan. 1, 2019, Barzegar et al.
U.S. Appl. No. 10/181,825, filed Jan. 15, 2019, Ben Smida et al.
U.S. Appl. No. 10/191,376, filed Jan. 29, 2019, Borodovsky.
U.S. Appl. No. 10/198,582, filed Feb. 5, 2019, Linde et al.
U.S. Appl. No. 10/200,106, filed Feb. 5, 2019, Barzegar et al.
U.S. Appl. No. 10/205,212, filed Feb. 12, 2019, Henry et al.
U.S. Appl. No. 10/205,231, filed Feb. 12, 2019, Henry et al.
U.S. Appl. No. 10/205,482, filed Feb. 12, 2019, Barzegar et al.
U.S. Appl. No. 10/205,655, filed Feb. 12, 2019, Barzegar et al.
U.S. Appl. No. 10/211,855, filed Feb. 19, 2019, Baringer et al.
U.S. Appl. No. 10/212,014, filed Feb. 19, 2019, Qu et al.
U.S. Appl. No. 10/218,405, filed Feb. 26, 2019, Magers.
U.S. Appl. No. 10/224,634, filed Mar. 5, 2019, Henry et al.
U.S. Appl. No. 10/224,970, filed Mar. 5, 2019, Pratt.
U.S. Appl. No. 10/230,353, filed Mar. 12, 2019, Alic et al.
U.S. Appl. No. 10/230,550, filed Mar. 12, 2019, Al-Mufti et al.
U.S. Appl. No. 10/237,114, filed Mar. 19, 2019, Duyck et al.
U.S. Appl. No. 10/243,525, filed Mar. 26, 2019, Nagasaku.
U.S. Appl. No. 10/243,596, filed Mar. 26, 2019, Kerhuel et al.
U.S. Appl. No. 10/268,169, filed Apr. 23, 2019, van Zelm et al.
U.S. Appl. No. 10/270,478, filed Apr. 23, 2019, Liu.
U.S. Appl. No. 10/291,384, filed May 14, 2019, Askar et al.
U.S. Appl. No. 10/305,432, filed May 28, 2019, Trayling et al.
U.S. Appl. No. 10/305,435, filed May 28, 2019, Murugesu et al.
U.S. Appl. No. 10/311,243, filed Jun. 4, 2019, Calmon et al.
U.S. Appl. No. 10/320,340, filed Jun. 11, 2019, Pratt et al.
U.S. Appl. No. 10/333,474, filed Jun. 25, 2019, Alon et al.
U.S. Appl. No. 10/333,561, filed Jun. 25, 2019, Liu.
U.S. Appl. No. 10/333,764, filed Jun. 25, 2019, Arditti Ilitzky.
U.S. Appl. No. 10/334,637, filed Jun. 25, 2019, Khandani.
U.S. Appl. No. 10/348,341, filed Jul. 9, 2019, Weissman et al.
U.S. Appl. No. 10/348,345, filed Jul. 9, 2019, Guyton et al.
U.S. Appl. No. 10/374,781, filed Aug. 6, 2019, Khandani.
U.S. Appl. No. 10/384,064, filed Aug. 20, 2019, Choi et al.
U.S. Appl. No. 10/389,449, filed Aug. 20, 2019, Ling et al.
U.S. Appl. No. 10/396,723, filed Aug. 27, 2019, Haas et al.
U.S. Appl. No. 10/404,296, filed Sep. 3, 2019, Kim et al.
U.S. Appl. No. 10/404,376, filed Sep. 3, 2019, Schmogrow et al.
U.S. Appl. No. 10/417,353, filed Sep. 17, 2019, Larimore.
U.S. Appl. No. 10/419,046, filed Sep. 17, 2019, Chen et al.
U.S. Appl. No. 10/419,126, filed Sep. 17, 2019, Ling.
U.S. Appl. No. 10/447,211, filed Oct. 15, 2019, Rollins et al.
U.S. Appl. No. 10/447,244, filed Oct. 15, 2019, Zhou et al.
U.S. Appl. No. 10/452,621, filed Oct. 22, 2019, Medard et al.
U.S. Appl. No. 10/463,276, filed Nov. 5, 2019, Hunter et al.
U.S. Appl. No. 10/474,775, filed Nov. 12, 2019, Okuyama et al.
U.S. Appl. No. 10/491,170, filed Nov. 26, 2019, Ben Smida et al.
U.S. Appl. No. 10/491,171, filed Nov. 26, 2019, Ben Smida et al.
U.S. Appl. No. 10/498,372, filed Dec. 3, 2019, Pratt.
U.S. Appl. No. 10/505,638, filed Dec. 10, 2019, Agazzi et al.
U.S. Appl. No. 10/511,337, filed Dec. 17, 2019, Boghrat et al.
U.S. Appl. No. 10/514,776, filed Dec. 24, 2019, Liberty et al.
U.S. Appl. No. 10/516,434, filed Dec. 24, 2019, Chang et al.
U.S. Appl. No. 10/523,159, filed Dec. 31, 2019, Megretski et al.
U.S. Appl. No. 10/530,574, filed Jan. 7, 2020, Shi et al.
U.S. Appl. No. 10/534,325, filed Jan. 14, 2020, Dash et al.
U.S. Appl. No. 10/536,221, filed Jan. 14, 2020, Wang et al.
U.S. Appl. No. 10/540,984, filed Jan. 21, 2020, Malik et al.
U.S. Appl. No. 10/545,482, filed Jan. 28, 2020, Dash et al.
U.S. Appl. No. 10/554,183, filed Feb. 4, 2020, Doi.
U.S. Appl. No. 10/560,140, filed Feb. 11, 2020, Wu et al.
U.S. Appl. No. 10/581,470, filed Mar. 3, 2020, Megretski et al.
U.S. Appl. No. 10/594,406, filed Mar. 17, 2020, Zhu et al.
U.S. Appl. No. 10/608,751, filed Mar. 31, 2020, Yu et al.
U.S. Appl. No. 10/622,951, filed Apr. 14, 2020, Chen et al.
U.S. Appl. No. 10/623,049, filed Apr. 14, 2020, Zhang et al.
U.S. Appl. No. 10/623,118, filed Apr. 14, 2020, Lagoy et al.
U.S. Appl. No. 10/630,323, filed Apr. 21, 2020, Spring et al.
U.S. Appl. No. 10/630,391, filed Apr. 21, 2020, LaGasse et al.
U.S. Appl. No. 10/644,657, filed May 5, 2020, Megretski et al.
U.S. Appl. No. 10/666,307, filed May 26, 2020, Wang.
U.S. Appl. No. 10/735,032, filed Aug. 4, 2020, Liu.
U.S. Appl. No. 10/741,188, filed Aug. 11, 2020, Dick et al.
U.S. Appl. No. 10/742,388, filed Aug. 11, 2020, Khandani.

(56) References Cited

OTHER PUBLICATIONS

U.S. Appl. No. 10/749,480, filed Aug. 18, 2020, Tanio et al.
U.S. Appl. No. 10/756,682, filed Aug. 25, 2020, Faig et al.
U.S. Appl. No. 10/756,774, filed Aug. 25, 2020, Sarkas et al.
U.S. Appl. No. 10/756,822, filed Aug. 25, 2020, Marsella et al.
U.S. Appl. No. 10/763,904, filed Sep. 1, 2020, Megretski et al.
U.S. Appl. No. 10/770,080, filed Sep. 8, 2020, Dick et al.
U.S. Appl. No. 10/775,437, filed Sep. 15, 2020, Rivoir.
U.S. Appl. No. 10/812,166, filed Oct. 20, 2020, Kim et al.
U.S. Appl. No. 10/826,444, filed Nov. 3, 2020, Soubercaze-Pun et al.
U.S. Appl. No. 10/826,615, filed Nov. 3, 2020, Cavaliere et al.
U.S. Appl. No. 10/833,634, filed Nov. 10, 2020, Chan et al.
U.S. Appl. No. 10/841,013, filed Nov. 17, 2020, Agazzi et al.
U.S. Appl. No. 10/862,517, filed Dec. 8, 2020, Kim et al.
U.S. Appl. No. 10/873,301, filed Dec. 22, 2020, Chiron.
U.S. Appl. No. 10/887,022, filed Jan. 5, 2021, Dar et al.
U.S. Appl. No. 10/892,786, filed Jan. 12, 2021, Pratt et al.
U.S. Appl. No. 10/897,276, filed Jan. 19, 2021, Megretski et al.
U.S. Appl. No. 10/902,086, filed Jan. 26, 2021, Agee.
U.S. Appl. No. 10/905,342, filed Feb. 2, 2021, Sterling et al.
U.S. Appl. No. 10/911,029, filed Feb. 2, 2021, Velazquez et al.
U.S. Appl. No. 10/931,238, filed Feb. 23, 2021, Megretski et al.
U.S. Appl. No. 10/931,318, filed Feb. 23, 2021, Mahmood et al.
U.S. Appl. No. 10/931,320, filed Feb. 23, 2021, Megretski et al.
U.S. Appl. No. 10/931,366, filed Feb. 23, 2021, Wang et al.
U.S. Appl. No. 10/965,380, filed Mar. 30, 2021, Kim et al.
U.S. Appl. No. 10/972,139, filed Apr. 6, 2021, Luo.
U.S. Appl. No. 10/979,090, filed Apr. 13, 2021, Rafique.
U.S. Appl. No. 10/979,097, filed Apr. 13, 2021, Luo.
U.S. Appl. No. 10/985,951, filed Apr. 20, 2021, Li et al.
Abdelaziz, M., L. Anttila, and M. Valkama, "Reduced-complexity digital predistortion for massive mimo," in Acoustics, Speech and Signal Processing (ICASSP), 2017 IEEE International Conference on. IEEE, 2017, pp. 6478-6482.
Abrudan, Traian. Volterra Series and Nonlinear Adaptive Filters. Technical report, Helsinki University of Technology, 2003.
Aghvami, A. H. and Robertson, I. D. [Apr. 1993] Power limitation and high-power amplifier non linearities in on-board satellite communications systems. Electron, and Comm. Engin. J.
Akaiwa, Y. Introduction to Digital Mobile Communication. New York: Wiley, 1997.
Alexander, N. A., A. A. Chanerley, A. J. Crewe, and S. Bhattacharya. "Obtaining spectrum matching time series using a Reweighted Volterra Series Algorithm (RVSA)." Bulletin of the Seismological Society of America 104, No. 4 (2014): 1663-1673.
Altera Corporation. Digital Predistortion Reference Design. Application Note 314, 2003.
Ahluwalia, Sehej Swaran. "An FPGA Implementation of Adaptive Linearization of Power Amplifiers." PhD diss., Georgia Institute of Technology, 2019.
Akaiwa, Yoshihiko. Introduction to digital mobile communication. John Wiley & Sons, 2015.
Annabestani, Mohsen, and Nadia Naghavi. "Practical realization of discrete-time Volterra series for high-order nonlinearities." Nonlinear Dynamics 98, No. 3 (2019): 2309-2325.
Arthanayake, T. and Wood, H. B. [Apr. 8, 1971] Linear amplification using envelope feedback. Elec. Lett.
Aysal, Tuncer C., and Kenneth E. Barner, "Myriad-Type Polynomial Filtering", IEEE Transactions on Signal Processing, vol. 55, No. 2, Feb. 2007.
Barner, Kenneth E., and Tuncer Can Aysal, "Polynomial Weighted Median Filtering", IEEE Transactions on Signal Processing, vol. 54, No. 2, Feb. 2006.
Barner, Kenneth E,.Gonzalo R. Arce, Giovanni L. Sicuranza, and Ilya Shmulevich, "Nonlinear Signal and Image Processing—Part I", EURASIP J. Applied Signal Processing (2002).
Barner, Kenneth E,.Gonzalo R. Arce, Giovanni L. Sicuranza, and Ilya Shmulevich, "Nonlinear Signal and Image Processing—Part II", EURASIP J. Applied Signal Processing (2002).

Bedrosian, Edward, and Stephen O. Rice. "The output properties of Volterra systems (nonlinear systems with memory) driven by harmonic and Gaussian inputs." Proceedings of the IEEE 59, No. 12(1971): 1688-1707.
Bennet, T. J. and Clements, R. F. [May 1974] Feedforward—An alternative approach to amplifier linearisation. Radio and Electron. Engin.
Bhargava, V. K. et al. [1981] Digital Communications by Satellite, John Wiley and Sons.
Biglieri, Ezio, Sergio Barberis, and Maurizio Catena, "Analysis and Compensation of Nonlinearities in Digital Transmission Systems", IEEE Journal on selected areas in Communications, vol. 6, No. 1, Jan. 1988.
Li, Bin, Chenglin Zhao, Mengwei Sun, Haijun Zhang, Zheng Zhou, and Arumugam Nallanathan. "A Bayesian approach for nonlinear equalization and signal detection in millimeter-wave communications." IEEE Transactions on Wireless Communications 14, No. 7 (2015): 3794-3809.
Birpoutsoukis, Georgios, Anna Marconato, John Lataire, and Johan Schoukens. "Regularized nonparametric Volterra kernel estimation." Automatica 82 (2017): 324-327.
Black, H. S. [Dec. 1937] Wave translating system. U.S. Pat. No. 2,102,671.
Black, H. S. [Oct. 1928] Translating system. U.S. Pat. No. 1,686,792.
Bohm, D. The Special Theory of Relativity, Benjamin, 1965.
Bond F. E. and Meyer, H. F. [Apr. 1970] Intermodulation effects in limiter amplifier repeaters. IEEE Trans. Comm., vol. COM-18, p. 127-135.
Bouzrara, Kais, Abdelkader Mbarek, and Tarek Garna. "Non-linear predictive controller for uncertain process modelled by GOBF-Volterra models." International Journal of Modelling, Identification and Control 19, No. 4 (2013): 307-322.
Boyd, Stephen, Leon O. Chua, and Charles A. Desoer. "Analytical foundations of Volterra series." IMA Journal of Mathematical Control and Information 1, No. 3 (1984): 243-282.
Budura, Georgeta, and Corina Botoca, "Efficient Implementation of the Third Order RLS Adaptive Volterra Filter", FACTA Universitatis (NIS) Ser.: Elec. Energ. vol. 19, No. 1, Apr. 2006.
Budura, Georgeta, and Corina Botoca. "Nonlinearities identification using the LMS Volterra filter." Communications Department Faculty of Electronics and Telecommunications Timisoara, Bd. V. Parvan 2 (2005).
Campello, Ricardo JGB, Gérard Favier, and Wagner C. Do Amaral. "Optimal expansions of discrete-time Volterra models using Laguerre functions." Automatica 40, No. 5 (2004): 815-822.
Campello, Ricardo JGB, Wagner C. Do Amaral, and Gerard Favier. "A note on the optimal expansion of Volterra models using Laguerre functions." Automatica 42, No. 4 (2006): 689-693.
Carassale, Luigi, and Ahsan Kareem. "Modeling nonlinear systems by Volterra series." Journal of engineering mechanics 136, No. 6 (2010): 801-818.
Censor, D., & Melamed, T, 2002, Volterra differential constitutive operators and locality considerations in electromagnetic theory, PIER—Progress in Electromagnetic Research, 36: 121-137.
Censor, D., 2000, A quest for systematic constitutive formulations for general field and wave systems based on the Volterra differential operators, PIER—Progress in Electromagnetics Research, (25): 261-284.
Censor, D., 2001, Constitutive relations in inhomogeneous systems and the particle-field conundrum, PIER—Progress in Electromagnetics Research, (30): 305-335.
Censor, D., "Volterra Series and Operators" (2003).
Cheaito, A., M. Crusseìre, J.-F. Hélard, and Y. Louët, "Quantifying the memory effects of power amplifiers: Evm closed-form derivations of multicarrier signals." IEEE Wireless Commun. Letters, vol. 6, No. 1, pp. 34-37, 2017.
Chen, S., B. Mulgrew, and P. M. Grant, "A clustering technique for digital communications channel equalization using radial basis function networks," IEEE Transactions on neural networks, vol. 4, No. 4, pp. 570-590, 1993.

(56) References Cited

OTHER PUBLICATIONS

Chen, Hai-Wen. "Modeling and identification of parallel and feedback nonlinear systems." In Proceedings of 1994 33rd IEEE Conference on Decision and Control, vol. 3, pp. 2267-2272. IEEE, 1994.
Da Rosa, Alex, Ricardo JGB Campello, and Wagner C. Amaral. "Choice of free parameters in expansions of discrete-time Volterra models using Kautz functions." Automatica 43, No. 6 (2007): 1084-1091.
Deng, Yongjun, and Zhixing Yang. "Comments on" Complex-bilinear recurrent neural network for equalization of a digital Satellite Channel"." IEEE Transactions on Neural Networks 17, No. 1 (2006): 268.
Dimitrov, S., "Non-linear distortion cancellation and symbol-based equalization in satellite forward links," IEEE Trans Wireless Commun, vol. 16, No. 7, pp. 4489-4502, 2017.
Ding, L., G. T. Zhou, D. R. Morgan, Z. Ma, J. S. Kenney, J. Kim, and C. R. Giardina, "A robust digital baseband predistorter constructed using memory polynomials," IEEE Transactions on communications, vol. 52, No. 1, pp. 159-165, 2004.
Doyle III, Francis J., Babatunde A. Ogunnaike, and Ronald K. Pearson. "Nonlinear model-based control using second-order Volterra models." Automatica 31, No. 5 (1995): 697-714.
ETSI [Aug. 1994] Standard ETR 132. Radio broadcasting systems; Code of practice for site engineering VHF FM sound broadcasting transmitters. European Telecommunications Standards Institute, Sophia Antipolis, F-06291, Valbonne Cedex, France.
ETSI [Jan. 1995] European Standard ETS 300 384. Radio broadcasting systems; Very high frequency (VHF), frequency modulated, sound broadcasting transmitters. European Telecommunications Standards Institute, Sophia Antipolis, F-06291, Valbonne Cedex, France.
ETSI [Jun. 1998] Standard ETR 053 Ed 3—Radio site engineering for equipment and systems in the mobile service. European Telecommunications Standards Institute, Sophia Antipolis, F-06291, Valbonne Cedex, France.
ETSI [Mar. 1997] European Standard ETS 300 113. Radio equipment and systems (RES); Land mobile service; Technical characteristics and test conditions for radio equipment intended for the transmission of data (and speech) and having an antenna connector. European Telecommunications Standards Institute, Sophia Antipolis, F-06291, Valbonne Cedex, France.
Eun, Changsoo, and Edward J. Powers. "A new Volterra predistorter based on the indirect learning architecture." IEEE transactions on signal processing 45, No. 1 (1997): 223-227.
Evans, Ceri, David Rees, Lee Jones, and Michael Weiss. "Periodic signals for measuring nonlinear Volterra kernels." IEEE transactions on instrumentation and measurement 45, No. 2 (1996): 362-371.
Fang, Yang-Wang, Li-Cheng Jiao, Xian-Da Zhang and Jin Pan, "On the Convergence of Volterra Filter Equalizers Using a Pth-Order Inverse Approach", IEEE Transactions on Signal Processing, vol. 49, No. 8, Aug. 2001.
Fang, Xi, Yixin Fu, Xin Sui, Lei Zhang, Xianwei Gao, Ding Ding, and Lifang Liu. "Volterra-based fiber nonlinearity impairment modeling for OHDM/OQAM systems." In 2019 18th International Conference on Optical Communications and Networks (ICOCN), pp. 1-3. IEEE, 2019.
Fang, Yang-Wang, Li-Cheng Jiao, Xian-Da Zhang, and Jin Pan. "On the convergence of Volterra filter equalizers using a pth-order inverse approach." IEEE transactions on signal processing 49, No. 8 (2001): 1734-1744.
Frank, Walter A. "An efficient approximation to the quadratic Volterra filter and its application in real-time loudspeaker linearization." Signal Processing 45, No. 1 (1995): 97-113.
Frank, Walter A. "Sampling requirements for Volterra system identification." IEEE Signal Processing Letters 3, No. 9 (1996): 266-268.
Franz, Matthias O., and Bernhard Schölkopf. "A unifying view of Wiener and Volterra theory and polynomial kernel regression." Neural computation 18, No. 12 (2006): 3097-3118.
Franz, Matthias O., Volterra and Weiner Series, Scholarpedia, 6(10):11307 doi:10.4249/scholarpedia.11307.
Gardner, William A., and Teri L. Archer. "Exploitation of cyclostationarity for identifying the Volterra kernels of nonlinear systems." IEEE transactions on Information Theory 39, No. 2 (1993): 535-542.
Gardner, William A., and Teri L. Archer. "Simplified methods for identifying the Volterra kernels of nonlinear systems." In [1991] Proceedings of the 34th Midwest Symposium on Circuits and Systems, pp. 98-101. IEEE, 1992.
Genecili, Hasmet, and Michael Nikolaou. "Design of robust constrained model-predictive controllers with volterra series." AIChE Journal 41, No. 9 (1995): 2098-2107.
Ghannouchi, Fadhel M., Oualid Hammi, and Mohamed Helaoui. Behavioral modeling and predistortion of wideband wireless transmitters. John Wiley & Sons, 2015.
Gilbert, Elmer. "Functional expansions for the response of nonlinear differential systems." IEEE transactions on Automatic Control 22, No. 6 (1977): 909-921.
Gray, L. F. [1980] Application of broadband linearisers to satellite transponders. IEEE Conf. Proc. ICC'80.
Guan, L., and A. Zhu, "Simplified dynamic deviation reduction-based volterra model for doherty power amplifiers," in Integrated Nonlinear Microwave and Millimetre-Wave Circuits (INMMIC), 2011 Workshop on. IEEE, 2011, pp. 1-4.
Guan, Lei, and Anding Zhu. "Low-cost FPGA implementation of Volterra series-based digital predistorter for RF power amplifiers." IEEE Transactions on Microwave Theory and Techniques 58, No. 4 (2010): 866-872.
Guérin, Alexandre, Gérard Faucon, and Régine Le Bouquin-Jeannès, "Nonlinear Acoustic Echo Cancellation Based on Volterra Filters", IEEE Transactions on Speech and Audio Processing, vol. 11, No. 6, Nov. 2003.
Guiomar, Fernando P., Jacklyn D. Reis, António L. Teixeira, and Armando N. Pinto. "Mitigation of intra-channel nonlinearities using a frequency-domain Volterra series equalizer." Optics express 20, No. 2 (2012): 1360-1369.
Hanson, Joshua. "Learning Volterra Series via RKHS Methods." (2019).
Haykin, Simon, "Adaptive Filter Theory", Fourth Edition, Pearson Education, 2008.
Heathman, A. C. [1989] Methods for intermodulation prediction in communication systems. Ph. D. Thesis, University of Bradford, United Kingdom.
Heiskanen, Antti, Janne Aikio, and Timo Rahkonen. "A 5th order Volterra study of a 30W LDMOS power amplifier." In Proceedings of the 2003 International Symposium on Circuits and Systems, 2003. ISCAS'03., vol. 4, pp. IV-IV. IEEE, 2003.
Helie, Thomas, "Introduction to Volterra series and applications to physical audio signal processing" IRCAM—CNRS UMR9912—UPMC, Paris, France DAFx, 2011.
Helie, Thomas, "Systemes entree-sortie non lineaires et applications en audio-acoustique", Series de Volterra, Ecole Thematiqu "Theorie du Controlee n Mechanique" (2019).
Hermann, Robert. "Volterra modeling of digital magnetic saturation recording channels." IEEE Transactions on Magnetics 26, No. 5 (1990): 2125-2127.
Hoerr, Ethan, and Robert C. Maher. "Using Volterra series modeling techniques to classify black-box audio effects." In Audio Engineering Society Convention 147. Audio Engineering Society, 2019.
Ibnkahla, M., "Applications of neural networks to digital communications—a survey," Signal processing, vol. 80, No. 7, pp. 1185-1215, 2000.
IESS Interlsat Earth Station Standards Document IESS-101 (Rev. 61) 2005.
IESS [Nov. 1996] IESS-401 (Rev. 4). Performance requirements for intermodulation products transmitted from INTELSAT earth stations. Intelsat Earth Station Standard (IESS).
Israelsen, Brett W., and Dale A. Smith. "Generalized Laguerre reduction of the Volterra kernel for practical identification of nonlinear dynamic systems." arXiv preprint arXiv:1410.0741 (2014).
Kaeadar, K. [Dec. 1986] Gaussian white-noise generation for digital signal synthesis. IEEE Trans. Inst. and Meas., vol. IM 35, 4.

(56) References Cited

OTHER PUBLICATIONS

Kafadar, Karen. "Gaussian white-noise generation for digital signal synthesis." IEEE transactions on instrumentation and measurement 4 (1986): 492-495.
Kahn, L. R. [Jul. 1952] SSB transmission by envelope elimination and restoration. Proc. IRE.
Kamiya, N., and F. Maehara. "Nonlinear Distortion Avoidance Employing Symbol-wise Transmit Power Control for OFDM Transmission," Proc. of Int'l. OFDM Workshop, Hamburg, 2009.
Khan, A. A., and N. S. Vyas. "Application of Volterra and Wiener theories for nonlinear parameter estimation in a rotor-bearing system." Nonlinear Dynamics 24, No. 3 (2001): 285-304.
Khan, A. A., and N. S. Vyas. "Non-linear parameter estimation using Volterra and Wiener theories." Journal of Sound and Vibration 221, No. 5 (1999): 805-821.
Kim, J., and K. Konstantinou, "Digital predistortion of wideband signals based on power amplifier model with memory," Electronics Letters, vol. 37, No. 23, pp. 1417-1418, 2001.
Koh, Taiho, and E. Powers. "Second-order Volterra filtering and its application to nonlinear system identification." IEEE Transactions on acoustics, speech, and signal processing 33, No. 6 (1985): 1445-1455.
Kohli, Amit Kumar, and Amrita Rai. "Numeric variable forgetting factor RLS algorithm for second-order Volterra filtering." Circuits, Systems, and Signal Processing 32, No. 1 (2013): 223-232.
Korenberg, Michael J., and Ian W. Hunter. "The identification of nonlinear biological systems: Volterra kernel approaches." Annals of biomedical engineering 24, No. 2 (1996): 250-268.
Krall, Christoph, Klaus Witrisal, Geert Leus and Heinz Koeppl, "Minimum Mean-Square Error Equalization for Second-Order Volterra Systems", IEEE Transactions on Signal Processing, vol. 56, No. 10, Oct. 2008.
Ku, Y. H., and Alfred A. Wolf. "Volterra-Wiener functionals for the analysis of nonlinear systems." Journal of the Franklin Institute 281, No. 1 (1966): 9-26.
Leis, John, "Adaptive Filter Lecture Notes & Examples", Nov. 1, 2008 www.usq.edu.au/users/leis/notes/sigproc/adfilt.pdf.
Li, B., C. Zhao, M. Sun, H. Zhang, Z. Zhou, and A. Nallanathan, "A bayesian approach for nonlinear equalization and signal detection in millimeter-wave communications," IEEE Transactions on Wireless Communications, vol. 14, No. 7, pp. 3794-3809, 2015.
Li, Jian, and Jacek Ilow. "Adaptive Volterra predistorters for compensation of non-linear effects with memory in OFDM transmitters." In 4th Annual Communication Networks and Services Research Conference (CNSR'06), pp. 4-pp. IEEE, 2006.
Liu, T., S. Boumaiza, and F. M. Ghannouchi, "Dynamic behavioral modeling of 3g power amplifiers using real-valued time-delay neural networks," IEEE Transactions on Microwave Theory and Techniques, vol. 52, No. 3, pp. 1025-1033, 2004.
Lopez-Bueno, David, Teng Wang, Pere L. Gilabert, and Gabriel Montoro. "Amping up, saving power: Digital predistortion linearization strategies for power amplifiers under wideband 4GV5G burst-like waveform operation." IEEE Microwave Magazine 17, No. 1 (2015): 79-87.
Álvarez-López, Luis, and Juan A. Becerra. "Application of deep learning methods to the mitigation of nonlinear effects in communication systems."
López-Valcarce, Roberto, and Soura Dasgupta, "Second-Order Statistical Properties of Nonlinearly Distorted Phase-Shift Keyed (PSK) Signals", IEEE Communications Letters, vol. 7, No. 7, Jul. 2003.
Lozhkin, Alexander N. "Turbo Linearizer for High Power Amplifier." In 2011 IEEE 73rd Vehicular Technology Conference (VTC Spring), pp. 1-5. IEEE, 2011.
Lucciardi, J.-A., P. Potier, G. Buscarlet, F. Barrami, and G. Mesnager, "Non-linearized amplifier and advanced mitigation techniques: Dvbs-2x spectral efficiency improvement," in GLOBECOM 2017-2017 IEEE Global Communications Conference. IEEE, 2017, pp. 1-7.
Maass, Wolfgang, and Eduardo D. Sontag. "Neural systems as nonlinear filters." Neural computation 12, No. 8 (2000): 1743-1772.
Marmarelis, Vasilis Z., and Xiao Zhao. "Volterra models and three-layer perceptrons." IEEE Transactions on Neural Networks 8, No. 6 (1997): 1421-1433.
Mathews, V. John, "Adaptive Polynomial Filters," IEEE Signal Processing Magazine, vol. 8, No. 3, Jul. 1991.
Mathews, V. John. "Orthogonalization of correlated Gaussian signals for Volterra system identification." IEEE Signal Processing Letters 2, No. 10 (1995): 188-190.
Mirri, Domenico, G. Luculano, Fabio Filicori, Gaetano Pasini, Giorgio Vannini, and G. P. Gabriella. "A modified Volterra series approach for nonlinear dynamic systems modeling." IEEE Transactions on Circuits and Systems I: Fundamental Theory and Applications 49, No. 8 (2002): 1118-1128.
Mkadem, F., and S. Boumaiza, "Physically inspired neural network model for rf power amplifier behavioral modeling and digital predistortion," IEEE Transactions on Microwave Theory and Techniques, vol. 59, No. 4, pp. 913-923, 2011.
Mollen, C., E. G. Larsson, and T. Eriksson, "Waveforms for the massive mimo downlink: Amplifier efficiency, distortion, and performance," IEEE Transactions on Communications, vol. 64, No. 12, pp. 5050-5063, 2016.
Mzyk, Grzegorz, Zygmunt Hasiewicz, and Pawel Mielcarek. "Kernel Identification of Non-Linear Systems with General Structure." Algorithms 13, No. 12 (2020): 328.
Niknejad, Ali M., "Volterra/Wiener Representation of Non-Linear Systems", U.C. Berkeley (2014).
Nowak, Robert D., and Barry D. Van Veen. "Volterra filter equalization: A fixed point approach." IEEE Transactions on signal processing 45, No. 2 (1997): 377-388.
Nowak, Robert D., and Barry D. Van Veen. "Random and pseudorandom inputs for Volterra filter identification." IEEE Transactions on Signal Processing 42, No. 8 (1994): 2124-2135.
Ogunfunmi, Tokunbo. Adaptive nonlinear system identification: The Volterra and Wiener model approaches. Springer Science & Business Media, 2007.
Orcioni, Simone. "Improving the approximation ability of Volterra series identified with a cross-correlation method." Nonlinear Dynamics 78, No. 4 (2014): 2861-2869.
Orcioni, Simone, Alessandro Terenzi, Stefania Cecchi, Francesco Piazza, and Alberto Carini. "Identification of Volterra models of tube audio devices using multiple-variance method." Journal of the Audio Engineering Society 66, No. 10 (2018): 823-838.
Orcioni, Simone, Massimiliano Pirani, Claudio Turchetti, and Massimo Conti. "Practical notes on two Volterra filter identification direct methods." In 2002 IEEE International Symposium on Circuits and Systems. Proceedings (Cat. No. 02CH37353), vol. 3, pp. III-III. IEEE, 2002.
Palm, G., and T. Poggio. "The Volterra representation and the Wiener expansion: validity and pitfalls." SIAM Journal on Applied Mathematics 33, No. 2 (1977): 195-216.
Park, D.-C., and T.-K. J. Jeong, "Complex-bilinear recurrent neural network for equalization of a digital satellite channel," IEEE Transactions on Neural Networks, vol. 13, No. 3, pp. 711-725, 2002.
Perev, K. "Orthogonal Approximation of Volterra Series and Wiener G-functionals Descriptions for Nonlinear Systems." Information Technologies and Control (2019), Online ISSN: 2367-5357, DOI: 10.7546/itc-2019-0003.
Petrovic, V. and Gosling, W. [May 10, 1979] Polar loop transmitter. Elec. Lett.
Pirani, Massimiliano, Simone Orcioni, and Claudio Turchetti. "Diagonal Kernel Point Estimation of th-Order Discrete Volterra-Wiener Systems." EURASIP Journal on Advances in Signal Processing 2004, No. 12(2004): 1-10.
Prazenica, Richard J., and Andrew J. Kurdila. "Multiwavelet constructions and Volterra kernel identification." Nonlinear Dynamics 43, No. 3 (2006): 277-310.
Radiocommunications Agency [Apr. 1987] Code of practice for radio site engineering. MPT 1331. Radiocommunications Agency (RA), Flyde Microsystems Ltd. United Kingdom.
Rai, Amrita, and Amit Kumar Kohli. "Analysis of Adaptive Volterra Filters with LMS and RLS Algorithms." AKGEC Journal of Technology 2, No. 1 (2011).

(56) References Cited

OTHER PUBLICATIONS

Rawat, M., K. Rawat, and F. M. Ghannouchi, "Adaptive digital predistortion of wireless power amplifiers/transmitters using dynamic realvalued focused time-delay line neural networks," IEEE Transactions on Microwave Theory and Techniques, vol. 58, No. 1, pp. 95-104, 2010.
Roheda, Siddharth, and Hamid Krim. "Conquering the CNN Over-Parameterization Dilemma: A Volterra Filtering Approach for Action Recognition." In Proceedings of the AAAI Conference on Artificial Intelligence, vol. 34, No. 07, pp. 11948-11956. 2020.
Root, D. E., J. Xu, T. Nielsen, C. Gillease, R. Biernacki, and J. Verspecht. "Measurement-based Nonlinear Behavioral Modeling of Transistors and Components."
Rugh, Wilson J., Nonlinear System Theory: The Volterra/Wiener Approach. Johns Hopkins University Press, 1981.
Rupp, Markus, "Pre-Distortion Algorithm for Power Amplifiers", Ph.D. Dissertation, eingereicht an der Technischen Universitat Wien.
Saadoon, Mohammed Ayad. "Linearization of Power Amplifiers With Memory Effects Using Memory Polynomial and Linearly Interpolated Look-Up Table Predistorter." (2017).
Saleh, A. M. [May 1982] Intermodulation analysis of FDMA satellite systems employing compensated and uncompensated TWT's'. IEEE Trans. Comm., vol. COM-30, 5.
Sáez, Raúl Gracia, and Nicolás Medrano Marqués. "RF power amplifier linearization in professional mobile radio communications using artificial neural networks." IEEE Transactions on Industrial Electronics 66, No. 4 (2018): 3060-3070.
Saleh, Adel AM. "Intermodulation analysis of FDMA satellite systems employing compensated and uncompensated TWT's." IEEE Transactions on Communications 30, No. 5 (1982): 1233-1242.
Sarti, Augusto, and Silvano Pupolin. "Recursive techniques for the synthesis of a pth-order inverse of a volterra system." European Transactions on Telecommunications 3, No. 4 (1992): 315-322.
Schetzen, M., 1980, The Volterra and Wiener Theorems of Nonlinear Systems, New York, Chichester, Brisbane and Toronto: John Wiley and Sons.
Schetzen, Martin. "Synthesis of a class of non-linear systems." International Journal of Control 1, No. 5 (1965): 401-414.
Schetzen, Martin. "Nonlinear system modeling based on the Wiener theory." Proceedings of the IEEE 69, No. 12(1981): 1557-1573.
Schetzen, Martin. "Multilinear theory of nonlinear networks." Journal of the Franklin Institute 320, No. 5 (1985): 221-247.
Schetzen, Martin. "Nonlinear system modelling and analysis from the Volterra and Wiener perspective." In Block-oriented Nonlinear System Identification, pp. 13-24. Springer, London, 2010.
Sebald, D. J., and J. A. Bucklew, "Support vector machine techniques for nonlinear equalization," IEEE Transactions on Signal Processing, vol. 48, No. 11, pp. 3217-3226, 2000.
Shafi, Fahim. "Prediction of harmonic and intermodulation performance of frequency dependent nonlinear circuits and systems." PhD diss., King Fahd University of Petroleum and Minerals, 1994.
Shimbo, O. [Feb. 1971] Effects of intermodulation, AM-PM conversion, and additive noise in multicarrier TWT systems. Proc. IEEE, vol. 59, p. 230-238.
Silva, Walter. "Reduced-order models based on linear and nonlinear aerodynamic impulse responses." In 40th Structures, Structural Dynamics, and Materials Conference and Exhibit, p. 1262. 1999.
Sim, M. S., M. Chung, D. Kim, J. Chung, D. K. Kim, and C.-B. Chae, "Nonlinear self-interference cancellation for full-duplex radios: From link-level and system-level performance perspectives," IEEE Communications Magazine, vol. 55, No. 9, pp. 158-167, 2017.
Simons, K., Technical Handbook for CATV Systems, 3rd Edition. Jerrod Publication No. 436-001-01, 1968.
Smith, C. N. Application of the Polar Loop Technique to UHF SSB transmitters. University of Bath (United Kingdom), 1986.
Sonnenschein, M & Censor, D., 1998, Simulation of Hamiltonian light beam propagation in nonlinear media, JOSA-Journal of the Optical Society of America B, (15): 1335-1345.
Staudinger, J., J.-C. Nanan, and J. Wood, "Memory fading volterra series model for high power infrastructure amplifiers," in Radio and Wireless Symposium (RWS), 2010 IEEE. IEEE, 2010, pp. 184-187.
Stenger, Alexander, and Rudolf Rabenstein. "Adaptive Volterra filters for nonlinear acoustic echo cancellation." In NSIP, pp. 679-683. 1999.
Stenger, Alexander, Lutz Trautmann, and Rudolf Rabenstein. "Nonlinear acoustic echo cancellation with 2nd order adaptive Volterra filters." In 1999 IEEE International Conference on Acoustics, Speech, and Signal Processing. Proceedings. ICASSP99 (Cat. No. 99CH36258), vol. 2, pp. 877-880. IEEE, 1999.
Stepashko, Volodymyr, 2nd International Conference on Inductive Modelling (ICIM'2008) Kyiv, Sep. 15-19, 2008.
Swiss Federal Institute of Technology, Lausanne, "Advantages of nonlinear polynomial predictors" (2010).
Tang, Hao, Y. H. Liao, J. Y. Cao, and Hang Xie. "Fault diagnosis approach based on Volterra models." Mechanical Systems and Signal Processing 24, No. 4 (2010): 1099-1113.
Thapar, HK, and BJ Leon. "Lumped nonlinear system analysis with Volterra series [Final Phase Report, Nov. 1978-Nov. 1979]." (1980).
Therrien, Charles W., W. Kenneth Jenkins, and Xiaohui Li, "Optimizing the Performance of Polynomial Adaptive Filters: Making Quadratic Filters Converge Like Linear Filters", IEEE Transactions on Signal Processing, vol. 47, No. 4, Apr. 1999.
Thomas, Erik GF, J. Leo van Hemmen, and Werner M. Kistler. "Calculation of Volterra kernels for solutions of nonlinear differential equations." SIAM Journal on Applied Mathematics 61, No. 1 (2000): 1-21.
Tsimbinos John, and Langford B. White, "Error Propagation and Recovery in Decision-Feedback Equalizers for Nonlinear Channels", IEEE Transactions on Communications, vol. 49, No. 2, Feb. 2001.
Tsimbinos, John, and Kenneth V. Lever. "Applications of higher-order statistics to modelling, identification and cancellation of nonlinear distortion in high-speed samplers and analogue-to-digital converters using the Volterra and Wiener models." In [1993 Proceedings] IEEE Signal Processing Workshop on Higher-Order Statistics, pp. 379-383. IEEE, 1993.
Tsimbinos, John, and Langford B. White. "Error propagation and recovery in decision-feedback equalizers for nonlinear channels." IEEE Transactions on Communications 49, No. 2 (2001): 239-242.
Tsimbinos, John, and Kenneth V. Lever. "The computational complexity of nonlinear compensators based on the Volterra inverse." In Proceedings of 8th Workshop on Statistical Signal and Array Processing, pp. 387-390. IEEE, 1996.
Tsimbinos, John, and Kenneth V. Lever. "Computational complexity of Volterra based nonlinear compensators." Electronics Letters 32, No. 9 (1996): 852-854.
Uncini, A., L. Vecci, P. Campolucci, and F. Piazza, "Complex-valued neural networks with adaptive spline activation function for digital-radio-links nonlinear equalization," IEEE Transactions on Signal Processing, vol. 47, No. 2, pp. 505-514, 1999.
Vazquez, Rafael, and Miroslav Krstic. "Volterra boundary control laws for a class of nonlinear parabolic partial differential equations." IFAC Proceedings vols. 37, No. 13 (2004): 1253-1258.
Wang, C.-L. and Y. Ouyang, "Low-complexity selected mapping schemes for peak-to-average power ratio reduction in ofdm systems," IEEE Transactions on signal processing, vol. 53, No. 12, pp. 4652-4660, 2005.
Wang, Chin-Liang, and Yuan Ouyang. "Low-complexity selected mapping schemes for peak-to-average power ratio reduction in OFDM systems." IEEE Transactions on signal processing 53, No. 12 (2005): 4652-4660.
Watanabe, Atsushi. "The volterra series expansion of functionals defined on the finite-dimensional vector space and its application to saving of computational effort for volterra kernels." Electronics and Communications in Japan (Part I: Communications) 69, No. 4 (1986): 37-46.
Wei, Wentao, Peng Ye, Jinpeng Song, Hao Zeng, Jian Gao, and Yu Zhao. "A behavioral dynamic nonlinear model for time-interleaved ADC based on Volterra series." IEEE Access 7 (2019): 41860-41873.

(56) References Cited

OTHER PUBLICATIONS

Woo, Young Yun, et al. "Adaptive Digital Feedback Predistortion Technique for Linearizing Power Amplifiers," IEEE Transactions on Microwave Theory and Techniques, vol. 55, No. 5, May 2007.
Wood, J., Behavioral modeling and linearization of RF power amplifiers. Artech House, 2014.
Wray, Jonathan, and Gary GR Green. "Calculation of the Volterra kernels of non-linear dynamic systems using an artificial neural network." Biological cybernetics 71, No. 3 (1994): 187-195.
Yan, H., and D. Cabric, "Digital predistortion for hybrid precoding architecture in millimeter-wave massive mimo systems," in Acoustics, Speech and Signal Processing (ICASSP), 2017 IEEE International Conference on. IEEE, 2017, pp. 3479-3483.
Yasui, Syozo. "Stochastic functional Fourier series, Volterra series, and nonlinear systems analysis." IEEE Transactions on Automatic Control 24, No. 2 (1979): 230-242.
Yoffe, I., and D. Wulich, "Predistorter for mimo system with nonlinear power amplifiers," IEEE Transactions on Communications, vol. 65, No. 8, pp. 3288-3301, 2017.
Yu, Chao, Lei Guan, Erni Zhu, and Anding Zhu. "Band-limited Volterra series-based digital predistortion for wideband RF power amplifiers." IEEE Transactions on Microwave Theory and Techniques 60, No. 12 (2012): 4198-4208.
Zaknich, A., "Principals of Adaptive Filter and Self Learning Systems", Springer Link 2005.
Zhang, Haitao. On the design techniques to improve self-heating, linearity, efficiency and mismatch protection in broadband HBT power amplifiers. University of California, Irvine, 2006.
Zhu, Anding. "Behavioral modeling for digital predistortion of RF power amplifiers: from Volterra series to CPWL functions." In 2016 IEEE Topical Conference on Power Amplifiers for Wireless and Radio Applications (PAWR), pp. 1-4. IEEE, 2016.
Zhu, A., J. C. Pedro, and T. J. Brazil, "Dynamic deviation reduction-based volterra behavioral modeling of rf power amplifiers," IEEE Transactions on microwave theory and techniques, vol. 54, No. 12, pp. 4323-4332, 2006.
Zhu, A., P. J. Draxler, J. J. Yan, T. J. Brazil, D. F. Kimball, and P. M. Asbeck, "Open-loop digital predistorter for rf power amplifiers using dynamic deviation reduction-based volterra series," IEEE Transactions on Microwave Theory and Techniques, vol. 56, No. 7, pp. 1524-1534, 2008.
Zhu, Anding, and Thomas J. Brazil. "Behavioral modeling of RF power amplifiers based on pruned Volterra series." IEEE Microwave and Wireless components letters 14, No. 12 (2004): 563-565.
Zhu, Anding, and Thomas J. Brazil. "An adaptive Volterra predistorter for the linearization of RF high power amplifiers." In 2002 IEEE MTT-S International Microwave Symposium Digest (Cat. No. 02CH37278), vol. 1, pp. 461-464. IEEE, 2002.
Zhu, Anding, Michael Wren, and Thomas J. Brazil. "An efficient Volterra-based behavioral model for wideband RF power amplifiers." In IEEE MTT-S International Microwave Symposium Digest, 2003, vol. 2, pp. 787-790. IEEE, 2003.
Zhu, Anding, and Thomas J. Brazil. "RF power amplifier behavioral modeling using Volterra expansion with Laguerre functions." In IEEE MTT-S International Microwave Symposium Digest, 2005., pp. 4-pp. IEEE, 2005.
Zhu, Anding, Paul J. Draxler, Jonmei J. Yan, Thomas J. Brazil, Donald F. Kimball, and Peter M. Asbeck. "Open-loop digital predistorter for RF power amplifiers using dynamic deviation reduction-based Volterra series." IEEE Transactions on Microwave Theory and Techniques 56, No. 7 (2008): 1524-1534.
Zhu, Anding, Jos Carlos Pedro, and Telmo Reis Cunha. "Pruning the Volterra series for behavioral modeling of power amplifiers using physical knowledge." IEEE Transactions on Microwave Theory and Techniques 55, No. 5 (2007): 813-821.
Zhu, Anding, Paul J. Draxler, Chin Hsia, Thomas J. Brazil, Donald F. Kimball, and Peter M. Asbeck. "Digital predistortion for envelope-tracking power amplifiers using decomposed piecewise Volterra series." IEEE Transactions on Microwave Theory and Techniques 56, No. 10 (2008): 2237-2247.
Zhu, Anding, and Thomas J. Brazil. "An overview of Volterra series based behavioral modeling of RF/microwave power amplifiers." In 2006 IEEE annual wireless and microwave technology conference, pp. 1-5. IEEE, 2006.
Zhu, Yun-Peng, and Zi-Qiang Lang. "A new convergence analysis for the Volterra series representation of nonlinear systems." Automatica 111 (2020): 108599.

\* cited by examiner

System block diagram with nonlinear power amplifier and deep neural network equalizer.

Block diagram of DNN equalizer.

Constellation of 16QAM over a simulated PA received signal

Constellation of 16QAM over a real PA received signal

16-QAM NLD equalization MSE results

EQ-MSE/SER improvement in percentage over measured NLD

|        | Volterra | | NN | | Volterra+NN | |
| --- | --- | --- | --- | --- | --- | --- |
|        | MSE | SER | MSE | SER | MSE | SER |
| 64-QAM | 16% | 26% | 10% | 25% | 42% | 44% |
| 16-QAM | 41% | 2% | 35% | 6% | 85% | 28% |
| QPSK | 57% | 0% | 100% | 0% | 100% | 0% |
| AVERAGE | 38% | 9% | 48% | 10% | 76% | 24% |

Fig. 6

INTEGRATING VOLTERRA SERIES MODEL AND DEEP NEURAL NETWORKS TO EQUALIZE NONLINEAR POWER AMPLIFIERS

CROSS REFERENCE TO RELATED APPLICATIONS

The present application is a Continuation of U.S. patent application Ser. No. 16/812,229, filed Mar. 6, 2020, now U.S. Pat. No. 10,985,951, issued Apr. 20, 2021, which Claims benefit of priority under 35 U.S.C. § 119(e) from, and is a non-provisional of, U.S. Provisional Patent Application No. 62/819,054, filed Mar. 15, 2019, the entirety of which is expressly incorporated herein by reference.

FIELD OF THE INVENTION

The present invention relates to the field of equalization of nonlinear radio frequency power amplifiers, and more particularly to a neural network implementation of radio frequency power amplifier equalization

BACKGROUND OF THE INVENTION

Most modern wireless communication systems, including the fifth generation (5G) cellular systems, use multi-carrier or OFDM (orthogonal frequency division multiplexing) modulations whose signals have extremely high peak to average power ratio (PAPR). This makes it challenging to enhance the efficiency of power amplifiers (PAs). Signals with high PAPR need linear power amplifier response in order to reduce distortion. Nevertheless, PAs have the optimal power efficiency only in the nonlinear saturated response region. In practice, the PAs in the wireless transceivers have to work with high output backoff (OBO) in order to suppress non-linear distortions, which unfortunately results in severe reduction of power efficiency [1]. This problem, originated from the nonlinearity of PAs, has been one of the major constraints to enhance the power efficiency of modern communication systems.

Various strategies have been investigated to mitigate this problem. The first strategy is to reduce the PAPR of the transmitted signals. Many techniques have been developed for this purpose, such as signal clipping, peak cancellation, error waveform subtraction [2]. For OFDM signals, pilot tones and unmodulated subcarriers can be exploited to reduce PAPR with some special pre-coding techniques [3].

The second strategy is to linearize the PAs at the transmitters. One of the dominating practices today is to insert a digital pre-distorter (DPD) before the PA, which distorts the signals appropriately so as to compensate for the nonlinear PA response [4] [5] [6]. DPD has been applied widely in many modern transmitters [2].

The third strategy is to mitigate the nonlinear PA distortions at the receivers via post-distorter equalization [7] [8] [9]. The solution presented in [10] develops a Bayesian signal detection algorithm based on the nonlinear response of the PAs. However, this method works for the simple "AM-AM AM-PM" nonlinear PA model only. Alternatively, as a powerful non-linear modeling tool, artificial neural networks have also been studied for both nonlinear modeling of PAs [11] [12] and nonlinear equalization [13] [14] [15].

One of the major design goals for the 5G systems is to make the communication systems more power efficient. This needs efficient PAs, which is unfortunately more challenging since 5G signals have much higher PAPR and wider bandwidth [16] [17]. This is an especially severe problem for cost and battery limited devices in massive machine-type communications or internet of things (IoT). Existing nonlinear PA mitigation strategies may not be sufficient enough. PAPR can be reduced to some extent only. DPD is too complex and costly for small and low-cost 5G devices. Existing DPD and equalization techniques have moderate nonlinear distortion compensation capabilities only.

As a matter of fact, the nonlinear equalization strategy is more attractive to massive MIMO and millimeter wave transmissions due to the large number of PAs needed [18] [19] [20]. Millimeter wave transmissions require much higher transmission power to compensate for severe signal attenuation. Considering the extremely high requirement on PA power efficiency and the large number of PAs in a transmitter, the current practice of using DPD may not be appropriate due to implementation complexity and cost.

There are various types of intermodulation that can be found in radio systems, see, Rec. ITU-R SM.1446: Type 1 Single channel intermodulation: where the wanted signal is distorted by virtue of non-linearities in the transmitter; Type 2 Multichannel intermodulation: where the wanted signals of multi channels are distorted by virtue of non-linearities in the same transmitter; Type 3 Inter transmitter intermodulation: where one or more transmitters on a site intermodulate, either within the transmitters themselves or within a nonlinear component on site to produce intermodulation products; Type 4 Intermodulation due to active antennas: the multicarrier operating mode of an active antenna, along with the non-linearity of amplifiers, originates spurious emissions under the form of intermodulation signals; and Type 5 Intermodulation due to passive circuits: where transmitters share the same radiating element and intermodulation occurs due to non-linearities of passive circuits. See, Rep. ITU-R-SM.2021

An amplifier can be characterized by a Taylor series of the generalized transfer function [32]

$$i_0 + k_1 e_{IN} + k_2 e_{IN}^2 + k_3 e_{IN}^3 + k_4 e_{IN}^4 + k_5 e_{IN}^5 + \ldots$$

where $i_0$ is the quiescent output current, k1, k2, etc. are coefficients and eIN represents the input signal. When two sinusoidal frequencies $\omega_1 = 2\pi f_1$ and $\omega_2 = 2\pi f_2$ of the amplitude $a_1$ and $a_2$ are applied to the input of the amplifier, the input signal is:

$$e_{IN} = a_1 \cos \omega_1 t + a_2 \cos \omega_2 t$$

and the output $i_{OUT}$ may be shown to be the sum of the DC components:

$$i_{OUT} = i_0 + \frac{k_2}{2}(a_1^2 + a_2^2) + \frac{k_4}{8}(3a_1^4 + 12a_1^2 + 3a_2^4)$$

fundamental components:

$$+ \left( k_1 a_1 + \frac{3}{4} k_3 a_1^3 + \frac{3}{2} k_3 a_1 a_2^2 + \frac{5}{8} k_5 a_1^5 + \frac{15}{4} k_5 a_1^3 a_2^2 + \frac{15}{8} k_5 a_1 a_2^4 \right) \cos \omega_1 t$$

$$+ \left( k_1 a_2 + \frac{3}{4} k_3 a_2^3 + \frac{3}{2} k_3 a_1^2 a_2 + \frac{5}{8} k_5 a_2^5 + \frac{15}{4} k_5 a_1^2 a_2^3 + \frac{15}{8} k_5 a_1^4 a_2 \right) \cos \omega_2 t$$

2nd order components:

$$+ (½ k_2 a_1^2 + ½ k_3 a_1^4 + ¾ k_4 a_1^2 a_2^2) \cos 2\omega_1 t$$

$$+ (½ k_2 a_2^2 + ½ k_3 a_2^4 + ¾ k_4 a_1^2 a_2^2) \cos 2\omega_2 t$$

$$+ (k_2 a_1 a_2 + ½ k_4 a_1^3 a_2 + ½ k_4 a_1 a_2^3) \cos(\omega_1 \pm \omega_2) t$$

3rd order components:

$$+(\tfrac{1}{4}k_3 a_1^3 + \tfrac{5}{16}k_5 a_1^5 + \tfrac{5}{4}k_5 a_1^3 a_2^2)\cos 3\omega_1 t$$

$$+(\tfrac{1}{4}k_3 a_2^3 + \tfrac{5}{16}k_5 a_2^5 + \tfrac{5}{4}k_5 a_1^2 a_2^3)\cos 3\omega_2 t$$

$$+\left(\tfrac{3}{4}k_3 a_1^2 a_2 + \tfrac{5}{4}k_5 a_1^4 a_2 + \tfrac{15}{8}k_5 a_1^2 a_2^3\right)\cos(\omega_1 \pm 2\omega_2)t$$

$$+\left(\tfrac{3}{4}k_3 a_1 a_2^2 + \tfrac{5}{4}k_5 a_1 a_2^4 + \tfrac{15}{8}k_5 a_1^3 a_2^2\right)\cos(\omega_2 \pm 2\omega_1)t$$

4th order components:

$$+\tfrac{1}{8}k_4 a_1^4 \cos 4\omega_1 t + \tfrac{1}{8}k_4 a_2^4 \cos 4\omega_2 t$$

$$+\tfrac{1}{2}k_4 a_1^3 a_2 \cos(3\omega_1 \pm \omega_2)t + \tfrac{3}{4}k_4 a_1^2 a_2^2 \cos(2\omega_1 \pm 2\omega_2)t + \tfrac{1}{2}k_4 a_1 a_2^3 \cos(\omega_1 \pm 3\omega_2)t$$

and 5th order components:

$$+\tfrac{1}{16}k_5 a_1^5 \cos 5\omega_1 t + \tfrac{1}{16}k_5 a_2^5 \cos 5\omega_2 t$$

$$+\tfrac{5}{16}k_5 a_1^4 a_2 \cos(4\omega_1 \pm \omega_2)t + \tfrac{5}{8}k_5 a_1^3 a_2^2 \cos(3\omega_1 \pm 2\omega_2)t$$

$$+\tfrac{5}{8}k_5 a_1^2 a_2^3 \cos(2\omega_1 \pm 3\omega_2)t + \tfrac{5}{16}k_5 a_1 a_2^4 \cos(\omega_1 \pm 4\omega_2)t$$

The series may be expanded further for terms in $k_6 e_{IN}^6$ etc. if desired. All the even order terms produce outputs at harmonics of the input signal and that the sum and difference products are well removed in frequency far from the input signal. The odd order products, however, produce signals near the input frequencies $f1\pm 2f2$ and $f2\pm 2f1$. Therefore, the odd order intermodulation products cannot be removed by filtering, only by improvement in linearity.

Assuming class A operation, $a_1=a_2$ and $k_4$, $k_5$ are very small, the 3rd order intermodulation product IM3 becomes proportional to $a_3$. That means that the cube of the input amplitude and the graph of the intermodulation products will have a slope of 3 in logarithmic scale while the wanted signal will have the slope of 1. Second order products IM2 can be similarly calculated, and the graph for these has a slope of two. The points where these graphs cross are called 3rd order intercept point IP3 and 2nd order intercept point IP2, respectively. IP3 is the point where the intermodulation product is equal to the fundamental signal. This is a purely theoretical consideration, but gives a very convenient method of comparing devices. For example, a device with intermodulation products of −40 dBm at 0 dBm input power is to be compared with one having intermodulation products of −70 dBm for 10 dBm input. By reference to the intercept point, it can be seen that the two devices are equal.

The classical description of intermodulation of analogue radio systems deals with a two-frequency input model to a memoryless non-linear device. This non-linear characteristic can be described by a function $f(x)$, which yields the input-output relation of the element device. The function, $f$, is usually expanded in a Taylor-series and thus produces the harmonics and as well the linear combinations of the input frequencies. This classical model is well suited to analogue modulation schemes with dedicated frequency lines at the carrier frequencies. The system performance of analogue systems is usually measured in terms of signal-to-noise (S/N) ratio, and the distorting intermodulation signal can adequately be described by a reduction of S/N.

With digital modulation methods, the situation is changed completely. Most digital modulation schemes have a continuous signal spectrum without preferred lines at the carrier frequencies. The system degradation due to intermodulation is measured in terms of bit error ratio (BER) and depends on a variety of system parameters, e.g. the special modulation scheme which is employed. For estimation of the system performance in terms of BER a rigorous analysis of non-linear systems is required. There are two classical methods for the analysis and synthesis of non-linear systems: the first one carries out the expansion of the signal in a Volterra series [27]. The second due to Wiener uses special base functionals for the expansion.

Both methods lead to a description of the non-linear system by higher order transfer functions having n input variables depending on the order of the non-linearity. Two data signals $x_1(t)$ and $x_2(t)$, originated from $x(t)$, are linearly filtered by the devices with the impulse responses $h_a(t)$ and $h_b(t)$ in adjacent frequency bands. The composite summed signal y is hereafter distorted by an imperfect square-law device which might model a transmit-amplifier. The input-output relation of the non-linear device is given by: $z(t)=y(t)+ay^2(t)$ The output signal z(t) including the intermodulation noise is caused by non-linearities of third order. For this reason, the imperfect square-law device is now replaced by an imperfect cubic device with the input-output relation: $z(t)=y(t)+ay^3(t)$ There are several contributions of the intermodulation noise falling into the used channels near $f_0$.

Linearization of a transmitter system may be accomplished by a number of methods:

Feedforward linearization: This technique compares the amplified signal with an appropriately delayed version of the input signal and derives a difference signal, representing the amplifier distortions. This difference signal is in turn amplified, and subtracted from the final HPA output. The main drawback of the method is the requirement for a 2nd amplifier—the technique can, however, deliver an increase in output power of some 3 dB when used with a TWT.

Feedback linearization: In audio amplifiers, linearization may readily be achieved by the use of feedback, but this is less straightforward at high RF frequencies due to limitations in the available open-loop amplifier gain. It is possible, however, to feedback a demodulated form of the output, to generate adaptive pre-distortion in the modulator. It is clearly not possible to apply such an approach in a bent-pipe transponder, however, where the modulator and HPA are rather widely separated.

Predistortion: Rather than using a method that responds to the actual instantaneous characteristics of the HPA, it is common to pre-distort the input signal to the amplifier, based on a priori knowledge of the transfer function. Such pre-distortion may be implemented at RF, IF or at baseband. Baseband linearizers, often based on the use of look-up tables held in firmware memory are becoming more common with the ready availability of VLSI techniques, and can offer a compact solution. Until recently, however, it has been easier to generate the appropriate pre-distortion function with RF or IF circuitry.

RF amplifier linearization techniques can be broadly divided into two main categories:

Open-loop techniques, which have the advantage of being unconditionally stable, but have the drawback of being unable to compensate for changes in the amplifier characteristics.

Closed-loop techniques, which are inherently self-adapting to changes in the amplifier, but can suffer from stability problems.

Predistortion involves placing a compensating non-linearity into the signal path, ahead of the amplifier to be linearized. The signal is thus predistorted before being applied to the amplifier. If the predistorter has a non-linearity which is the exact inverse of the amplifier non-linearity, then the distortion introduced by the amplifier will exactly cancel the predistortion, leaving a distortionless output. In its simplest analogue implementation, a practical predistorter can be a network of resistors and non-linear elements such as diodes or transistors. Although adaptive predistortion schemes have been reported, where the non-linearity is implemented in digital signal processing (DSP), they tend to be very computationally or memory intensive, and power hungry.

Feedforward [28] is a distortion cancellation technique for power amplifiers. The error signal generated in the power amplifier is obtained by summing the loosely coupled signal and a delayed inverted input signal, so that the input signal component is cancelled. This circuit is called the signal cancelling loop. The error signal is amplified by an auxiliary amplifier, and is then subtracted from the delayed output signal of the power amplifier, so that the distortion at the output is cancelled. This circuit is called the error cancelling loop. It is necessary to attenuate the input signal component lower than the error signal at the input of the auxiliary amplifier, so that the residual main signal does not cause overloading of the auxiliary amplifier, or does not cancel the main signal itself at the equipment output.

Negative feedback [29] is a well-known linearization technique and is widely used in low frequency amplifiers, where stability of the feedback loop is easy to maintain. With multi-stage RF amplifiers however, it is usually only possible to apply a few dB of overall feedback before stability problems become intractable [30]. This is mainly due to the fact that, whereas at low frequency it can be ensured that the open-loop amplifier has a dominant pole in its frequency response (guaranteeing stability), this is not feasible with RF amplifiers because their individual stages generally have similar bandwidths. Of course, local feedback applied to a single RF stage is often used, but since the distortion reduction is equal to the gain reduction, the improvement obtained is necessarily small because there is rarely a large excess of open loop gain available.

At a given center frequency, a signal may be completely defined by its amplitude and phase modulation. Modulation feedback exploits this fact by applying negative feedback to the modulation of the signal, rather than to the signal itself. Since the modulation can be represented by baseband signals, we can successfully apply very large amounts of feedback to these signals without the stability problems that beset direct RF feedback. Early applications of modulation feedback used amplitude (or envelope) feedback only, applied to valve amplifiers [31], where amplitude distortion is the dominant form of non-linearity. With solid-state amplifiers however, phase distortion is highly significant and must be corrected in addition to the amplitude errors.

For estimation of the system performance in terms of BER a rigorous analysis of non-linear systems is required. There are two classical methods for the analysis and synthesis of non-linear systems: the first one carries out the expansion of the signal in a Volterra series [27]. The second due to Wiener uses special base functionals for the expansion. These are the Wiener G-functionals which are orthogonal if white Gaussian noise excites the system. It is the special autocorrelation property of the white Gaussian noise which makes it so attractive for the analysis of non-linear systems. The filtered version of AWGN, the Brownian movement or the Wiener process, has special features of its autocorrelation which are governed by the rules for mean values of the products of jointly normal random variables.

The non-linear system output signal y(t) can be expressed by a Volterra series:

$$y(t)=H_0+H_1+H_2+\ldots$$

where Hi is the abbreviated notation of the Volterra operator operating on the input x(t) of the system. The first three operators are given in the following. The convolution integrals are integrated from $-\infty$, to $+\infty$.

$$H_0[x(t)]=h_0$$

$$H_1[x(t)]=\int h_1(\tau)x(t-\tau)d\tau$$

$$H_2[x(t)]=\int\int h_2(\tau_1,\tau_2)x(t-\tau_1)x(t-\tau_2)d\tau_1 d\tau_2$$

The kernels of the integral operator can be measured by a variation of the excitation time of input pulses, e.g. for the second order kernel $h_2(\tau_1, \tau_2)$: $x(t)=\delta(t-\tau_1)\,\delta(t-\tau_2)$. A better method is the measurement of the kernel by the cross-correlation of exciting white Gaussian noise n(t) as input signal with the system output $y_i(t)$. These equations hold, if:

$$\Phi_{nn}(\tau)=A\delta(\tau)$$

is the autocorrelation function of the input signal x(t)=n(t) (white Gaussian noise) where A is the noise power spectral density. The first three kernels are given then by:

$$h_0 = \overline{y_0(t)}$$

$$h_1(\sigma) = \frac{1}{A}\overline{y_1(t)n(t-\sigma)}$$

$$h_2(\sigma_1, \sigma_2) = \frac{1}{2A^2}\overline{y_2(t)n(t-\sigma_1)n(t-\sigma_2)}$$

The overline denotes the expected value, or temporal mean value for ergodic systems.

The method can be expanded to higher order systems by using higher order Volterra operators $H_n$. However, the Volterra operators of different order are not orthogonal and, therefore, some difficulties arise at the expansion of an unknown system in a Volterra series.

These difficulties are circumvented by the Wiener G-functionals, which are orthogonal to all Volterra operators with lower order, if white Gaussian noise excites the system.

TABLE 1

| Volterra kernels | Direct Fourier Transform | Laplace transform |
|---|---|---|
| Linear (1st order) | $H_1 = |H_1(\omega)| = \left| \int_{-\infty}^{+\infty} h_1(\tau_1) \cdot \exp(-j\omega\tau_1) \cdot d\tau_1 \right|$ | $H_1(p) = k_1 \cdot L_1(p)$ |
| Quadratic (2nd order) | $H_2 = |H_2(\omega)| = \left| \int_{-\infty}^{+\infty} \int_{-\infty}^{+\infty} h_2(\tau_1, \tau_2) \cdot \exp[-j\omega(\tau_1 + \tau_2)] \cdot d\tau_1 d\tau_2 \right|$ | $H_2(p) = k_2 \cdot L_1(2p)$ |
| Cubic (3rd order) | $H_3 = |H_3(\omega)| = \left| \int_{-\infty}^{+\infty} \int_{-\infty}^{+\infty} \int_{-\infty}^{+\infty} h_3(\tau_1, \tau_2, \tau_3) \cdot \exp[-j\omega(\tau_1 + \tau_2 + \tau_3)] \cdot d\tau_1 d\tau_2 d\tau_3 \right|$ | $H_3(p) = k_3 \cdot L_1(3p)$ |

See, Panagiev, Oleg. "Adaptive compensation of the nonlinear distortions in optical transmitters using predistortion." Radioengineering 17, no. 4 (2008): 55.

The first three Wiener G-functionals are:

$$G_0[x(t)] = k_0$$

$$G_1[x(t)] = \int k_1(\tau_1) x(t-\tau_1) d\tau_1$$

$$G_2[x(t)] = \iint k_2(\tau_1,\tau_2) x(t-\tau_1) x(t-\tau_2) d\tau_1 d\tau_2 - A \int k_2(\tau_1,\tau_2) d\tau_1$$

$$G_3[x(t)] = \iiint k_3(\tau_1,\tau_2,\tau_3) x(t-\tau_1) x(t-\tau_2) x(t-\tau_3) d\tau_1 d\tau_2 d\tau_3 - 3A \iint k_3(\tau_1,\tau_2,\tau_2) x(t-\tau_1) d\tau_1 d\tau_2$$

For these functionals hold:

$$\overline{H_m[n(t)] G_n[n(t)]} = 0 \text{ for } m < n$$

if the input signal $n(t)$ is white Gaussian noise.

The two data signals $x_1(t)$ and $x_2(t)$, from a single signal $x(t)$, are linearly filtered by the devices with the impulse responses $h_a(t)$ and $h_b(t)$ in adjacent frequency bands. The composite summed signal y is hereafter distorted by an imperfect square-law device which might model a transmit-amplifier. The input-output relation of the non-linear device is given by:

$$z(t) = y(t) + ay^2(t)$$

The output signal $z(t)$ is therefore determined by:

$$z(t) = \int [h_a(\tau) + h_b(\tau)] x(t-\tau) d\tau + a \{ \int [h_a(\tau) + h_b(\tau)] x(t-\tau) d\tau \}^2$$

The first and second order Volterra-operators $H_1$ and $H_2$ for this example are accordingly determined by the kernels:

$$h_1(\tau) = h_a(\tau) + h_b(\tau)$$

and $$h_2(\tau_1,\tau_2) = h_a(\tau_1)[h_a(\tau_2) + h_b(\tau_2)] + h_b(\tau_1)[h_a(\tau_2) + h_b(\tau_2)]$$

This kernel $h_2(\tau_1, \tau_2)$ is symmetric, so that:

$$h_2(\tau_1,\tau_2) = h_2(\tau_2,\tau_1)$$

The second order kernel transform $H_2(\omega_1, \omega_2)$ is obtained by the two-dimensional Fourier-transform with respect to $\tau_1$ and $\tau_2$, and can be obtained as:

$$H_2(\omega_1,\omega_2) = \{ H_a(\omega_1)[H_a(\omega_2) + H_b(\omega_2)] + H_b(\omega_1)[H_a(\omega_2) + H_b(\omega_2)] \}$$

by elementary manipulations. $H_a(\omega)$ and $H_b(\omega)$ are the Fourier-transforms of $h_a(t)$ and $h_b(t)$. With the transform $X(\omega)$ of the input signal $x(t)$, an artificial two dimensional transform $Z_2(\omega_1,\omega_2)$ is obtained:

$$Z_{(2)}(\omega_1,\omega_2) = H_2(\omega_1,\omega_2) X(\omega_1) X(\omega_2)$$

with the two-dimensional inverse $Z_2(t_1, t_2)$. The output signal $z(t)$ is:

$$z(t) = z_{(2)}(t,t)$$

The transform $Z(\omega)$ of $z(t)$ can be obtained by convolution:

$$Z(\omega) = \frac{1}{2\pi} \int Z_{(2)}(\omega_1, \omega - \omega_1) d\omega_1$$

where the integration is carried out from $-\infty$ to $+\infty$.

The output $z(t)$ can be as well represented by use of the Wiener G-functionals:

$$z(t) = G_0 + G_1 + G_2 + \ldots$$

where $G_i$ is the simplified notation of $G_i[x(t)]$. The first two operators are:

$$G_0[x(t)] = -A \int [h_a(\tau) + h_b(\tau)]^2 d\tau = \text{const}$$

$$G_1[x(t)] = \int [h_a(\tau) + h_b(\tau)] x(t-\tau) d\tau$$

The operator $G_i$ equals $H_i$ in this example. For $x(t)$ equal white Gaussian noise $x(t) = n(t)$: $\overline{G_1[n(t)] h_0}$ holds for all $h_0$, especially:

$$\overline{G_1 G_0} = 0.$$

$$G_2[x(t)] = \int [h_a(\tau_1) h_a(\tau_2) + h_a(\tau_1) h_b(\tau_2) + h_b(\tau_1) h_a(\tau_2) + h_b(\tau_1) h_b(\tau_2)]$$

$$x(t-\tau_1) x(t-\tau_2) d\tau_1 d\tau_2 - A \int [h_a(\tau_1) + h_b(\tau_1)]^2 d\tau_1$$

The consequence is:

$$\overline{G_2 h_0} = h_0 \int [h_a(\tau_1) h_a(\tau_2) + h_a(\tau_1) h_b(\tau_2) + h_b(\tau_1) h_a(\tau_2) + h_b(\tau_1) h_b(\tau_2)]$$

$$\overline{n(t-\tau_1) n(t-\tau_2)} d\tau_1 d\tau_2 - h_0 A \int [h_a(\tau_1) + h_b(\tau_1)]^2 d\tau_1$$

and $$\overline{G_2 h_0} = 0 \text{ because of } \overline{n(t-\tau_1) n(t-\tau_2)} = A\delta(\tau_1 - \tau_2)$$

and similarly:

$$\overline{G_2 H_1} = 0 \text{ for all } H_1$$

This equation involves the mean of the product of three zero mean jointly Gaussian random variables, which is zero.

The Wiener kernels can be determined by exciting the system with white Gaussian noise and taking the average of some products of the system output and the exciting noise process n(t):

$$k_0 = \overline{z(t)}$$

$$k_1(\tau) = \frac{1}{A} \overline{z(t)n(t-\tau)}$$

and $$k_2(\tau_1, \tau_2) = \frac{1}{2A^2} \overline{z(t)n(t-\tau_1)n(t-\tau_2)}$$

For RF-modulated signals the intermodulation distortion in the proper frequency band is caused by non-linearities of third order. For this reason, the imperfect square-law device is now replaced by an imperfect cubic device with the input-output relation:

$$z(t) = y(t) + ay^3(t)$$

If only the intermodulation term which distorts the signal in its own frequency band is considered, the kernel transform of the third-order Volterra operator $Z_{(3)}(\omega_1, \omega_2, \omega_3)$ becomes then:

$$Z_{(3)}(\omega_1, \omega_2, \omega_3) = a \prod_{i=1}^{3} [H_a(\omega_i) + H_b(\omega_i)] X(\omega_i)$$

The intermodulation part in the spectrum of z(t) is now given by:

$$Z(\omega) = \frac{1}{(2\pi)^2} \int \int Z_{(3)}(\omega - \mu_1, \mu_1 - \mu_2, \mu_2) d\mu_1 d\mu_2$$

For a cubic device replacing the squarer, however, there are several contributions of the intermodulation noise falling into the used channels near $f_0$.

See, Amplifier References, infra.

The Volterra series is a general technique, and subject to different expressions of analysis, application, and simplifying presumptions. Below is further discussion of the technique.

A system may have hidden states of input-state-output models. The state and output equations of any analytic dynamical system are $$\dot{x}(t) = f(x, u, \theta)$$

$$y(t) = g(x, u, \theta) + \varepsilon$$

$\dot{x}(t)$ is an ordinary differential equation and expresses the rate of change of the states as a parameterized function of the states and input. Typically, the inputs u(t) correspond to designed experimental effects. There is a fundamental and causal relationship (Fliess et al 1983) between the outputs and the history of the inputs. This relationship conforms to a Volterra series, which expresses the output y(t) as a generalized convolution of the input u(t), critically without reference to the hidden states $\dot{x}(t)$. This series is simply a functional Taylor expansion of the outputs with respect to the inputs (Bendat 1990). The reason it is a functional expansion is that the inputs are a function of time.

$$y(t) = \sum_i \int_0^t \cdots \int_0^t \kappa_i(\sigma_1, \ldots, \sigma_i) u(t-\sigma_1), \ldots, u(t-\sigma_i) d\sigma_1, \ldots, d\sigma_i$$

$$\kappa_i(\sigma_1, \ldots, \sigma_i) = \frac{\partial^i y(t)}{\partial u(t-\sigma_1), \ldots, \partial u(t-\sigma_i)}$$

where $\kappa_i(\sigma_1, \ldots, \sigma_i)$ is the ith order kernel, and the integrals are restricted to the past (i.e., integrals starting at zero), rendering the equation causal. This equation is simply a convolution and can be expressed as a GLM. This means that we can take a realistic model of responses and use it as an observation model to estimate parameters using observed data. Here the model is parameterized in terms of kernels that have a direct analytic relation to the original parameters θ of the physical system. The first-order kernel is simply the conventional HRF. High-order kernels correspond to high-order HRFs and can be estimated using basis functions as described above. In fact, by choosing basis function according to $$A(\sigma)_i = \frac{\partial \kappa(\sigma)_1}{\partial \theta_i}$$

one can estimate the physical parameters because, to a first order approximation, $\beta_i = \theta_i$. The critical step is to start with a causal dynamic model of how responses are generated and construct a general linear observation model that allows estimation and inference about the parameters of that model. This is in contrast to the conventional use of the GLM with design matrices that are not informed by a forward model of how data are caused.

Dynamic causal models assume the responses are driven by designed changes in inputs. An important conceptual aspect of dynamic causal models pertains to how the experimental inputs enter the model and cause responses. Experimental variables can illicit responses in one of two ways. First, they can elicit responses through direct influences on elements. The second class of input exerts its effect through a modulation of the coupling among elements. These sorts of experimental variables would normally be more enduring. These distinctions are seen most clearly in relation to particular forms of causal models used for estimation, for example the bilinear approximation $$\dot{x}(t) = f(x, u)$$
$$= Ax + uBx + Cu$$
$$y = g(x) + \varepsilon$$
$$A = \frac{\partial f}{\partial x} \quad B = \frac{\partial^2 f}{\partial x \partial u} \quad C = \frac{\partial f}{\partial u}$$

This is an approximation to any model of how changes in one element $x(t)_i$ are caused by activity of other elements. Here the output function g(x) embodies a model. The matrix A represents the connectivity among the regions in the absence of input u(t). Effective connectivity is the influence that one system exerts over another in terms of inducing a response $\partial \dot{x}/\partial x$. This latent connectivity can be thought of as the intrinsic coupling in the absence of experimental perturbations. The matrix B is effectively the change in latent coupling induced by the input. It encodes the input-sensitive changes in A or, equivalently, the modulation of effective connectivity by experimental manipulations. Because B is a second-order derivative it is referred to as bilinear. Finally, the matrix C embodies the extrinsic influences of inputs on activity. The parameters θ={A, B, C} are the connectivity or coupling matrices that we wish to identify and define the functional architecture and interactions among elements. We can express this as a GLM and estimate the parameters using EM in the usual way (see Friston et al 2003). Generally, estimation in the context of highly parameterized models like DCMs requires constraints in the form of priors. These priors enable conditional inference about the connectivity estimates.

The central idea, behind dynamic causal modelling (DCM), is to model a physical system as a deterministic nonlinear dynamic system that is subject to inputs and produces outputs. Effective connectivity is parameterized in terms of coupling among unobserved states. The objective is to estimate these parameters by perturbing the system and measuring the response. In these models, there is no designed perturbation and the inputs are treated as unknown and stochastic. Furthermore, the inputs are often assumed to express themselves instantaneously such that, at the point of observation the change in states will be zero. In the absence of bilinear effects we have $$\dot{x} = 0$$
$$= Ax + Cu$$
$$x = -A^{-1}Cu$$

This is the regression equation used in SEM where A=A'−I and A' contains the off-diagonal connections among regions. The key point here is that A is estimated by assuming u is some random innovation with known covariance. This is not really tenable for designed experiments when u represent carefully structured experimental inputs. Although SEM and related autoregressive techniques are useful for establishing dependence among responses, they are not surrogates for informed causal models based on the underlying dynamics of these responses.

The Fourier transform pair relates the spectral and temporal domains. We use the same symbol F, although F(t) and F(ω) are different functions:

$$F(t) = \frac{1}{2\pi} \int_{-\infty}^{\infty} d\omega F(\omega) e^{-i\omega t} F(\omega) = \int_{-\infty}^{\infty} dt F(t) e^{i\omega t}$$

Accordingly, a convolution integral is derived:

$$D(t) = \int_{-\infty}^{\infty} dt_1 \varepsilon(t_1) E(t - t_1)$$

where D(t), ε(t), E(t), are related to D(ω), ε(−iω), E(ω), respectively. Note that D(t) can be viewed as an integral operation, acting on E(t) is the simplest form of a Volterra Function Series (VFS). This can also be expressed in the VDO representation $$D(t) = \varepsilon(\partial_t) E(t) = \varepsilon(\partial_\tau) E(\tau)|_{\tau \Rightarrow t}$$

The instruction $\tau \Rightarrow t$ is superfluous in a linear case, but becomes important for non-linear systems. For example, consider a harmonic signal clarifying the role of the VDO:

$$E(t) = E_0 e^{-i\omega t}$$

$$D(t) = E_0 e^{-i\omega t} \int_{-\infty}^{\infty} dt_1 E(t_1) e^{i\omega t_1} = \varepsilon(-i\omega) E_0 e^{-i\omega t} = \varepsilon(\partial_t) E_0 e^{-i\omega t}$$

In nonlinear systems, the material relations involve powers and products of fields, and $\dot{x}(t)$ can be replaced by a series involving powers of E(ω), but this leads to inconsistencies.

However, the convolution can be replaced by a "super convolution", the Volterra function series (VFS), which can be considered a Taylor expansion series with memory, given by:

$$D(t) = \sum_m D^{(m)}(t)$$

$$D^{(m)}(t) = \int_{-\infty}^{\infty} dt_1 \ldots \int_{-\infty}^{\infty} dt_m \varepsilon^{(m)}(t_1, \ldots, t_m) E(t - t_1) \ldots E(t - t_m)$$

Typically, the VFS contains the products of fields expected for nonlinear systems, combined with the convolution structure. Various orders of nonlinear interaction are indicated by m. Theoretically all the orders co-exist (in practice the series will have to be truncated within some approximation), and therefore we cannot readily inject a time harmonic signal. If instead a periodic signal, $$E(t) = \sum_n E_n e^{-in\omega t}$$

is provided, we find $$D^{(m)}(t) = \sum_{n_1, \ldots, n_m} \varepsilon^{(m)}(-in_1\omega, \ldots, -in_m\omega) E_{n_1} \ldots E_{n_m} e^{-iN\omega t} = \sum_N D_N e^{-iN\omega t}$$

$$N = n_1 + \ldots + n_m$$

displaying the essential features of a nonlinear system, namely, the dependence on a product of amplitudes, and the creation of new frequencies as sums (including differences and harmonic multiples) of the interacting signals frequencies. This function contains the weighting function $\varepsilon^{(m)}(-in_1\omega, \ldots, -in_m\omega)$ for each interaction mode.

The extension to the nonlinear VDO is given by $$D^{(m)}(t) = \varepsilon^{(m)}(\partial_{t_1}, \ldots, \partial_{t_m}) E(t_1) \ldots E(t_m)|_{t_1, \ldots, t_m \Rightarrow t}$$

In which the instruction $t_1, \ldots, t_m \Rightarrow t$ guarantees the separation of the differential operators, and finally renders both sides of the equation to become functions of t.

The VFS, including the convolution integral, is a global expression describing D(t) as affected by integration times extending from −∞ to ∞. Physically this raises questions about causality, i.e., how can future times affect past events.

In the full-fledged four-dimensional generalization causality is associated with the so called "light cone" (Bohm, 1965). It is noted that the VDO representation is local, with the various time variables just serving for book keeping of the operators, and where this representation is justified, causality problems are not invoked. In a power amplifier the physical correlate of this feature is that all past activity leads to a present state of the system, e.g., temperature, while the current inputs affect future states. In general, the frequency constraint is obtained from the Fourier transform of the VFS, having the form $$D^{(m)}(\omega) = \frac{1}{(2\pi)^{m-1}} \int_{-\infty}^{\infty} d\omega_1 \ldots \int_{-\infty}^{\infty} d\omega_{m-1} \varepsilon^{(m)}(-i\omega_1, \ldots, -i\omega_m) E(\omega_1) \ldots E(\omega_m)$$

$$\omega = \omega_1 + \ldots + \omega_m$$

In which we have m−1 integrations, one less than in the VFS form. Consequently, the left and right sides of the Fourier transform are functions of $\omega$, $\omega_m$, respectively. The additional constraint $\omega = \omega_1 + \ldots + \omega_m$ completes the equation and renders it self-consistent.

See, Volterra Series References, infra.

An alternate analysis of the VFS is as follows. Let x[n] and y[n] represent the input and output signals, respectively, of a discrete-time and causal nonlinear system. The Volterra series expansion for y[n] using x[n] is given by:

$$y[n] = h_0 + \sum_{m_1=0}^{\infty} h_1[m_1]x[n-m_1] +$$

$$\sum_{m_1=0}^{\infty}\sum_{m_2=0}^{\infty} h_2[m_1, m_2]x[n-m_1]x[n-m_2] + \ldots + \sum_{m_1=0}^{\infty}\sum_{m_2=0}^{\infty} \ldots$$

$$\sum_{m_p=0}^{\infty} h_p[m_1, m_2, \ldots, m_p]x[n-m_1]x[n-m_2]\ldots x[n-m_p] + \ldots)$$

$h_p[m_1, m_2, \ldots, m_p]$ is known as the p—the order Volterra kernel of the system. Without any loss of generality, one can assume that the Volterra kernels are symmetric, i.e., $h_p[m_1, m_2, \ldots, m_p]$ is left unchanged for any of the possible p! Permutations of the indices $m_1, m_2, \ldots m_p$. One can think of the Volterra series expansion as a Taylor series expansion with memory. The limitations of the Volterra series expansion are similar to those of the Taylor series expansion, and both expansions do not do well when there are discontinuities in the system description. Volterra series expansion exists for systems involving such type of nonlinearity. Even though clearly not applicable in all situations, Volterra system models have been successfully employed in a wide variety of applications.

Among the early works on nonlinear system analysis is a very important contribution by Wiener. His analysis technique involved white Gaussian input signals and used "G-functionals" to characterize nonlinear system behavior. Following his work, several researchers employed Volterra series expansion and related representations for estimation and time-invariant or time variant nonlinear system identification. Since an infinite series expansion is not useful in filtering applications, one must work with truncated Volterra series expansions.

The discrete time impulse response of a first order (linear) system with memory span is aggregate of all the N most recent inputs and their nonlinear combinations into one expanded input vector as $$X_e(n) = [x(n), x(n-1), \ldots, x(n-N+1), x^2(n)x(n)x(n-1), \ldots, x^Q(n-N+1)]^T$$

Similarly, the expanded filter coefficients vector H(n) is given by $$H(n) = [h_1(0), h_1(1), \ldots, h_1(N-1), h_2(0,0), h_2(0,1), \ldots h_Q(N-1, \ldots, N-1)]^T$$

The Volterra Filter input and output can be compactly rewritten as $$y(n) = H^T(n)X_e(n)$$

The error signal e(n) is formed by subtracting y(n) from the noisy desired response d(n), i.e., $$e(n) = d(n) - y(n) = d(n) - H^T(n)X_e(n)$$

For the LMS algorithm, this may be minimized to $$E[e^2(n)] = E[d(n) - H^T(n)X_e(n)]$$

The LMS update equation for a first order filter is $$H(n+1) = H(n) + \mu|e(n)|X_e(n)$$

where μ is small positive constant (referred to as the step size) that determines the speed of convergence and also affects the final error of the filter output. The extension of the LMS algorithm to higher order (nonlinear) Volterra filters involves a few simple changes. Firstly, the vector of the impulse response coefficients becomes the vector of Volterra kernels coefficients. Also, the input vector, which for the linear case contained only a linear combination, for nonlinear time varying Volterra filters, complicates treatment.

The RLS (recursive least squares) algorithm is another algorithm for determining the coefficients of an adaptive filter. In contrast to the LMS algorithm, the RLS algorithm uses information from all past input samples (and not only from the current tap-input samples) to estimate the (inverse of the) autocorrelation matrix of the input vector.

To decrease the influence of input samples from the far past, a weighting factor for the influence of each sample is used. The Volterra filter of a fixed order and a fixed memory adapts to the unknown nonlinear system using one of the various adaptive algorithms. The use of adaptive techniques for Volterra kernel estimation has been well studied. Most of the previous research considers 2nd order Volterra filters and some consider the 3rd order case.

A simple and commonly used algorithm is based on the LMS adaptation criterion. Adaptive Volterra filters based on the LMS adaptation algorithm are computational simple but suffer from slow and input signal dependent convergence behavior and hence are not useful in many applications. As in the linear case, the adaptive nonlinear system minimizes the following cost function at each time:

$$J[n] = \sum_{k=0}^{n} \lambda^{n-k}(d[k] - H^T[n]X[k])^2$$

where, H(n) and X(n) are the coefficients and the input signal vectors, respectively, λ is a factor that controls the memory span of the adaptive filter and d(k) represents the desired output. The solution can be obtained by differentiating J[n] with respect to H[n], setting the derivative to zero, and solving for H[n]. The optimal solution at time n is given by $$H[n] = C^{-1}[n]P[n] \text{ where,}$$

$$C[n] = \sum_{k=0}^{n} \lambda^{n-k} X[k] X^T[k] \text{ and } P[n] = \sum_{k=0}^{n} \lambda^{n-k} d[k] X[k]$$

H[n] can be recursively updated by realizing that $$C[n]=\lambda C[n-1]+X[n]X^T[n] \text{ and } P[n]=\lambda P[n-1]+d[n]X[n]$$

The computational complexity may be simplified by making use of the matrix inversion lemma for inverting C[n]. The derivation is similar to that for the RLS linear adaptive filter.

$$C^{-1}[n]=\lambda^{-1}C^{-1}[n-1]-\lambda^{-1}k[n]X^T[n]C^{-1}[n-1]$$

There are a few simple models for basic amplifier non-linear behavior. A more rigorous model could include the Volterra series expansion which can model complex non-linearities such as memory effects. Among the simpler models are the Rapp model, Saleh model and the Ghorbani model. Combinations of pure polynomial models and filter models are also often referred to as fairly simple models, e.g., the Hammerstein model.

The advantage of the simpler models is usually in connection to for a need of very few parameters to model the non-linear behavior. The drawback is that such a model only can be used in conjunction with simple architecture amplifiers such as the basic Class A, AB and C amplifiers. Amplifiers such as the high efficiency Doherty amplifier can in general not be modelled by one of these simple models. In addition, to properly capture the PA behavior for the envisaged large NR bandwidths, it is essential to use PA models capturing the memory effects. Such models would require an extensive set of empirical measurements for proper parameterization.

The Rapp model has basically two parameters by which the general envelop distortion may be described. It mimics the general saturation behavior of an amplifier and lets the designer set a smoothness of the transition by a P-factor. By extending this also to model phase distortion, one has in total six parameters available. The basic simple model may be found as:

$$V_{out} = \frac{V_{in}}{\left(1 + \left(\frac{|V_{in}|}{V_{sat}}\right)^{2P}\right)^{\frac{1}{2P}}}$$

This model produces a smooth transition for the envelope characteristic as the input amplitude approaches saturation. In the more general model, both AM-AM and AM-PM distortion can be modelled. In general terms, the model describes the saturation behavior of a radio amplifier in a good way.

$$F_{AM-AM} = \frac{Gx}{\left(1 + \left|\frac{Gx}{V_{sat}}\right|^{2P}\right)^{\frac{1}{2P}}}$$

$$F_{AM-PM} = \frac{Ax^q}{1 + \left(\frac{x}{B}\right)^q}$$

where "x" is the envelope of the complex input signal. If signal measurements are at hand of the input/output relationship, the parameters of the model may be readily found for a particular amplifier by for example regression techniques. The strength of the Rapp model is lies in its simple and compact formulation, and that it gives an estimation of the saturation characteristics of an amplifier. The drawback of this simple model is of course that it cannot model higher order classes of amplifiers such as the Doherty amplifier. It also lacks the ability to model memory effects of an amplifier.

The Saleh model is a similar model to the Rapp model. It also gives an approximation to the AM-AM and AM-PM characteristics of an amplifier. It offers a slightly fewer number of parameters (4) that one can use to mimic the input/output relationship of the amplifier. The AM-AM distortion relation and AM-PM distortion relation are found to be as:

$$g(r)_{AM-AM} = \frac{\alpha_a r}{1 + \beta_a r^2}$$

$$f(r)_{AM-PM} = \frac{\alpha_\varphi r^2}{1 + \beta_\varphi r^2}$$

where "r" is the envelope of the complex signal fed into the amplifier, and $\alpha/\beta$ are real-valued parameters that can be used to tune the model to fit a particular amplifier.

The Ghorbani model also gives expressions similar to the Saleh model, where AM-AM and AM-PM distortion is modeled. Following Ghorbani, the expressions are symmetrically presented:

$$g(r) = \frac{x_1 r^{x_2}}{1 + x_3 r^{x_2}} + x_4 r$$

$$f(r) = \frac{y_1 r^{y_2}}{1 + y_3 r^{y_2}} + y_4 r$$

In the expressions above, g(r) corresponds to AM-AM distortion, while $f(r)$ corresponds to AM-PM distortion. The actual scalars $x_{1-4}$ and $y_{1-4}$ have to be extracted from measurements by curve fitting or some sort of regression analysis.

The next step in the more complex description of the non-linear behavior of an amplifier is to view the characterization as being subject to a simple polynomial expansion. This model has the advantage that it is mathematically pleasing in that it for each coefficient reflects higher order of inter-modulations. Not only can it model third order intermodulation, but also fifth/seventh/ninth etc. Mathematically it can also model the even order intermodulation products as well, it merely is a matter of discussion whether these actually occur in a real RF application or not.

$$y(t) = a_0 + a_1 x(t) + a_2 x(t)^2 + a_3 x(t)^3 + a_4 x(t)^4 \ldots A_{IP3} = \sqrt{4a_1/3|a_3|}$$

Coefficients may be readily expressed in terms of Third Order Intercept point IP3 and gain, as described above. This feature makes this model especially suitable in low level signal simulations, since it relates to quantities that usually are readily available and easily understood amongst RF engineers.

The Hammerstein model consists of a combination of a Linear+Non-Linear block that is capable of mimicking a limited set of a Volterra Series. As the general Volterra series models a nested series of memory and polynomial representations, the Hammerstein model separates these two defining blocks that can in theory be separately identified with limited effort. The linear part is often modelled as a linear filter in the form of a FIR-filter.

$$s(n) = \sum_{k=0}^{K-1} h(k)x(n-k)$$

The non-linear part is then on the other hand simply modelled as polynomial in the enveloped domain.

$$y(t) = a_0 + a_1 x(t) + a_2 x(t)^2 + a_3 x(t)^3 + a_4 x(t)^4 \ldots$$

The advantage of using a Hammerstein model in favor of the simpler models like Rapp/Saleh or Ghorbani is that it can in a fairly simple way also model memory effects to a certain degree. Although, the model does not benefit from a clear relationship to for example IIP3/Gain but one has to employ some sort of regression technique to derive polynomial coefficients and FIR filter tap coefficients.

The Wiener model describes like the Hammerstein model a combination of Non-linear+Linear parts that are cascaded after each other. The difference to the Hammerstein model lies in the reverse order of non-linear to linear blocks. The initial non-linear block is preferably modelled as a polynomial in the envelope of the complex input signal. This block is the last one in the Hammerstein model as described above. The polynomial coefficients may themselves be complex, depending on what fits measured data best. See expressions for non-linear and linear parts under the Hammerstein section. The second block which is linear may be modelled as an FIR filter with a number of taps that describes the memory depth of the amplifier.

The state-of-the-art approaches consider the so called Volterra series, and is able to model all weak non-linearity with fading memory. Common models like, for example, the memory polynomial can also be seen as a subset of the full Volterra series and can be very flexible in designing the model by simply adding or subtracting kernels from the full series.

The discrete-time Volterra series, limited to causal systems with symmetrical kernels (which is most commonly used for power amplifier modelling) is written as $$y[n] = \beta_0 + \sum_{p=1}^{P} \sum_{\tau_1=0}^{M} \sum_{\tau_2=\tau_1}^{M} \ldots \sum_{\tau_p=\tau_{p-1}}^{M} \beta_{p,\tau_1,\tau_2,\ldots\tau_p} \prod_{j_1=1}^{p} x[n-\tau_{j_1}] \prod_{j_2=p+1}^{2p-1} \bar{x}[n-\tau_{j_2}]$$

in which P is the non-linear order and M is the memory-depth. There are benefits which the Volterra series hold over other modelling approaches, including:

It is linear in parameters, meaning that the optimal parameters may be found through simple linear regression analysis from measured data. It further captures frequency dependencies through the inclusion of memory effects which is a necessity for wideband communication.

The set of kernels, or basis functions, best suited for modelling a particular power amplifier may be selected using methods which rely on physical insight. This makes the model scalable for any device technology and amplifier operation class.

It can be extended into a multivariate series expansion in order to include the effects of mutual coupling through antenna arrays. This enables the studies on more advanced algorithms for distortion mitigation and precoding.

It may be observed that other models such as static polynomials, memory polynomials and combinations of the Wiener and Hammerstein models are all subsets of the full Volterra description. As previously stated, empirical measurements are needed to parameterized PA model based on Volterra series expansion.

A subset of the Volterra Series is the memory polynomial with polynomial representations in several delay levels. This is a simpler form of the general Volterra series. The advantage of this amplifier model is its simple form still taking account of memory effects. The disadvantage is that the parameters have to be empirically solved for the specific amplifier in use.

$$PA_{memory} = x(t) \cdot [a_0 + a_1 \cdot |x(t)| + a_2 \cdot |x(t)|^2 + \ldots] +$$
$$+ x(t-t_0) \cdot [b_0 + b_1 \cdot |x(t-t_0)| + b_2 \cdot |x(t-t_0)|^2 + \ldots] +$$
$$+ x(t-t_1) \cdot [c_0 + c_1 \cdot |x(t-t_1)| + c_2 \cdot |x(t-t_1)|^2 + \ldots] + \ldots$$

The equation above shows an expression for a memory polynomial representation of an amplifier involving two memory depth layers. Each delayed version of the signal is associated with its own polynomial expressing the non-linear behavior.

See Filter References, infra.

The purpose of a PA behavioral model is to describe the input-to-output relationship as accurately as possible. State-of-the-art approaches lean on a fundament of the so called Volterra series consisting of a sum of multidimensional convolutions. Volterra series are able to model all weak nonlinearities with fading memory and thus are feasible to model conventional PAs aimed for linear modulation schemes.

The GMP model is given by $$y_{GMP}(n) = \sum_{k \in K_a} \sum_{l \in L_a} a_{kl} x(n-l) |x(n-l)|^{2k} + \sum_{k \in K_b} \sum_{l \in L_b} \sum_{m \in M} b_{klm} x(n-l) |x(n-l-m)|^{2k}$$

where $y_{GMP}(n)$ and $x(n)$ represent the complex baseband equivalent output and input, respectively, of the model. The first term represents the double sum of so-called diagonal terms where the input signal at time shift l, $x(n-l)$; $l \in L_a$, is multiplied by different orders of the time aligned input signal envelope $|x(n-l)|^{2k}$; $k \in K_a$. The triple sum represents cross terms, i.e. the input signal at each time shifts is multiplied by different orders of the input signal envelope at different time shifts. The GMP is linear in the coefficients, $a_{kl}$ and $b_{klm}$, which provides robust estimation based on input and output signal waveforms of the PAs to be characterized. As a complement to the above, also memoryless polynomial models have been derived based on:

$$y_P(n) = \sum_{k \in K_p} a_k x(n) |x(n)|^{2k}$$

It is thus seen that, while the Volterra series has been considered generally in a variety of contexts, and for power amplifier linearization, the particular implementation does not necessarily follow from broad prescriptions.

See, Volterra Series Patents, infra.

SUMMARY OF THE INVENTION

A deep neural network (DNN)-based equalizer is provided to equalize the PA distorted signals at a radio frequency receiver. This DNN equalizer exploits both the Volterra series nonlinearity modeling of PAs, to construct the input features of the DNN, which can help the DNN converge rapidly to the desired nonlinear response under limited training data and training.

Conventionally, Volterra series and neural networks are studied as two separate techniques for nonlinear PAs [2]. Volterra series has been a popular choice for constructing the models of nonlinear power amplifiers. Many digital predistorters or nonlinear equalizers have been developed based on such modeling. Similarly, artificial neural networks have also been applied to model or equalizer the nonlinear PAs. By integrating these two techniques together, equalizers may be more efficient and have low-cost implementation than conventional digital pre-distorters, and have high performance in mitigating power amplifier with even severe nonlinearity.

In particular, conventional shallow feedforward neural networks using time-delayed inputs have only limited performance. The present DNN equalizer has much superior performance and does not need too much training data.

Nonlinear Power Amplifier Models

The nonlinear response of the power amplifiers are usually described by the baseband discrete model $y(n)=f(x(n))$, where $x(n)$ is the input signal and $y(n)$ is the output signal. The function $f(x(n))$ is some nonlinear function.

Consider the baseband discrete model of the PA $y(n)=f(x(n), x(n-1), \ldots)$, where $x(n)$ is the input signal, $y(n)$ is the output signal, and $f(\cdot)$ is some nonlinear function. The simplest nonlinear PA model is the "AM-AM AM-PM" model. Let the amplitude of the input signal be $V_x = E[|x(n)|]$, where $E[\cdot]$ denotes short-term expectation or average. The output sample $y(n)$'s amplitude $V_y = E[y(n)]$ and additional phase change $\psi_y = E[/y(n)]$ depend on $V_x$ in nonlinear ways as $$V_y = \frac{gV_x}{\left(1+\frac{gV_x}{c}\right)^{\frac{1}{2\sigma}}}, \quad (1)$$

$$V_y = \frac{\alpha V_x^p}{\left(1+\frac{V_x}{\beta}\right)^q}$$

where g is the linear gain, σ the smoothness factor, and c denotes the saturation magnitude of the PA. Typical examples of these parameters are g=4:65, σ=0:81, c=0:58, α=2560, β=0:114, p=2:4, and q=2:3, which are used in the PA models regulated by IEEE 803.11ad task group (TG) [10].

More accurate models should take into consideration the fact that nonlinearity leads to memory effects. In this case, Volterra series are typically used to model PAs [4] [21]. A general model is [5]

$$y(n) = \sum_{d=0}^{D} \sum_{k=1}^{P} b_{kd} x(n-d) |x(n-d)|^{k-1} \quad (2)$$

with up to $P^{th}$ order nonlinearity and up to D step memory.

Because higher order nonlinearity usually has smaller magnitudes, in order to simplify models, many papers have considered smaller P only, e.g., $$y(n) = \sum_{d=0}^{D} (\beta_D x(n-d) + \alpha_d x(n-d)|x(n-d)|^2)$$

with only the third-order nonlinearity. It can be shown that only odd-order nonlinearity (i.e., odd k) is necessary as even-order nonlinearity disappears during spectrum analysis.

It can be shown that only odd-order nonlinearity (i.e., odd k) is necessary because even-order nonlinearity falls outside of the passband and will be filtered out by the receiver bandpass filters [2]. To illustrate this phenomenon, we can consider some simple examples where the input signal $x(n)$ consists of a few single frequency components only. Omitting the memory effects, if $x(n)$ is a single frequency signal, i.e., $x(n)=V_0 \cos(a_0+\phi)$, where $a_0=2\pi f_0 n$. Then, the output signal can be written as $$y(n)=c_1 V_0 \cos(a_0+\phi+\psi_1)+(\tfrac{3}{4}c_3 V_0^3+\tfrac{5}{8}c_5 V_0^5)\cos(a_0+\phi+\psi_3+\psi_5) \quad (3)$$

$$+\tfrac{1}{2}c_2 V_0^2+\tfrac{3}{8}c_4 V_0^4 \quad (4)$$

$$+(\tfrac{1}{2}c_2 V_0^2+\tfrac{1}{2}c_4 V_0^4(\cos(2a_0+2\phi+2\psi_2+2\psi_4)) \quad (5)$$

where the first line (3) is the inband response with AM-AM & AM-PM nonlinear effects, the second line (4) is the DC bias, and the third line (5) includes all the higher frequency harmonics. At the receiving side, we may just have (3) left because all the other items will be canceled by bandpass filtering.

If $x(n)$ consists of two frequencies, i.e., $x(n)=V_1 \cos(a_1+\phi_1)+V_2 \cos(a_2+\phi_2)$, where $a_i=2\pi f_i n$, then the inband response includes many more items, such as the first order items $c_i V_i \cos(a_i+\phi_i+\psi_i)$, the third order items $c_3(V_i^3+V_i V_j^2) \cos(a^i+\phi_i+\psi_i)$, the fifth order items $c_5(V_i^5+V_i V_j^4+V_i V_j^2)\cos(a_i+\phi_i+\psi_i)$, for $i,j \in \{1,2\}$. There are also intermodulation items that consist of $na_i \pm ma_j$ as long as they are within the passband of the bandpass filter, such as $(V_i^2 V_j+V_i^2 V_j^3+V_1^4 V_j)\cos(2a_i-a_j+2\phi_i-\phi_j+2\psi_i-\psi_j)$.

There are many other higher order items with frequencies $na_i$, $n(a_i \pm a_j)$, or $na_i+ma_j$, that cannot pass the passband filter. One of the important observations is that the contents that can pass the passband filter consist of odd-order nonlinearity only.

If $x(n)$ consists of three or more frequencies, we can have similar observations, albeit the expressions are more complex. Let the input signal $x(n)$ be $$x(n) = \sum_{i=1}^{3} V_i \cos(a_i), \quad (6)$$

$$a_i = 2\pi f_i n$$

Based on [22], the nonlinear distorted output response $y(n)=f(x(n))$ can be written as $$y(n) = \sum_{i=1}^{\infty} k_i x_i(n) \quad (7)$$

where $k_i$ represents the gain coefficients for the $i^{th}$ order components. The 1st order component is simply $k_1 x(n)$. The 2nd order component includes the DC component, the sum/difference of beat components, and the second-order harmonic components. Specifically, $$k_2 x^2(n) = g_{2,0} + g_{2,1}(n) + g_{2,2}(n), \quad (8)$$

where $$g_{2,0} = \sum_{i=1}^{3} V_i^2 / 2(n)$$

$$g_{2,1} = \sum_{i=1}^{3}\sum_{j \neq i} V_i V_j \cos(a_i \pm a_j)$$

$$g_{2,2} = \sum_{i=1}^{3} V_i^2 \cos(2a_i)/2.$$

The 3rd order component includes the third-order harmonic components $g_{3,1}(n)$, the third intermodulation beat components $g_{3,2}(n)$, the triple beat components $g_{3,3}(n)$, the self-compression/expansion components $g_{3,4}(n)$, and the cross-compression/expansion components $g_{3,5}(n)$. This gives $$k_3 x^3(n) = \sum_{i=1}^{5} g_{3,i}(n)$$

Where $$g_{3,1}(n) = \frac{1}{4}\sum_{i=1}^{3} A_i^3 \cos(3a_i)/4$$

$$g_{3,2}(n) = \frac{3}{4}\sum_{i=1}^{3}\sum_{j \neq i} A_i^2 A_j \cos(2a_i \pm 2a_j)$$

$$g_{3,3}(n) = \frac{3}{2}\left(\prod_{i=1}^{3} A_i\right)\cos\left(\sum_{i=1}^{3}(\pm a_i)\right)$$

$$g_{3,4}(n) = \frac{3}{4}\sum_{i=1}^{3} A_i^3 \cos(a_i)$$

$$g_{3,5}(n) = \frac{3}{2}\sum_{i=1}^{3}\sum_{j \neq i} A_i A_j^2 \cos(a_i)$$

The 4th order component includes the DC components $g_{4,0}$, the fourth-order harmonic components $g_{4,1}(n)$, the fourth intermodulation beat components $g_{4,2}(n)$, the sum/difference beat components $g_{4,3}(n)$, the second harmonic components $g_{4,5}(n)$. This gives $$k_4 x^4(n) = \sum_{i=0}^{5} g_{4,i}(n)$$

where $$g_{4,0} = \frac{3}{8}\sum_{i=1}^{3} A_i^4 + \frac{3}{4}\sum_{i=1}^{3}\sum_{j \neq i} A_i^2 A_j^2$$

$$g_{4,1} = \frac{1}{8}\sum_{i=1}^{3} A_i^4 \cos(4a_i)$$

$$g_{4,2} = \frac{4}{8}\sum_{i=1}^{3}\sum_{j \neq i} A_i^3 A_j \cos(3a_i \pm a_j) + \frac{12}{8}\sum_{i=1}^{3} A_i^2 \left(\prod_{j \neq i} A_j\right)\cos\left(2a_i \sum_{j \neq i}(\pm a_j)\right)$$

-continued $$g_{4,3} = \frac{6}{4}$$

$$\sum_{i=1}^{3}\cos(a_i \pm a_{\text{mod}(i+1,3)})\left(A_i^2 A_{\text{mod}(i+1,3)}^2 + A_i A_{\text{mod}(i+1,3)}^3 + A_i^3 A_{\text{mod}(i+1,3)} + \prod_{j=1}^{3} A_j\right)$$

$$g_{4,4} = \frac{3}{2}\sum_{i=1}^{3}\cos(2a_i)\left(A_i^2 \sum_{j=1}^{3} A_j^2\right)$$

The 5th order component includes the fifth-order harmonic components $g_{5,1}(n)$, the fifth intermodulation beat components $g_{5,2}(n)$, the self-compression/expansion components $g_{5,3}(n)$, the cross-compression/expansion components $g_{5,4}(n)$, the third harmonic components $g_{5,5}(n)$, the third intermodulation beat components $g_{5,6}(n)$, and the triple beat components $g_{5,7}(n)$. This gives $$k_5 x^5(n) = \sum_{i=1}^{5} g_{5,i}(n)$$

Where $$g_{5,1}(n) = \frac{1}{5}\sum_{i=1}^{3} A_i^5 \cos(5a_i)$$

$$g_{5,2}(n) = \frac{5}{8}\sum_{i=1}^{3}\sum_{j \neq i} A_i A_j^4 \cos(a_i \pm 4a_j) +$$

$$A_i^2 A_j^3 \cos(2a_i \pm 3a_j) + A_i^3 A_j^2 \cos(3a_i \pm 2a_j) + A_i^4 A_j \cos(4a_i \pm a_j)$$

$$g_{5,3}(n) = \frac{5}{8}\sum_{i=1}^{3} A_i^5 \cos(a_i)$$

$$g_{5,4}(n) = \frac{15}{4}\sum_{i=1}^{3}\cos(a_i)\left(\sum_{j \neq i}(A_i^3 A_j^2 + A_i A_j^4) + A_i \prod_{j \neq i} A_j^2\right)$$

$$g_{5,5}(n) = \frac{5}{4}\sum_{i=1}^{3}\cos(3a_i)\left(A_i^3 \sum_{j=1}^{3} A_j^2\right)$$

$$g_{5,6}(n) = \frac{15}{4}\sum_{i=1}^{3}\sum_{j \neq i}\cos(2a_i \pm a_j) \times \left(A_i^3 A_j^2 + A_i^4 A_j + A_i^2 A_j \prod_{k \neq i,j} A_k^2\right)$$

$$g_{5,7}(n) = \frac{15}{8}\cos\left(\sum_{i=1}^{3}(\pm a_i)\right)\left(\sum_{i=1}^{3} A_i \prod_{j \neq i} A_j^2 + \sum_{i=1}^{3} A_i^3 \prod_{j \neq i} A_j\right)$$

These nonlinear spectrum growth expressions can be similarly applied if the signal x(n) is the QAM or OFDM signal. Especially, the harmonics provides us a way to design the input signal vectors for DNN equalizers. Note that some of the spectrums that are deviated too much from the transmitted signal bandwidth will be attenuated by the receiver bandpass filters.

DNN-Based Nonlinear Equalization

A. Nonlinear Equalizer Models

To mitigate the PA nonlinear distortions, nonlinear equalizers can be applied at the receivers. Obviously, the Volterra series model can still be used to analyze the response of nonlinear equalizers. One of the differences from (2) is that the even order nonlinearity may still be included and may increase the nonlinear mitigation effects [5].

Consider the system block diagram of nonlinear equalization shown in FIG. 1, which shows a signal x(n) entering a nonlinear power amplifier, to produce a distorted signal y(n), which passes through a channel $h_\ell$, which produces a response r(n), which is fed to a neural network equalizer to produce a corrected output z(n).

Let the received signal be $$r(n) = \sum_{\ell=0}^{L} h_\ell y(n-\ell) + v(n), \qquad (9)$$

where $h_\ell$ is the finite-impulse response (FIR) channel coefficients and v(n) is additive white Gaussian noise (AWGN). With the received sample sequence r(n), a nonlinear equalizer will generate z(n) as the estimated symbols.

If the PA has only slight nonlinearity as modeled by the simple "AM-AM AM-PM" model (1), the received samples r(n) may be stacked together into M+1 dimensional vectors r(n)=[r(n), ..., r(n−M)]$^T$, where $(\cdot)^T$ denotes transpose, and write the received samples in vector form as $$r(n) = HG(n)x(n) + v(n) \qquad (10)$$

where H is an (M+1)×(M+L+1) dimensional channel matrix $$H = \begin{bmatrix} h_o & \cdots & h_L & & \\ & \ddots & & \ddots & \\ & & h_o & \cdots & h_L \end{bmatrix} \qquad (11)$$

and $$G(n) = \text{diag}\{V_{y(n)}e^{j\psi_{y(n)}}, \ldots, V_{n(y-M-L)}e^{j\psi_{y(n-M-L)}}\}$$

is an (M+L+1)×(M+L+1) dimensional diagonal matrix which consists of the nonlinear PA responses, x(n)=[x(n), ..., x(n−M−L)]$^T$, and v(n)=[v(n), ..., v(n−M)]$^T$. To equalize the received signal, we apply a nonlinear equalizer with the form $$f^T = G'(n)[f_0, \ldots, f_M] \qquad (12)$$

where $[f_0, \ldots, f_M]H \approx [0, \ldots, 1, \ldots, 0]$ is to equalize the propagation channel, and $$G'(n) \approx \frac{1}{V_{y(n-d)}} e^{-j\psi_{y(n-d)}}$$

is to equalize the nonlinear PA response. Let $\hat{r}(n)$ be the output of the first linear equalization step. The second nonlinear equalization step can be implemented as a maximum likelihood estimation problem, i.e., $z(n) = \arg\min_{\forall x(n)} |\hat{r}(n) - V_y e^{j\psi_y} x(n)|^2$. This gives the output $$z(n) = f^T r(n) \approx x(n-d) \qquad (13)$$

with certain equalization delay d.

Both the channel coefficients $h_\ell$ and the nonlinear PA responses $V_y$, $\psi_y$ can be estimated via training, as can the channel equalizer $f^T$. Because the PA nonlinearity is significant for large signal amplitude only, we can apply small-amplitude training signals x(n) first to estimate the channel $h_\ell$ and the channel equalizer $[f_0, \ldots, f_M]$. We can then remove the channel H from (10) with the first step linear channel equalization. Because the matrix G(n) is diagonal, we can easily estimate G(n) with regular training and then estimate the transmitted symbols as outlined in (13).

For more complex nonlinear PA responses, such as (2), we can conduct channel equalization similarly as (12). First, we can still apply small-amplitude training signals to estimate $[f_0, \ldots, f_M]$ so as to equalize the channel $h_\ell$. This linear channel equalization step gives $\hat{r}(n) \approx y(n)$. We can then focus on studying the equalization of nonlinear distortion of the PA, which can in general be conducted with the maximum likelihood method, $$\{\hat{x}(n): n = 0, \ldots, N\} = \arg\min_{\{x(n)\}} \sum_{n=0}^{N} |\hat{r}(n) - \hat{y}(n)|^2, \qquad (14)$$

where $\hat{r}(n)$ is the sequence after the linear channel equalization, $\hat{y}(n)$ is the sequence reconstructed by using the sequence x(n) and the nonlinear PA response parameters $b_{kd}$ based on (2), and N is the total number of symbols. The optimization problem (14) can be solved with the Viterbi sequence estimation algorithm if the memory length of the PA is small enough and the PA nonlinear response is known to the receiver.

In case the PA nonlinear response cannot be estimated, the equalization of nonlinear PA response is challenging. In this case, one of the ways is to use the conventional Volterra series equalizer, which approximates G'(n) with a Volterra series model. Similar to (2), this gives $$z(n) = \sum_{d=0}^{D} \sum_{k=0}^{P} g_{kd} \hat{r}(n-d) |\hat{r}(n-d)|^{k-1}. \qquad (15)$$

The objective of the Volterra series equalizer design is to design $g_{kd}$ such that $z(n) \approx x(n-\ell)$ for some equalization delay $\ell$.

Similarly, as the DPD design of [5], based on the Volterra series model (15), we can estimate the coefficients $g_{kd}$ by casting the estimation into a least squares problem $$\min_{\{g_{kd}\}} \sum_{n=L}^{N} \left| x(n-L) - \sum_{d=0}^{D} \sum_{k=1}^{P} g_{kd} \hat{r}(n-d) |\hat{r}(n-d)|^{k-1} \right|^2, \qquad (16)$$

with training symbols x(n) and received samples $\hat{r}(n)$. Note that only the coefficients $g_{kd}$ are needed to be estimated, and these coefficients are linear with respect to $\hat{r}(n)$ and x(n).

Define the vector $a = [g_{00}, g_{01}, \ldots, g_{PD}]^T$, and the vector $x = [x(0); \ldots, x(N-L)]^T$. Define the (N−L+1)×DP data matrix $$B = \begin{bmatrix} \hat{r}(L) & \hat{r}(L)|\hat{r}(L)| & \cdots & \hat{r}(L-D)|\hat{r}(L-D)|^{P-1} \\ \vdots & & & \vdots \\ \hat{r}(N) & \hat{r}(N)|\hat{r}(N)| & \cdots & \hat{r}(N-D)|\hat{r}(N-D)|^{P-1} \end{bmatrix} \qquad (17)$$

Then, (16) becomes $$\min_a \|x - Ba\|^2 \qquad (18)$$

Solution to (18) is $$a = B^+ x \qquad (19),$$

where $B^+=(B^H B)^{-1} B$ is the pseudo-inverse of the matrix B. From (19), we can obtain the Volterra series equalizer coefficients $g_{kd}$. One of the major problems for the Volterra series equalizer is that it is hard to determine the order sizes, i.e., the values of D and P. Even for a nonlinear PA with slight nonlinear effects (i.e., small D and P in (2)), the length of D and P for Volterra series equalizer may be extremely long in order for (15) to have sufficient nonlinearity mitigation capability.

A potential way to resolve this problem is to apply artificial neural networks to fit the nonlinear equalizer response (15). Neural networks can fit arbitrary nonlinearity and can realize this with potentially small sizes. Nevertheless, in conventional neural network equalizers such as [14] [15], the input (features) to the neural networks was simply a time-delayed vector [r(n), . . . , r(n−M)]. Although neural networks may have the capability to learn the non-linear effects specified in (15), in practice the training may not necessarily converge to the desirable solutions due to local minimum and limited training data. In addition, conventional neural network equalizers were all feed-forward networks with fully connected layers only, which often suffer from problems like shallow network architecture and overfitting.

It is therefore an object to provide a radio receiver, comprising: an input configured to receive a transmitted radio frequency signal representing a set of symbols communicated through a communication channel; a Volterra series processor configured to decompose the transmitted radio frequency signal as a Volterra series expansion; an equalizer, comprising a deep neural network trained with respect to channel distortion, receiving the Volterra series expansion; and an output, configured to present data corresponding to a reduced distortion of the received distorted transmitted radio frequency signal.

It is also an object to provide a radio reception method, comprising: receiving a transmitted radio frequency signal representing a set of symbols communicated through a communication channel; decomposing the transmitted radio frequency signal as a Volterra series expansion; equalizing the Volterra series expansion with a deep neural network trained with respect to channel distortion, receiving the Volterra series expansion; and presenting data corresponding to a reduced distortion of the received transmitted radio frequency signal.

It is a further object to provide an equalization method for a radio signal, comprising: storing parameters for decomposition of a received radio frequency signal as a Volterra series expansion; processing the Volterra series expansion in a deep neural network comprising a plurality of neural network hidden layers and at least one fully connected neural network layer, trained with respect to radio frequency channel distortion; and presenting an output of the deep neural network. The method may further comprise demodulating the output of the deep neural network, wherein a bit error rate of the demodulator is reduced with respect to an input of the received radio frequency signal to the demodulator.

It is another object to provide an equalizer for a radio receiver, comprising: a memory configured to store parameters for decomposition of a received radio frequency signal as a Volterra series expansion; a deep neural network comprising a plurality of neural network hidden layers and at least one fully connected neural network layer, trained with respect to radio frequency channel distortion, receiving the Volterra series expansion of the received radio frequency signal; and an output configured to present an output of the deep neural network. The system may further comprise a demodulator, configured to demodulate the output, wherein a bit error rate of the demodulator is reduced with respect to an input of the received radio frequency signal to the demodulator.

The Volterra series expansion may comprise at least third or fifth order terms.

The deep neural network may comprise at least two or three convolutional network layers. The deep neural network may comprise at least three one-dimensional convolutional network layers. The convolutional layers may be hidden layers. The deep neural network may comprise at least three one-dimensional layers, each layer having at least 10 feature maps. The radio receiver may further comprise a fully connected layer subsequent to the at least three layers.

The distorted transmitted radio frequency signal comprises an orthogonal frequency multiplexed (OFDM) signal, a quadrature amplitude multiplexed (QAM) signal, a QAM-16 signal, a QAM-64 signal, a QAM-256 signal, a quadrature phase shift keying (QPSK) signal, a 3G signal, a 4G signal, a 5G signal, a WiFi (IEEE-802.11 standard family) signal, a Bluetooth signal, a cable broadcast signal, an optical transmission signal, a satellite radio signal, etc.

The radio receiver may further comprise a demodulator, configured to demodulate output as the set of symbols.

BRIEF DESCRIPTION OF THE DRAWINGS

FIG. 3A: received signal. FIG. 3B: Volterra equalizer output. FIG. 3C: time-delayed NN output. FIG. 3D: Volterra+NN output.

FIG. 4A: received signal. FIG. 4B: Volterra equalizer output. FIG. 4C: time-delayed NN output. FIG. 4D: Volterra+NN output.

FIG. 6: shows a table comparing MSE/SER improvement in percentage for the three equalization methods.

DETAILED DESCRIPTION OF THE PREFERRED EMBODIMENTS

Volterra-Based DNN Equalizer

Figure 1:
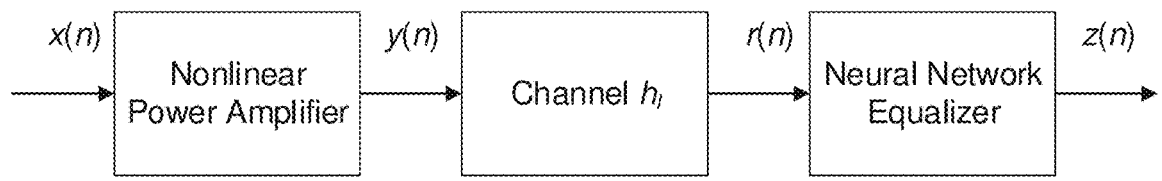
FIG. 1 shows a system block diagram with nonlinear power amplifier and deep neural network equalizer.
Figure 2:
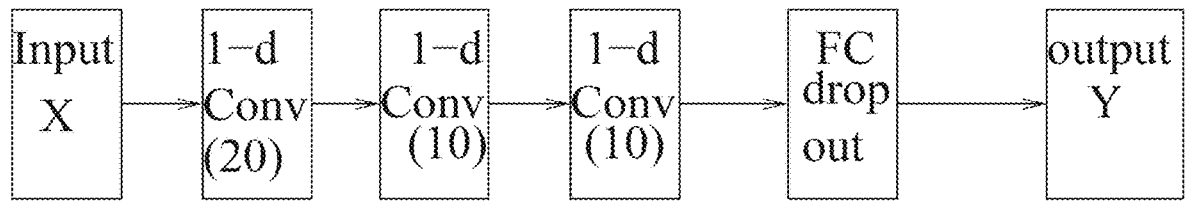
FIG. 2 shows a block diagram of DNN equalizer.
Figure 3A:
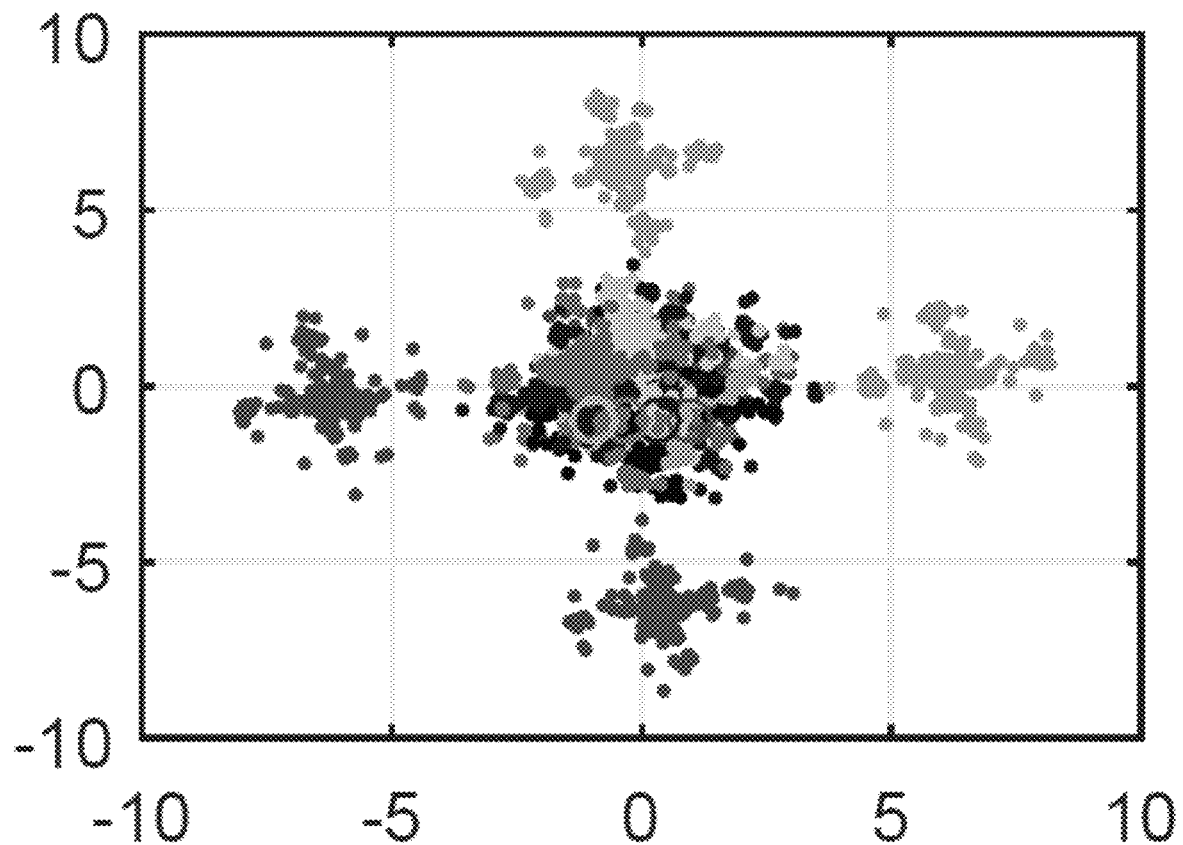
FIGS. 3A-3D show constellations of 16 QAM over a simulated PA.
Figure 3B:
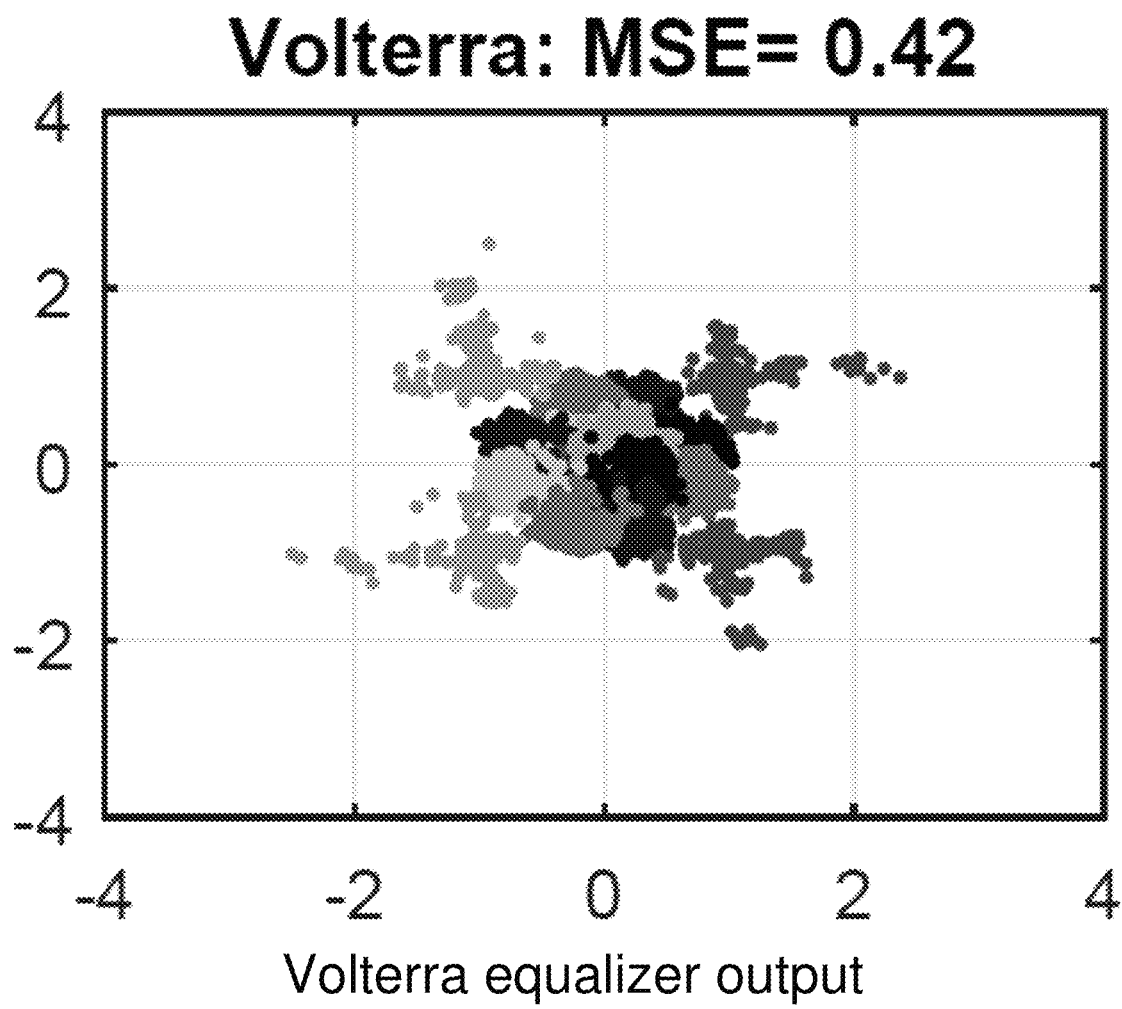
Figure 3C:
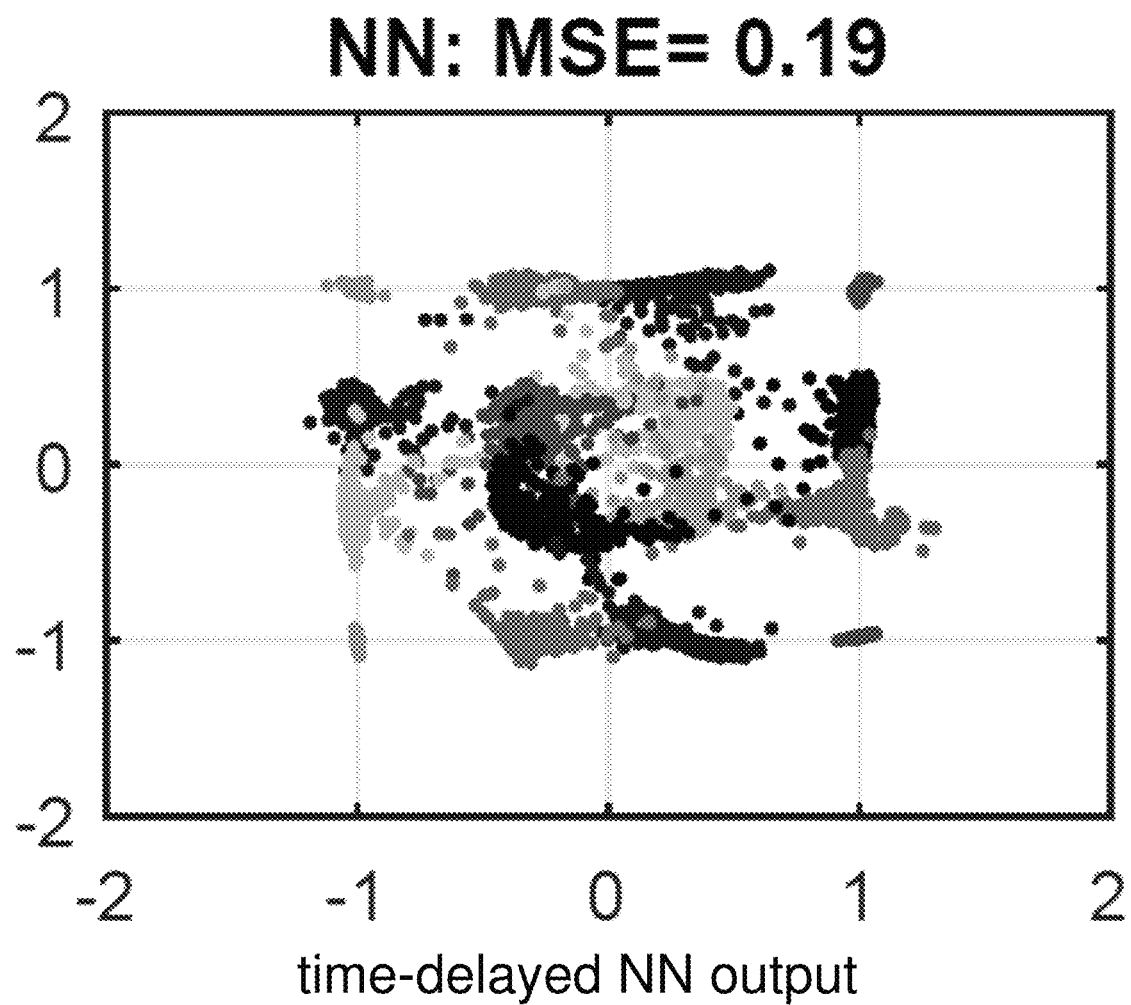
Figure 3D:
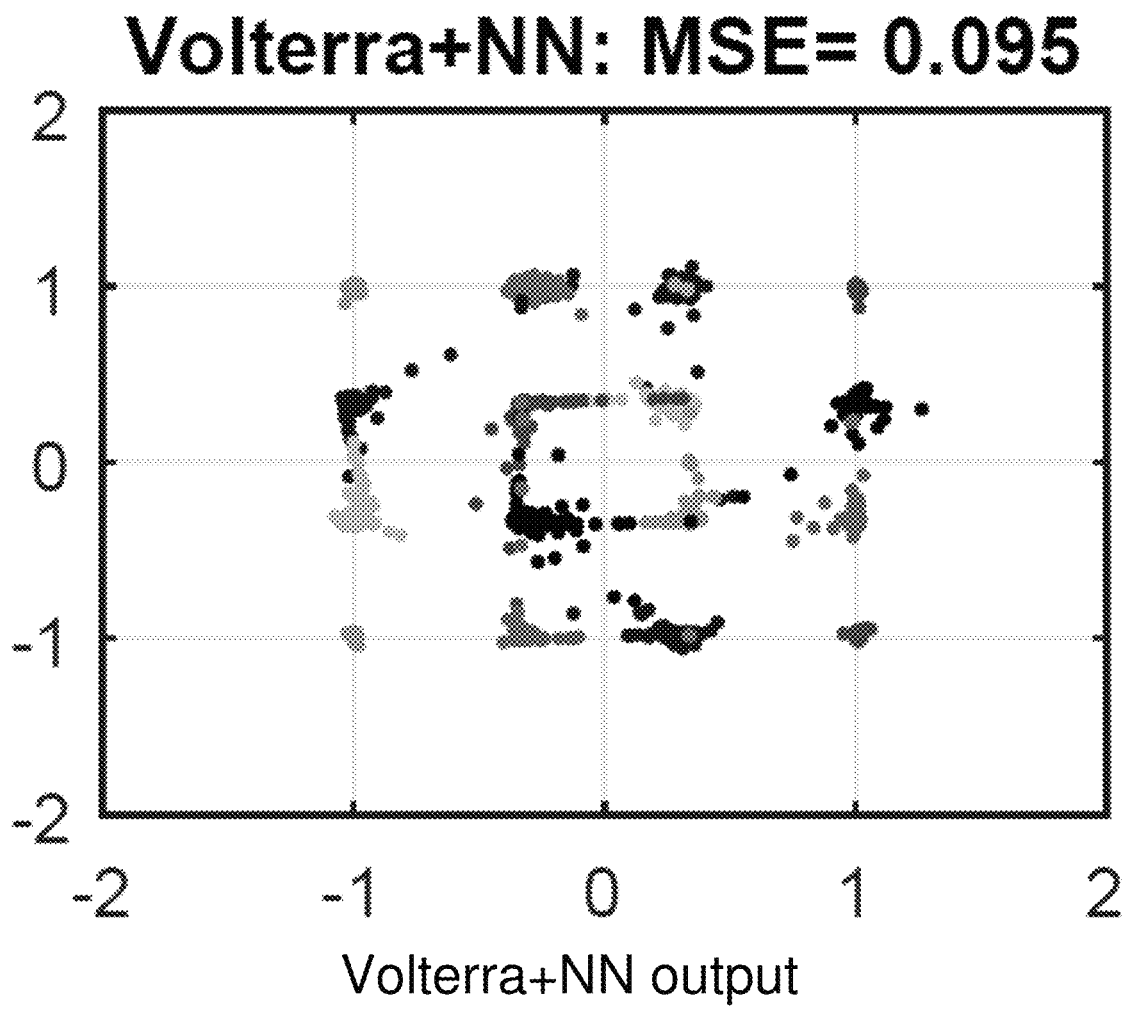
Figure 4A:
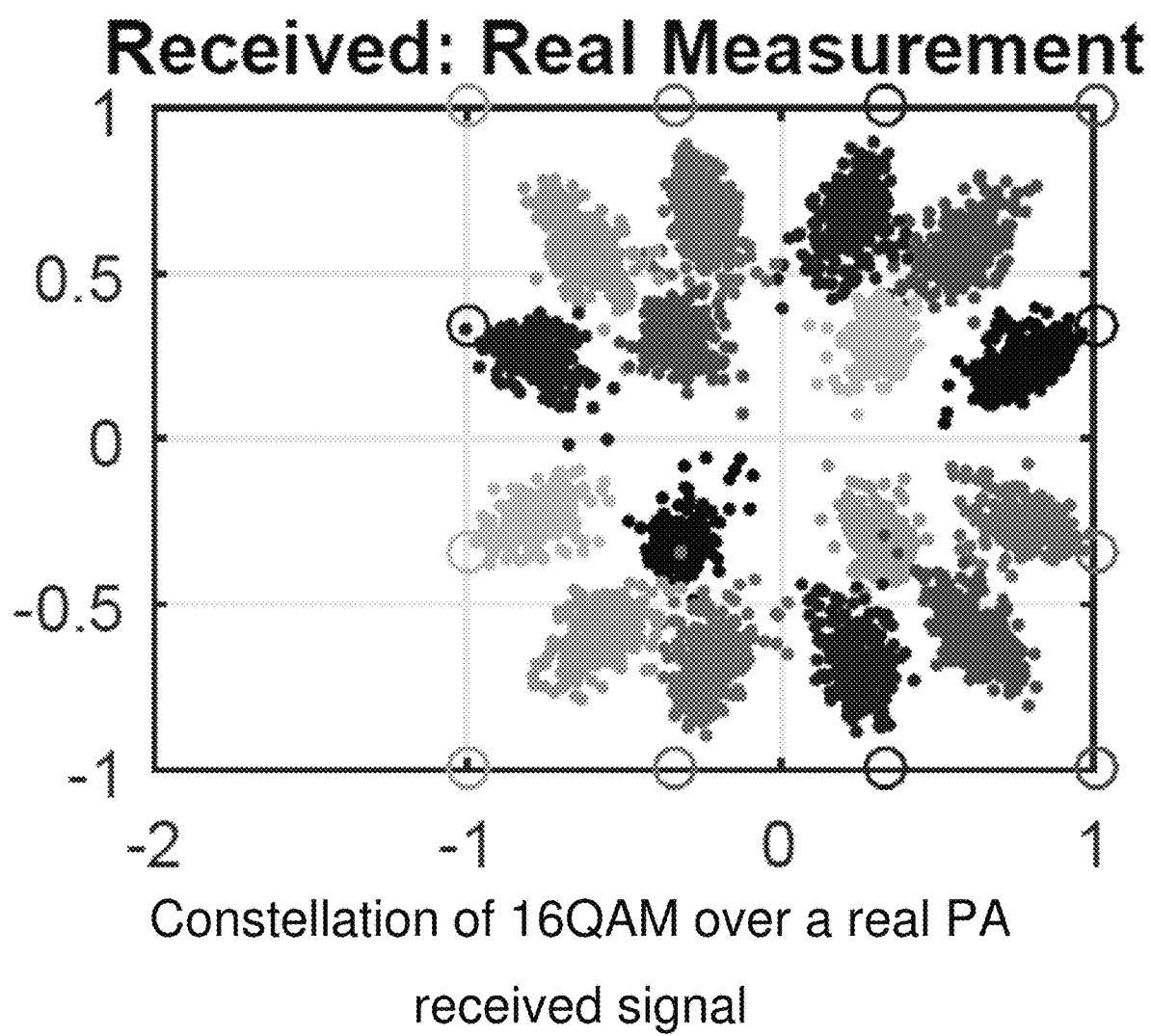
FIGS. 4A-4D show constellation of 16 QAM over a real PA.
Figure 4B:
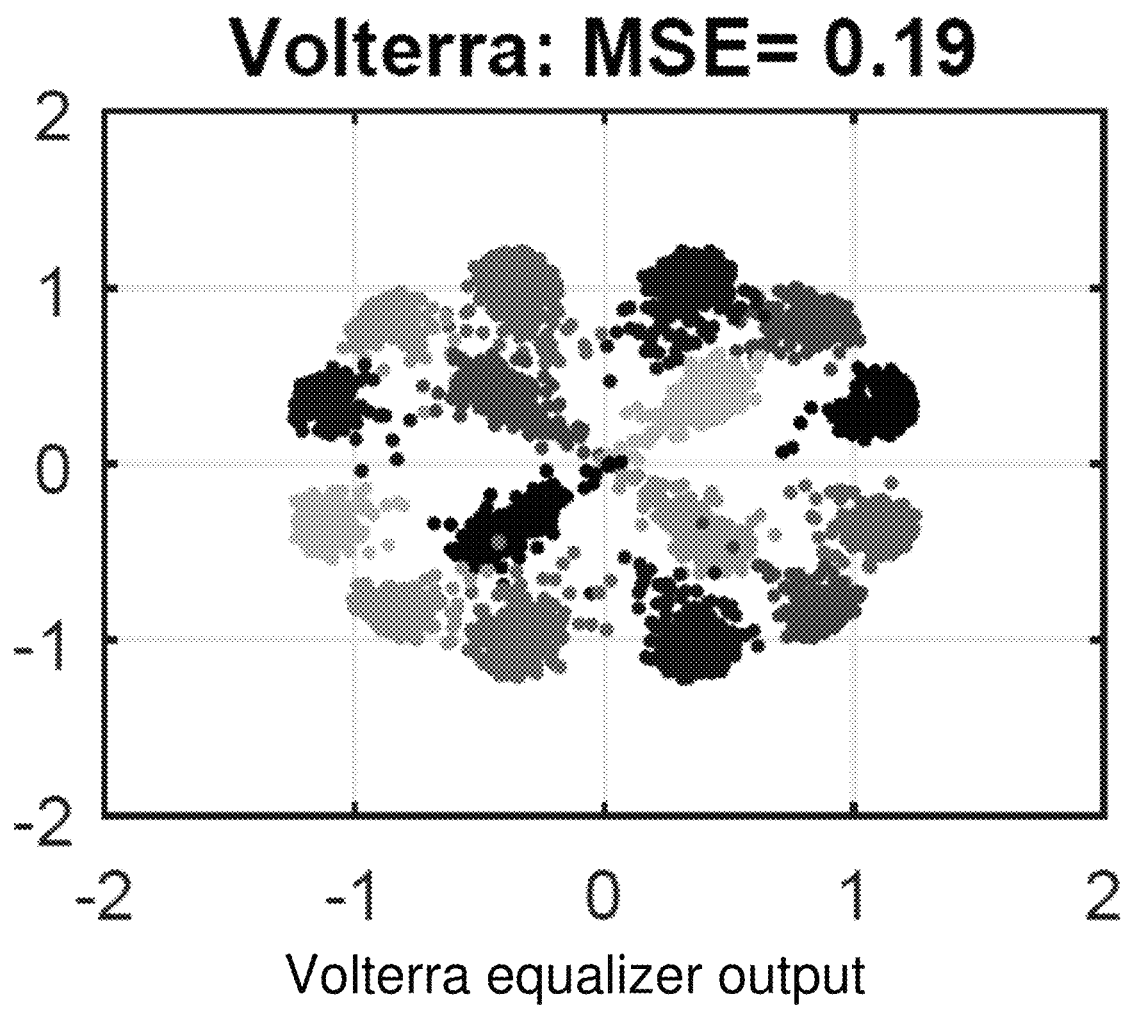
Figure 4C:
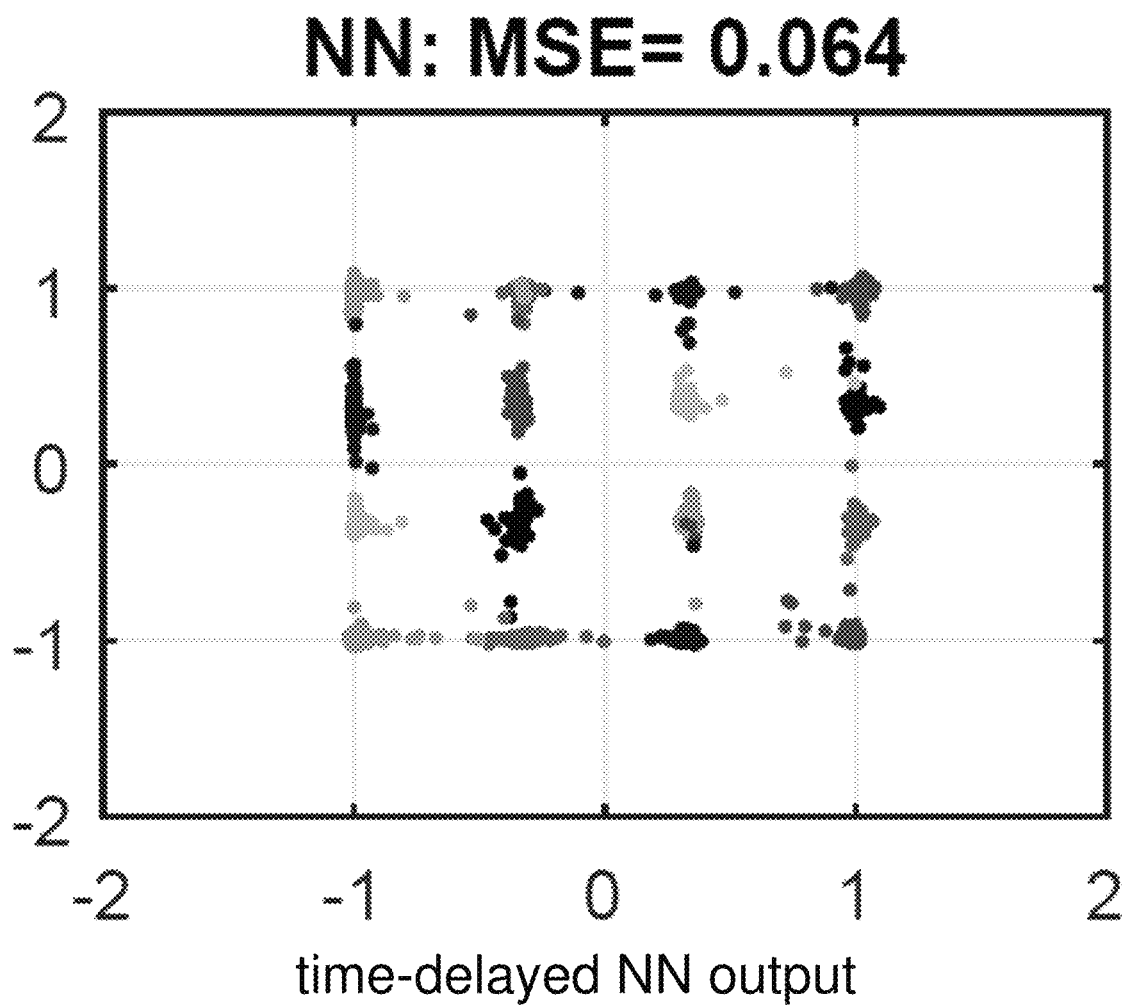
Figure 4D:
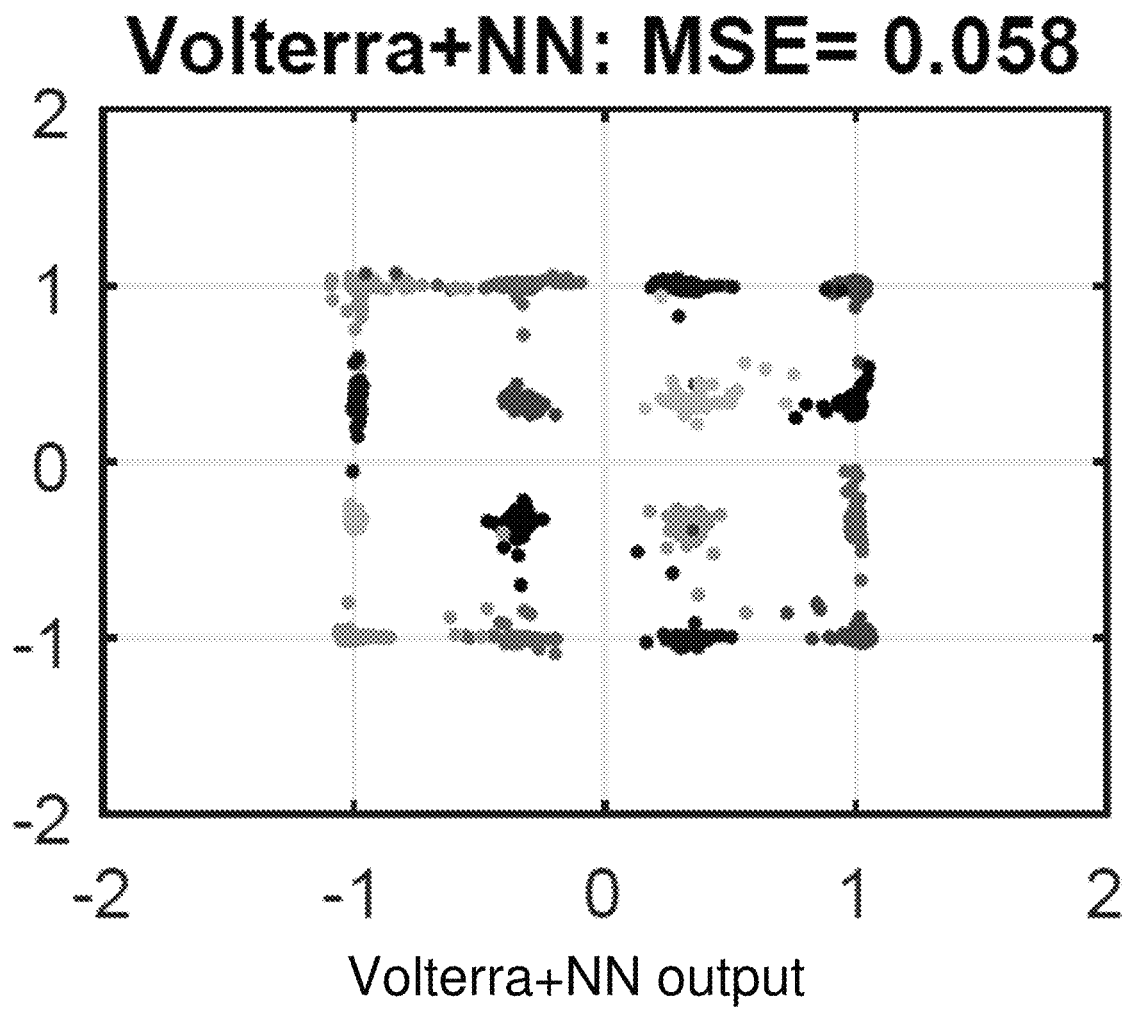

The present technology therefore employs deep neural networks to implement the nonlinear equalizer in the receiver, which can mitigate the nonlinear effects of the received signals due to not only PAs but also nonlinear channels and propagations. The architecture of the DNN equalizer is shown in FIG. 2, which shows an input X, which undergoes a series of three 1-d convolutions, am FC dropout, to produce the output Y.

Different from [10], multi-layer convolutional neural networks (CNNs) are employed. Different from conventional neural network predistorters proposed in [6], neural networks are used as equalizers at the receivers. Different from conventional neural network equalizers such as those proposed in [14] [15], in the present DNN equalizer, not only the linear delayed samples r(n), but also the CNN and the input features in X are used. The Volterra series models are applied to create input features.

We can assume that the linear channel H has already been equalized by a linear equalizer, whose output signal is r(n). In fact, this equalization is not required, but simplifies the presentation of the analysis.

According to Volterra series representation of nonlinear functions, the input-output response of the nonlinear equalizer can be written as $$z(n) = \sum_{k=1}^{P} \sum_{d_1=0}^{D} \cdots \sum_{d_k=0}^{D} f_{d_1,\ldots,d_k} \prod_{i=1}^{k} r(n-d_i). \quad (20)$$

One of major problems is that the number of coefficients $f_{d_1,\ldots,d_k}$ increases exponentially with the increase of memory length D and nonlinearity order P. There are many different ways to develop more efficient Volterra series representations with reduced number of coefficients. For example, [23], exploits the fact that higher-order terms do not contribute significantly to the memory effects of PAs to reduce the memory depth d when the nonlinearity order k increases.

This technique can drastically reduce the total number of coefficients. In [24] [25] and [26], a dynamic deviation model was developed to reduce the full Volterra series model (20) to the following simplified one:

$$z(n) =$$

$$z_s(n) + z_d(n) = \sum_{k=1}^{P} f_{k,0} r^k(n) + \sum_{k=1}^{P} \sum_{j=1}^{k} r^{k-j}(n) \sum_{d_1=0}^{D} \cdots \sum_{d_j=d_{j-1}}^{D} f_{k,j} \prod_{i=1}^{j} r(n-d_i)$$

where $z_s(n)$ is the static term, and $z_d(n)$ is the dynamic term that includes all the memory effects. We can see that the total number of coefficients can be much reduced by controlling the dynamic order j which is a selectable parameter.

We construct the input features of the DNN based on the model (21). Corresponding to the static term $z_s(n)$, we change it to:

$$\hat{z}_s(n) = \sum_{1 \le k \le P} f_{k,0} r(n) |r(n)|^{k-1}.$$

The reason that (22) changes $r^k(n)$ to $r(n)|r(n)|^{k-1}$ is that only the signal frequency within the valid passband is interested. This means the input feature vector X should include terms $r(n)|r(n)|^{k-1}$. Similarly, corresponding to the dynamic term $z_d(n)$, we need to supply $$r^{k-j}(n) \prod_{i=1}^{j} r(n-d_i)$$

in the features where half of the terms r(n) and r(n−$d_i$) should be conjugated. For simplicity, in the DNN equalizer, the vector X includes $r(n-q)|r(n-q)|^{k-1}$ for some q and k.

By applying Volterra series components directly as features of the input X, the DNN can develop more complex nonlinear functions with a fewer number of hidden layers and a fewer number of neurons. This will also make the training procedure converge much faster with much less training data.

In FIG. 2, the input X is a tensor formed by the real and imaginary parts of $r(n-q)|r(n-q)|^{k-1}$ with appropriate number of delays q and nonlinearities k. There are three single dimension convolutional layers, each with 20 or 10 feature maps. After a drop-out layer for regularization, this is followed by a fully connected layer with 20 neurons. Finally, there is a fully-connected layer to form the output tensor Y which has two dimensions. The output Y is used to construct the complex z(n), where z(n)=x̂(n−d) for some appropriate delay d. All the convolutional layers and the first fully connected layer use the sigmoid activation function, while the output layer uses the linear activation function. The mean square error loss function $L^{loss} = E[|x(n-d)-z(n)|^2]$ is used, where z(n) is replaced by Y and x(n−d) is replaced by training data labels.

Experiment Evaluations

Experiments are presented on applying the Volterra series based DNN equalizer (Volterra+NN) for nonlinear PA equalization. The (Volterra+NN) scheme with the following equalization methods: a Volterra series-based equalizer (Volterra) and a conventional time-delay neural network equalizer (NN). The performance metrics are mean square error (MSE)

$$\sqrt{E[|z(n)-x(n-d)|^2]/E[|x(n-d)|^2]}$$

and symbol error rate (SER).

Both simulated signals and real measurement signals were employed. To generate simulated signals, a Doherty nonlinear PA model consisting of 3rd and 5th order nonlinearities was employed. Referring to (2), the coefficients $b_{k,q}$ were $b_{0,0:2}$={1.0513+0.0904j,−0.068−0.0023j,0.0289−0.0054j}

$b_{2,0:2}$={−0.0542−0.29j,0.2234+0.2317j,−0.0621−0.0932j}

$b_{4,0:2}$={−0.9657−0.7028j,−0.2451−0.3735j,0.1229+0.1508j}, which was used in [5] to simulate a 5th order dominant nonlinear distortion derived from PA devices used in the satellite industry. For real measurement, our measurement signals were obtained from PA devices used in the cable TV (CATV) industry, which are typically dominated by $3^{rd}$ order nonlinear distortion (NLD). Various levels of nonlinear distortion, in terms of dBc, were generated by adjusting the PAs.

For the Volterra equalizer, the approximate response of the nonlinear equalizer with delays including 8 pre- and post-main taps and with nonlinearities including even and odd order nonlinearity up to the 5th order was employed. To determine the values of the Volterra coefficients, N=4; 096 training symbols were transmitted through the PA and then collected the noisy received samples r(n).

For the conventional time-delay NN equalizer, a feedforward neural network with an 80-dimensional input vector X and 5 fully-connected hidden layers with 20, 20, 10, 10, 10 neurons, respectively, was applied.

FIG. 3 shows the constellation and MSE of the equalizer's outputs. It can be seen that the proposed scheme provides the best performance.

FIG. 4 shows the constellation of 16 QAM equalization over the real PA. The corresponding SER were 0.0067, 0.0027, 0.00025, respectively. It can be seen that the Volterra+NN scheme has the best performance.

Figure 5:
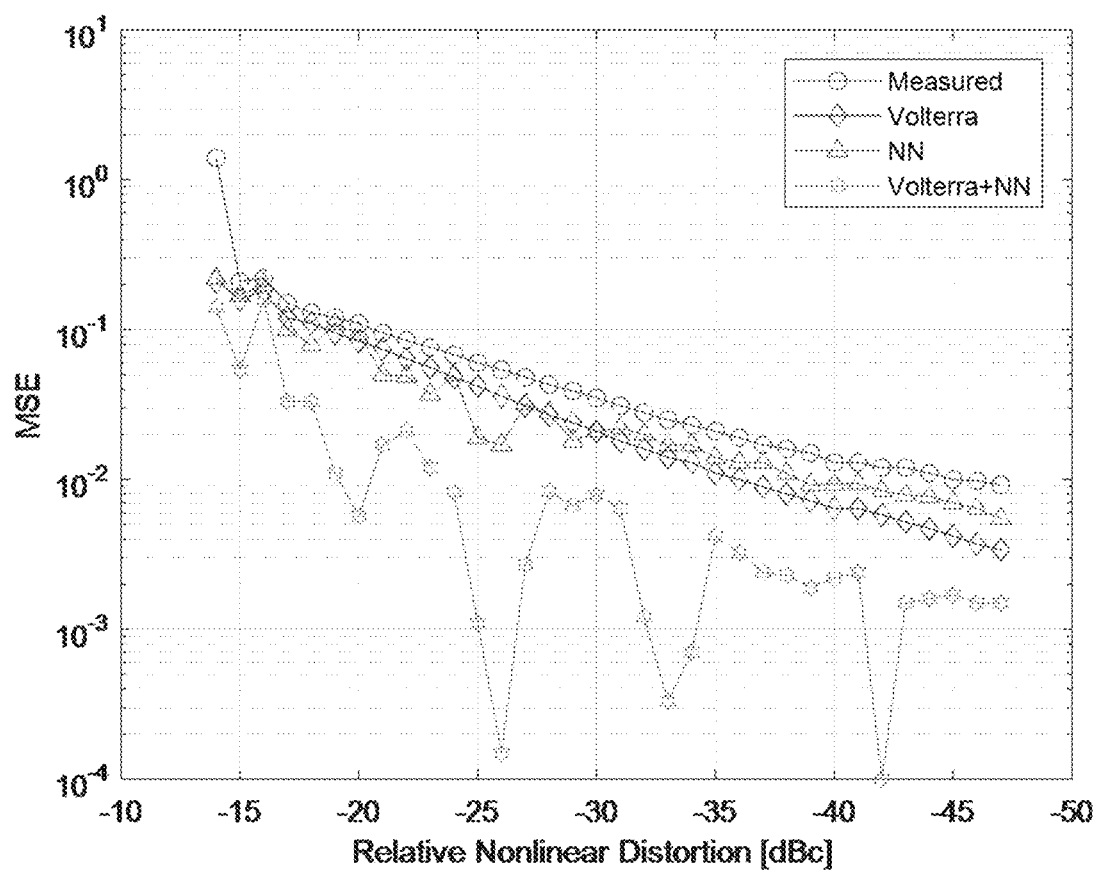
FIG. 5 shows a comparison of three equalization methods for 16-QAM under various NLD levels.

FIG. 5 provides MSE measurements for 16-QAM under various nonlinear distortion level dBc. For each 1 dB increase in NLD, the resultant MSE is shown for the "Measured", "Volterra", "NN", and the proposed "Volterra+NN" cases. MSE reduction diminishes appreciably as modulation order increases from QPSK to 64-QAM, but small improvements in MSE have been observed lead to appreciable SER improvement, especially for more complex modulation orders. The 4,096 symbol sample sizes have limited the measurements to a minimum measurable 0.000244 SER, which represents 1 symbol error out of 4,096 symbols.

FIG. 6 summarizes equalization performance, which shows the averaged percent reduction/improvement in MSE and SER from the NLD impaired data for multiple modulation orders. Note that 0% SER improvement for QPSK was because the received signal's SER was already very low.

The nonlinear equalization scheme presented by integrating the Volterra series non-linear model with deep neural networks yields superior results over conventional nonlinear equalization approaches in mitigating nonlinear power amplifier distortions. It finds application for many 5G communication scenarios.

The technology may be implemented as an additional component in a receiver, or within the digital processing signal chain of a modern radio. A radio is described in US 20180262217, expressly incorporated herein by reference.

In an implementation, a base station may include a SDR receiver configured to allow the base station to operate as an auxiliary receiver. In an example implementation, the base station may include a wideband receiver bank and a digital physical/media access control (PHY/MAC) layer receiver. In this example, the SDR receiver may use a protocol analyzer to determine the protocol used by the source device on the uplink to the primary base station, and then configure the digital PHY/MAC layer receiver for that protocol when operating as art auxiliary receiver. Also, the digital PHY/MAC layer receiver may be configured to operate according to another protocol when operating as a primary base station. In another example, the base station may include a receiver hank for a wireless system, for example, a fifth Generation (5G) receiver bank, and include an additional receiver having SDR configurable capability. The additional receiver may be, for example, a digital Wi-Fi receiver configurable to operate according to various Wi-Fi protocols. The base station may use a protocol analyzer to determine the particular Wi-Fi protocol used by the source device on the uplink to the primary base station. The base station may then configure the additional receiver as the auxiliary receiver for that Wi-Fi protocol.

Depending on the hardware configuration, a receiver may be used to flexibly provide uplink support in systems operating according to one or more protocols such as the various IEEE 802.11 Wi-Fi protocols, $3^{rd}$ Generation Cellular (3G), $4^{th}$ Generation Cellular (4G) wide band code division multiple access (WCDMA), Long Term Evolution (LTE) Cellular, and $5^{th}$ generation cellular (5G).

See, 5G References, infra.

Processing unit may comprise one or more processors, or other control circuitry or any combination of processors and control circuitry that provide, overall control according to the disclosed embodiments. Memory may be implemented as any type of as any type of computer readable storage media, including non-volatile and volatile memory.

The example embodiments disclosed herein may be described in the general context of processor-executable code or instructions stored on memory that may comprise one or more computer readable storage media (e.g., tangible non-transitory computer-readable storage media such as memory). As should be readily understood, the terms "computer-readable storage media" or "non-transitory computer-readable media" include the media for storing of data, code and program instructions, such as memory, and do not include portions of the media for storing transitory propagated or modulated data communication signals.

While the functionality disclosed herein has been described by illustrative example using descriptions of the various components and devices of embodiments by referring to functional blocks and processors or processing units, controllers, and memory including instructions and code, the functions and processes of the embodiments may be implemented and performed using any type of processor, circuit, circuitry or combinations of processors and or circuitry and code. This may include, at least in part, one or more hardware logic components. For example, and without limitation, illustrative types of hardware logic components that can be used include field programmable gate arrays (FPGAs), application specific integrated circuits (ASICs), application specific standard products (ASSPs), system-on-a-chip systems (SOCs), complex programmable logic devices (CPLDs), etc. Use of the term processor or processing unit in this disclosure is mean to include all such implementations.

The disclosed implementations include a receiver, one or more processors in communication with the receiver, and memory in communication with the one or more processors, the memory comprising code that, when executed, causes the one or more processors to control the receiver to implement various features and methods according to the present technology.

Although the subject matter has been described in language specific to structural features and/or methodological acts, it is to be understood that the subject matter defined in the appended claims is not necessarily limited to the specific features or acts described above. Rather, the specific features and acts described above are disclosed as example embodiments, implementations, and forms of implementing the claims and these example configurations and arrangements may be changed significantly without departing from the scope of the present disclosure. Moreover, although the example embodiments have been illustrated with reference to particular elements and operations that facilitate the processes, these elements, and operations may be combined with or, be replaced by, any suitable devices, components, architecture or process that achieves the intended functionality of the embodiment. Numerous other changes, substitutions, variations, alterations, and modifications may be ascertained to one skilled in the art and it is intended that the present disclosure encompass all such changes, substitutions, variations, alterations, and modifications a falling within the scope of the appended claims.

REFERENCES

[1] J.-A. Lucciardi, P. Potier, G. Buscarlet, F. Barrami, and G. Mesnager, "Non-linearized amplifier and advanced mitigation techniques: Dvbs-2x spectral efficiency improvement," in GLOBECOM 2017-2017 IEEE Global Communications Conference. IEEE, 2017, pp. 1-7.

[2] J. Wood, Behavioral modeling and linearization of RF power amplifiers. Artech House, 2014.

[3] C.-L. Wang and Y. Ouyang, "Low-complexity selected mapping schemes for peak-to-average power ratio reduction in ofdm systems," IEEE Transactions on signal processing, vol. 53, no. 12, pp. 4652-4660, 2005.

[4] J. Kim and K. Konstantinou, "Digital predistortion of wideband signals based on power amplifier model with memory," Electronics Letters, vol. 37, no. 23, pp. 1417-1418, 2001.

[5] L. Ding, G. T. Zhou, D. R. Morgan, Z. Ma, J. S. Kenney, J. Kim, and C. R. Giardina, "A robust digital baseband predistorter constructed using memory polynomials," IEEE Transactions on communications, vol. 52, no. 1, pp. 159-165, 2004.

[6] M. Rawat, K. Rawat, and F. M. Ghannouchi, "Adaptive digital predistortion of wireless power amplifiers/transmitters using dynamic realvalued focused time-delay line neural networks," IEEE Transactions on Microwave Theory and Techniques, vol. 58, no. 1, pp. 95-104, 2010.

[7] S. Dimitrov, "Non-linear distortion cancellation and symbol-based equalization in satellite forward links," IEEE Trans Wireless Commun, vol. 16, no. 7, pp. 4489-4502, 2017.

[8] D. J. Sebald and J. A. Bucklew, "Support vector machine techniques for non-linear equalization," IEEE Transactions on Signal Processing, vol. 48, no. 11, pp. 3217-3226, 2000.

[9] S. Chen, B. Mulgrew, and P. M. Grant, "A clustering technique for digital communications channel equalization using radial basis function networks," IEEE Transactions on neural networks, vol. 4, no. 4, pp. 570-590, 1993.

[10] B. Li, C. Zhao, M. Sun, H. Zhang, Z. Zhou, and A. Nallanathan, "A bayesian approach for nonlinear equalization and signal detection in millimeter-wave communications," IEEE Transactions on Wireless Communications, vol. 14, no. 7, pp. 3794-3809, 2015.

[11] F. Mkadem and S. Boumaiza, "Physically inspired neural network model for rf power amplifier behavioral modeling and digital predistortion," IEEE Transactions on Microwave Theory and Techniques, vol. 59, no. 4, pp. 913-923, 2011.

[12] T. Liu, S. Boumaiza, and F. M. Ghannouchi, "Dynamic behavioral modeling of 3g power amplifiers using realvalued time-delay neural networks," IEEE Transactions on Microwave Theory and Techniques, vol. 52, no. 3, pp. 1025-1033, 2004.

[13] M. Ibnkahla, "Applications of neural networks to digital communications—a survey," Signal processing, vol. 80, no. 7, pp. 1185-1215, 2000.

[14] D.-C. Park and T.-K. J. Jeong, "Complex-bilinear recurrent neural network for equalization of a digital satellite channel," IEEE Transactions on Neural Networks, vol. 13, no. 3, pp. 711-725, 2002.

[15] A. Uncini, L. Vecci, P. Campolucci, and F. Piazza, "Complex-valued neural networks with adaptive spline activation function for digital-radio-links nonlinear equalization," IEEE Transactions on Signal Processing, vol. 47, no. 2, pp. 505-514, 1999.

[16] M. S. Sim, M. Chung, D. Kim, J. Chung, D. K. Kim, and C.-B. Chae, "Non-linear self-interference cancellation for full-duplex radios: From link-level and system-level performance perspectives," IEEE Communications Magazine, vol. 55, no. 9, pp. 158-167, 2017.

[17] I. Yoffe and D. Wulich, "Predistorter for mimo system with nonlinear power amplifiers," IEEE Transactions on Communications, vol. 65, no. 8, pp. 3288-3301, 2017.

[18] M. Abdelaziz, L. Anttila, and M. Valkama, "Reduced-complexity digital predistortion for massive mimo," in Acoustics, Speech and Signal Processing (ICASSP), 2017 IEEE International Conference on. IEEE, 2017, pp. 6478-6482.

[19] H. Yan and D. Cabric, "Digital predistortion for hybrid precoding architecture in millimeter-wave massive mimo systems," in Acoustics, Speech and Signal Processing (ICASSP), 2017 IEEE International Conference on. IEEE, 2017, pp. 3479-3483.

[20] C. Mollén, E. G. Larsson, and T. Eriksson, "Waveforms for the massive mimo downlink: Amplifier efficiency, distortion, and performance," IEEE Transactions on Communications, vol. 64, no. 12, pp. 5050-5063, 2016.

[21] A. Cheaito, M. Crussière, J.-F. Hélard, and Y. Louët, "Quantifying the memory effects of power amplifiers: Evm closed-form derivations of multicarrier signals." IEEE Wireless Commun. Letters, vol. 6, no. 1, pp. 34-37, 2017.

[22] K. Simons, Technical Handbook for CATV Systems, 3rd Edition. Jerrod Publication No. 436-001-01, 1968.

[23] J. Staudinger, J.-C. Nanan, and J. Wood, "Memory fading volterra series model for high power infrastructure amplifiers," in Radio and Wireless Symposium (RWS), 2010 IEEE. IEEE, 2010, pp. 184-187.

[24] A. Zhu, J. C. Pedro, and T. J. Brazil, "Dynamic deviation reduction-based volterra behavioral modeling of rf power amplifiers," IEEE Transactions on microwave theory and techniques, vol. 54, no. 12, pp. 4323-4332, 2006.

[25] A. Zhu, P. J. Draxler, J. J. Yan, T. J. Brazil, D. F. Kimball, and P. M. Asbeck, "Open-loop digital predistorter for rf power amplifiers using dynamic deviation reduction-based volterra series," IEEE Transactions on Microwave Theory and Techniques, vol. 56, no. 7, pp. 1524-1534, 2008.

[26] L. Guan and A. Zhu, "Simplified dynamic deviation reduction-based volterra model for doherty power amplifiers," in Integrated Nonlinear Microwave and Millimetre-Wave Circuits (INMMIC), 2011 Workshop on. IEEE, 2011, pp. 1-4.

[27] Schetzen, M. The Volterra and Wiener Theories of Non-linear Systems. (1980) Wiley & Sons.

[28] Black, H. S. [October, 1928] Translating system. U.S. Pat. No. 1,686,792.

[29] Black, H. S. [December, 1937] Wave translating system. U.S. Pat. No. 2,102,671.

[30] Mitchell, A. F. [November, 1979] A 135 MHz feedback amplifier. IEEE Colloq. Broadband High Frequency Amplifiers.

[31] Arthanayake, T. and Wood, H. B. [8 Apr. 1971] Linear amplification using envelope feedback. Elec. Lett.

[32] Chadwick, P. [1986] Wideband Amplifier Applications Book, Edition 2, Plessey Semiconductor.

AMPLIFIER REFERENCES

Aghvami, A. H. and Robertson, I. D. [April, 1993] Power limitation and high-power amplifier non linearities in on-board satellite communications systems. Electron. and Comm. Engin. J.

Arthanayake, T. and Wood, H. B. [8 Apr. 1971] Linear amplification using envelope feedback. Elec. Lett.

Bennet, T. J. and Clements, R. F. [May, 1974] Feedforward—An alternative approach to amplifier linearisation. Radio and Electron. Engin.

Bhargava, V. K. et al. [1981] Digital Communications by Satellite, John Wiley and Sons.

Black, H. S. [December, 1937] Wave translating system. U.S. Pat. No. 2,102,671.

Black, H. S. [October, 1928] Translating system. U.S. Pat. No. 1,686,792.

Bond F. E. and Meyer, H. F. [April, 1970] Intermodulation effects in limiter amplifier repeaters. IEEE Trans. Comm., Vol. COM-18, p. 127-135.

Chadwick, P. [1986] Wideband Amplifier Applications Book, Edition 2, Plessey Semiconductor.

Cole, R. A. [December, 1989] Linearisation of a power amplifier using Cartesian Loop feedback. Report No. 72/89/R/451/C. Roke Manor Res.

ETSI [August, 1994] Standard ETR 132. Radio broadcasting systems; Code of practice for site engineering VHF FM sound broadcasting transmitters. European Telecommunications Standards Institute, Sophia Antipolis, F-06291, Valbonne Cedex, France.

ETSI [January, 1995] European Standard ETS 300 384. Radio broadcasting systems; Very high frequency (VHF), frequency modulated, sound broadcasting transmitters. European Telecommunications Standards Institute, Sophia Antipolis, F-06291, Valbonne Cedex, France.

ETSI [June, 1998] Standard ETR 053 Ed 3—Radio site engineering for equipment and systems in the mobile service. European Telecommunications Standards Institute, Sophia Antipolis, F-06291, Valbonne Cedex, France.

ETSI [March, 1997] European Standard ETS 300 113. Radio equipment and systems (RES); Land mobile service; Technical characteristics and test conditions for radio equipment intended for the transmission of data (and speech) and having an antenna connector. European Telecommunications Standards Institute, Sophia Antipolis, F-06291, Valbonne Cedex, France.

Gray, L. F. [1980] Application of broadband linearisers to satellite transponders. IEEE Conf. Proc. ICC'80.

Heathman, A. C. [1989] Methods for intermodulation prediction in communication systems. Ph. D. Thesis, University of Bradford, United Kingdom.

IESS [November, 1996] IESS-401 (Rev. 4). Performance requirements for intermodulation products transmitted from INTELSAT earth stations. Intelsat Earth Station Standard (IESS).

Kaeadar, K. [December, 1986] Gaussian white-noise generation for digital signal synthesis. IEEE Trans. Inst. and Meas., Vol. IM 35, 4.

Kahn, L. R. [July, 1952] SSB transmission by envelope elimination and restoration. Proc. IRE.

Mitchell, A. F. [November, 1979] A 135 MHz feedback amplifier. IEEE Colloq. Broadband High Frequency Amplifiers.

Pavliouk, A. [1977] Unification of measurement procedures for out-of-band emission spectra and peak envelope power of single-sideband radio transmitter measurements. Proc. of the NIIR, 4 (in Russian).

Petrovic, V. and Gosling, W. [10 May 1979] Polar loop transmitter. Elec. Lett.

Pye Telecom [November, 1978] Intermodulation in VHF and UHF radio systems—locating and minimizing the effects. Engineering Notes, Pub. Ref. No. TSP480/1, United Kingdom.

Radiocommunications Agency [April, 1987] Code of practice for radio site engineering. MPT 1331. Radiocommunications Agency (RA), Flyde Microsystems Ltd. United Kingdom.

Saleh, A. M. [May 1982] Intermodulation analysis of FDMA satellite systems employing compensated and uncompensated TWT's'. IEEE Trans. Comm., Vol. COM-30, 5.

Schetzen, M. [1980] The Volterra and Wiener Theories of Non-linear Systems. Wiley & Sons.

Schetzen, M. [1980] *The Volterra and Wiener Theories of Non-linear Systems*. Wiley & Sons.

Shahid, M., Shepherd, S. J., Lin, B., Khairruddin, I., and Barton, S. K. [December, 1996] Study of methods of measuring multi-carrier intermodulation performance Report No. 581, Purchase Order No. 142379 d'ESA, with University of Bradford, United Kingdom.

Shimbo, O. [February, 1971] Effects of intermodulation, AM-PM conversion, and additive noise in multicarrier TWT systems. Proc. IEEE, Vol. 59, p. 230-238.

Smith, C. N. [1986] Application of the polar loop technique to UHF SSB transmitters. Ph.D. Thesis, University of Bath.

Smith, C. N. and PETROVIC, V. [1982] Cartesian loop transmitter. Internal Research Report, University of Bath, School of Electrical and Electronic Engineering.

Tondryk, W. [1991] Intermodulation testing of the INMARSAT payload—Response to system PDR. Marconi Space Systems Ltd.

Wassermann, M. et al. [1983] Study and breadboarding of an L-band high power linearized TWT amplifier. Final Report, ESTEC contract No. 5459/83/NL/GM.

Wood, A. [October 1998] Radio interference: Sources and solutions. LPRA NEWS, p. 21.

VOLTERRA SERIES REFERENCES

Bohm, D. *The Special Theory of Relativity*, Benjamin, 1965.

Censor, D., & Melamed, T, 2002, Volterra differential constitutive operators and locality considerations in electromagnetic theory, *PIER—Progress in Electromagnetic Research*, 36: 121-137

Censor, D., 2000, A quest for systematic constitutive formulations for general field and wave systems based on the Volterra differential operators, *PIER—Progress In Electromagnetics Research*, (25): 261-284

Censor, D., 2001, Constitutive relations in inhomogeneous systems and the particle-field conundrum, *PIER—Progress In Electromagnetics Research*, (30): 305-335

Schetzen, M., 1980, *The Volterra and Wiener Theorems of Nonlinear Systems*, New York, Chichester, Brisbane and Toronto: John Wiley and Sons Sonnenschein, M & Censor, D., 1998, Simulation of Hamiltonian light beam propagation in nonlinear media, *JOSA—Journal of the Optical Society of America* B, (15): 1335-1345

FILTER REFERENCES

Akaiwa, Y. Introduction to Digital Mobile Communication. New York: Wiley, 1997.

Altera Corporation. Digital Predistortion Reference Design. Application Note 314, 2003.

Aysal, Tuncer C., and Kenneth E. Barner, "Myriad-Type Polynomial Filtering", *IEEE Transactions on Signal Processing*, vol. 55, no. 2, February 2007.

Barner, Kenneth E., and Tuncer Can Aysal, "Polynomial Weighted Median Filtering", *IEEE Transactions on Signal Processing*, vol. 54, no. 2, February 2006.

Biglieri, Ezio, Sergio Barberis, and Maurizio Catena, "Analysis and Compensation of Nonlinearities in Digital Transmission Systems", *IEEE Journal on selected areas in Communications*, vol. 6, no. 1, January 1988.

Budura, Georgeta, and Corina Botoca, "Efficient Implementation of the Third Order RLS Adaptive Volterra Filter", *FACTA Universitatis (NIS) Ser.: Elec. Energ.* vol. 19, no. 1, April 2006.

Ding, L., et al. "A Robust Digital Baseband Predistorter Constructed Using Memory Polynomials," IEEE Transactions on Communications, Vol. 52, No. 1, June 2004.

Fang, Yang-Wang, Li-Cheng Jiao, Xian-Da Zhang and Jin Pan, "On the Convergence of Volterra Filter Equalizers Using a Pth-Order Inverse Approach", *IEEE Transactions on Signal Processing*, vol. 49, no. 8, August 2001.

Guérin, Alexandre, Gérard Faucon, and Régine Le Bouquin-Jeannès, "Nonlinear Acoustic Echo Cancellation Based on Volterra Filters", *IEEE Transactions on Speech and Audio Processing*, vol. 11, no. 6, November 2003.

Haykin, Simon, "Adaptive Filter Theory", Fourth Edition, Pearson Education, 2008.

Kamiya, N., and F. Maehara. "Nonlinear Distortion Avoidance Employing Symbol-wise Transmit Power Control for OFDM Transmission," Proc. of Int'l. OFDM Workshop, Hamburg, 2009.

Kim, J., and K. Konstantinou. "Digital predistortion of wideband signals based on power amplifier model with memory," Electronic Letters, Vol. 37, No. 23, November 2001.

Krall, Christoph, Klaus Witrisal, Geert Leus and Heinz Koeppl, "Minimum Mean-Square Error Equalization for Second-Order Volterra Systems", *IEEE Transactions on Signal Processing*, vol. 56, no. 10, October 2008.

Leis, John, "Adaptive Filter Lecture Notes & Examples", Nov. 1, 2008 www.usq.edu.au/users/leis/notes/sigproc/adfilt.pdf.

López-Valcarce, Roberto, and Soura Dasgupta, "Second-Order Statistical Properties of Nonlinearly Distorted Phase-Shift Keyed (PSK) Signals", *IEEE Communications Letters*, vol. 7, no. 7, July 2003.

Lozhkin, Alexander N. "Turbo Linearizer for High Power Amplifier." In 2011 IEEE 73rd Vehicular Technology Conference (VTC Spring), pp. 1-5. IEEE, 2011.

Mathews, V. John, "Adaptive Polynomial Filters," IEEE Signal Processing Magazine, Vol. 8, No. 3, July 1991.

Park, Dong-Chul, and Tae-Kyun Jung Jeong, "Complex-Bilinear Recurrent Neural Network for Equalization of a Digital Satellite Channel", *IEEE Transactions on Neural Networks*, vol. 13, no. 3, May 2002.

Rai, Amrita, and Amit Kumar Kohli. "Analysis of Adaptive Volterra Filters with LMS and RLS Algorithms." AKGEC Journal of Technology 2, no. 1 (2011).

Therrien, Charles W., W. Kenneth Jenkins, and Xiaohui Li, "Optimizing the Performance of Polynomial Adaptive Filters: Making Quadratic Filters Converge Like Linear Filters", IEEE Transactions on Signal Processing, vol. 47, no. 4, April 1999.

Tsimbinos John, and Langford B. White, "Error Propagation and Recovery in Decision-Feedback Equalizers for Non-linear Channels", *IEEE Transactions on Communications*, vol. 49, no. 2, February 2001.

Woo, Young Yun, et al. "Adaptive Digital Feedback Predistortion Technique for Linearizing Power Amplifiers," IEEE Transactions on Microwave Theory and Techniques, Vol. 55, No. 5, May 2007.

Zaknich, A., "Principal of Adaptive Filter and Self Learning System", Springer Link 2005.

VOLTERRA SERIES PATENTS

U.S. Patent and Published Patent Application Nos.: U.S. Pat. Nos. 4,615,038; 4,669,116; 4,870,371; 5,038,187; 5,309, 481; 5,329,586; 5,424,680; 5,438,625; 5,539,774; 5,647, 023; 5,692,011; 5,694,476; 5,744,969; 5,745,597; 5,790, 692; 5,792,062; 5,815,585; 5,889,823; 5,924,086; 5,938, 594; 5,991,023; 6,002,479; 6,005,952; 6,064,265; 6,166, 599; 6,181,754; 6,201,455; 6,201,839; 6,236,837; 6,240, 278; 6,288,610; 6,335,767; 6,351,740; 6,381,212; 6,393, 259; 6,406,438; 6,408,079; 6,438,180; 6,453,308; 6,504, 885; 6,510,257; 6,512,417; 6,532,272; 6,563,870; 6,600, 794; 6,633,208; 6,636,115; 6,668,256; 6,687,235; 6,690, 693; 6,697,768; 6,711,094; 6,714,481; 6,718,087; 6,775, 646; 6,788,719; 6,812,792; 6,826,331; 6,839,657; 6,850, 871; 6,868,380; 6,885,954; 6,895,262; 6,922,552; 6,934, 655; 6,940,790; 6,947,857; 6,951,540; 6,954,476; 6,956, 433; 6,982,939; 6,992,519; 6,999,201; 6,999,510; 7,007, 253; 7,016,823; 7,061,943; 7,065,511; 7,071,797; 7,084, 974; 7,092,043; 7,113,037; 7,123,663; 7,151,405; 7,176, 757; 7,209,566; 7,212,933; 7,236,156; 7,236,212; 7,239, 301; 7,239,668; 7,251,297; 7,268,620; 7,272,594; 7,286, 009; 7,295,961; 7,304,591; 7,305,639; 7,308,032; 7,333, 559; 7,348,844; 7,400,807; 7,403,884; 7,412,469; 7,423, 699; 7,436,883; 7,443,326; 7,489,298; 7,512,900; 7,542, 518; 7,551,668; 7,570,856; 7,571,401; 7,576,606; 7,589, 725; 7,590,518; 7,602,240; 7,606,539; 7,610,183; 7,657, 405; 7,720,232; 7,720,236; 7,728,658; 7,729,446; 7,733, 177; 7,746,955; 7,755,425; 7,760,887; 7,773,692; 7,774, 176; 7,795,858; 7,796,960; 7,808,315; 7,812,666; 7,821, 337; 7,821,581; 7,822,146; 7,826,624; 7,847,631; 7,852, 913; 7,853,443; 7,864,881; 7,873,172; 7,885,025; 7,885, 797; 7,889,007; 7,894,788; 7,895,006; 7,899,416; 7,902, 925; 7,903,137; 7,924,942; 7,929,375; 7,932,782; 7,970, 150; 7,970,151; 7,979,837; 7,991,073; 7,991,167; 7,995, 674; 8,005,858; 8,023,668; 8,031,882; 8,039,871; 8,045, 066; 8,046,199; 8,065,060; 8,089,689; 8,105,270; 8,139, 630; 8,148,983; 8,149,950; 8,160,191; 8,165,854; 8,170, 508; 8,185,853; 8,193,566; 8,195,103; 8,199,399; 8,213, 880; 8,244,787; 8,260,732; 8,265,583; 8,270,530; 8,294, 605; 8,295,790; 8,306,488; 8,310,312; 8,315,970; 8,331, 511; 8,331,879; 8,345,348; 8,346,692; 8,346,693; 8,346, 711; 8,346,712; 8,351,876; 8,354,884; 8,355,684; 8,358, 169; 8,364,095; 8,369,447; 8,369,595; 8,380,773; 8,390, 375; 8,390,376; 8,396,693; 8,410,843; 8,410,850; 8,412, 133; 8,421,534; 8,432,220; 8,437,513; 8,463,582; 8,467, 438; 8,477,581; 8,483,343; 8,483,450; 8,487,706; 8,489, 047; 8,494,463; 8,498,369; 8,509,347; 8,509,712; 8,519, 440; 8,532,215; 8,532,964; 8,538,039; 8,564,368; 8,565, 343; 8,577,311; 8,587,375; 8,599,050; 8,605,814; 8,605, 819; 8,611,190; 8,611,459; 8,611,820; 8,615,208; 8,619, 905; 8,620,631; 8,626,089; 8,649,743; 8,675,925; 8,704, 595; 8,705,166; 8,712,345; 8,718,178; 8,718,209; 8,724, 857; 8,737,937; 8,737,938; 8,744,141; 8,744,377; 8,758, 271; 8,761,409; 8,766,917; 8,767,869; 8,780,693; 8,787, 628; 8,798,559; 8,804,807; 8,804,871; 8,811,532; 8,823, 452; 8,831,074; 8,831,133; 8,831,135; 8,838,218; 8,843, 088; 8,843,089; 8,849,611; 8,855,175; 8,855,234; 8,867, 601; 8,874,411; 8,885,765; 8,886,341; 8,891,701; 8,896, 471; 8,897,351; 8,903,192; 8,909,176; 8,909,328; 8,933, 752; 8,934,573; 8,958,470; 8,964,901; 8,964,996; 8,971, 834; 8,976,896; 8,994,657; 8,995,571; 8,995,835; 9,008, 153; 9,014,299; 9,019,643; 9,020,454; 9,025,607; 9,031, 168; 9,036,734; 9,048,865; 9,048,900; 9,071,313; 9,077, 508; 9,088,472; 9,094,036; 9,094,151; 9,104,921; 9,106, 304; 9,130,628; 9,137,492; 9,143,274; 9,160,280; 9,160, 310; 9,160,687; 9,166,610; 9,166,635; 9,166,698; 9,171, 534; 9,184,784; 9,185,529; 9,189,458; 9,191,041; 9,191, 049; 9,199,860; 9,209,753; 9,209,841; 9,214,968; 9,214, 969; 9,225,295; 9,225,501; 9,231,530; 9,231,647; 9,231, 801; 9,236,996; 9,246,525; 9,246,731; 9,252,798; 9,252, 821; 9,253,608; 9,257,943; 9,258,156; 9,261,978; 9,264,153; 9,265,461; 9,270,304; 9,270,512; 9,271,123; 9,276,602; 9,294,113; 9,304,501; 9,306,606; 9,311,535; 9,312,892; 9,314,623; 9,322,906; 9,337,781; 9,337,783; 9,352,155; 9,361,681; 9,361,936; 9,362,869; 9,362,942; 9,363,068; 9,369,093; 9,369,255; 9,369,541; 9,397,516; 9,404,950; 9,413,516; 9,419,722; 9,431,972; 9,438,178; 9,438,356; 9,439,597; 9,451,920; 9,460,246; 9,461,597; 9,461,676; 9,473,077; 9,479,322; 9,509,331; 9,509,350; 9,517,030; 9,531,475; 9,536,539; 9,537,759; 9,544,126; 9,559,831; 9,564,876; 9,571,312; 9,575,570; 9,590,664; 9,590,668; 9,595,920; 9,595,982; 9,607,003; 9,607,628; 9,608,676; 9,608,718; 9,614,554; 9,628,119; 9,628,120; 9,646,116; 9,647,717; 9,654,211; 9,654,216; 9,659,120; 9,660,593; 9,660,730; 9,665,510; 9,667,292; 9,674,368; 9,680,423; 9,680,497; 9,697,845; 9,705,477; 9,706,296; 9,712,179; 9,712,233; 9,713,010; 9,722,646; 9,722,691; 9,726,701; 9,727,677; 9,735,741; 9,735,800; 9,735,811; 9,735,876; 9,737,258; 9,742,599; 9,746,506; 9,749,161; 9,755,691; 9,762,268; 9,768,891; 9,778,902; 9,780,869; 9,780,881; 9,787,459; 9,794,000; 9,800,437; 9,800,734; 9,820,311; 9,831,899; 9,837,970; 9,843,346; 9,859,845; 9,866,183; 9,877,265; 9,882,648; 9,887,862; 9,900,088; 9,912,435; 9,913,194; 9,923,524; 9,923,640; 9,923,714; 9,928,212; 9,935,590; 9,935,645; 9,935,715; 9,935,761; 9,940,938; 9,941,963; 9,953,656; 9,954,384; 9,960,794; 9,960,804; 9,960,900; 9,971,920; 9,973,279; 9,974,957; 9,983,243; 9,998,223; 9,998,406; 9,999,780; 10,008,218; 10,009,050; 10,009,109; 10,009,259; 10,013,515; 10,015,593; 10,033,413; 10,033,568; 10,050,636; 10,050,710; 10,050,714; 10,063,265; 10,063,364; 10,075,201; 10,095,927; 10,097,273; 10,097,939; 10,101,370; 10,108,858; 10,110,315; 10,116,390; 10,128,955; 10,141,944; 10,142,754; 10,147,431; 10,148,417; 10,153,793; 10,181,825; 10,224,970; 20010036334; 20010051871; 20020041210; 20020060827; 20020075918; 20020126604; 20020146993; 20020161539; 20020161542; 20020169585; 20020178133; 20020181521; 20020186874; 20030046045; 20030057963; 20030063854; 20030071684; 20030142832; 20030195706; 20030223507; 20040019443; 20040044489; 20040130394; 20040136423; 20040155707; 20040179629; 20040208242; 20040258176; 20050021266; 20050021319; 20050031117; 20050031131; 20050031132; 20050031133; 20050031134; 20050031137; 20050031138; 20050031139; 20050031140; 20050049838; 20050100065; 20050141637; 20050141659; 20050174167; 20050177805; 20050180526; 20050226316; 20050237111; 20050243061; 20050253806; 20050270094; 20050271216; 20050273188; 20060039498; 20060052988; 20060083389; 20060093128; 20060095236; 20060104395; 20060104451; 20060133536; 20060209982; 20060222128; 20060239443; 20060256974; 20060262942; 20060262943; 20060264187; 20060269074; 20060269080; 20060274904; 20070005326; 20070018722; 20070030076; 20070033000; 20070063770; 20070080841; 20070133713; 20070133719; 20070136018; 20070136045; 20070152750; 20070160221; 20070168100; 20070190952; 20070229154; 20070237260; 20070247425; 20070252651; 20070252813; 20070276610; 20080001947; 20080032642; 20080129379; 20080130787; 20080130788; 20080130789; 20080152037; 20080158154; 20080158155; 20080180178; 20080240325; 20080261541; 20080283882; 20080285640; 20080293372; 20090003134; 20090027117; 20090027118; 20090058521; 20090067643; 20090072901; 20090075610; 20090094304; 20090146740; 20090153132; 20090185613; 20090256632; 20090287624; 20090289706; 20090291650; 20090302938; 20090302940; 20090318983; 20100007489; 20100033180; 20100060355; 20100090762; 20100093290; 20100094603; 20100097714; 20100114813; 20100135449; 20100148865; 20100152547; 20100156530; 20100183106; 20100194474; 20100199237; 20100254450; 20100283540; 20100292602; 20100292752; 20100311361; 20100312495; 20110003570; 20110025414; 20110028859; 20110037518; 20110054354; 20110054355; 20110064171; 20110069749; 20110081152; 20110085678; 20110087341; 20110096865; 20110102080; 20110103455; 20110110473; 20110121897; 20110125684; 20110125685; 20110125686; 20110125687; 20110140779; 20110144961; 20110149714; 20110177956; 20110181360; 20110204975; 20110211842; 20110268226; 20110270590; 20110293051; 20120007153; 20120007672; 20120027070; 20120029663; 20120086507; 20120093376; 20120098481; 20120098596; 20120119810; 20120140860; 20120147993; 20120154040; 20120154041; 20120158384; 20120165633; 20120176190; 20120176609; 20120217557; 20120229206; 20120256687; 20120259600; 20120263256; 20120306573; 20120328128; 20130005283; 20130009702; 20130015917; 20130030239; 20130034188; 20130040587; 20130044791; 20130044836; 20130093676; 20130113559; 20130114762; 20130166259; 20130170842; 20130176153; 20130207723; 20130222059; 20130243119; 20130243122; 20130243135; 20130257530; 20130271212; 20130272367; 20130285742; 20130301487; 20130303103; 20130315291; 20130321078; 20130330082; 20130336377; 20140009224; 20140029658; 20140029660; 20140030995; 20140031651; 20140036969; 20140044318; 20140044319; 20140044320; 20140044321; 20140072074; 20140077981; 20140081157; 20140086356; 20140086361; 20140095129; 20140107832; 20140126670; 20140126675; 20140133848; 20140140250; 20140161207; 20140167704; 20140172338; 20140198959; 20140213919; 20140225451; 20140226828; 20140229132; 20140247906; 20140266431; 20140269857; 20140269970; 20140269989; 20140269990; 20140270405; 20140278303; 20140279778; 20140292406; 20140292412; 20140294119; 20140294252; 20140313946; 20140314176; 20140314181; 20140314182; 20140317163; 20140323891; 20140333376; 20140372091; 20150003625; 20150005902; 20150016567; 20150018632; 20150025328; 20150031317; 20150031969; 20150032788; 20150043678; 20150051513; 20150061911; 20150070089; 20150077180; 20150078484; 20150092830; 20150098710; 20150104196; 20150131757; 20150156003; 20150156004; 20150162881; 20150172081;

20150180495; 20150193565; 20150193666; 20150194989; 20150202440; 20150214987; 20150215937; 20150223748; 20150241996; 20150249589; 20150256216; 20150270856; 20150270865; 20150288375; 20150295643; 20150311927; 20150311973; 20150311985; 20150322647; 20150326190; 20150333781; 20150357975; 20150358042; 20150358191; 20150381216; 20150381220; 20150381821; 20160005419; 20160022161; 20160028433; 20160034421; 20160036472; 20160036528; 20160065311; 20160079933; 20160087604; 20160087657; 20160099776; 20160111110; 20160117430; 20160124903; 20160126903; 20160127113; 20160132735; 20160134380; 20160156375; 20160162042; 20160173117; 20160191020; 20160218752; 20160225385; 20160241277; 20160248531; 20160259960; 20160261241; 20160269210; 20160287871; 20160308619; 20160309042; 20160316283; 20160329927; 20160334466; 20160336762; 20160352427; 20160359552; 20160373212; 20160380661; 20160380700; 20170012585; 20170012709; 20170014032; 20170032184; 20170033809; 20170041124; 20170043166; 20170047899; 20170061045; 20170063312; 20170077944; 20170077945; 20170078023; 20170078027; 20170093497; 20170095195; 20170104503; 20170108943; 20170117854; 20170141807; 20170141938; 20170163465; 20170170999; 20170180061; 20170195053; 20170207934; 20170214468; 20170214470; 20170222717; 20170244582; 20170245054; 20170245079; 20170255593; 20170272283; 20170304625; 20170322243; 20170324421; 20170338841; 20170338842; 20170339569; 20170346510; 20170366209; 20170366259; 20170373647; 20170373759; 20180013456; 20180013495; 20180026586; 20180026673; 20180041219; 20180062674; 20180070394; 20180102850; 20180131502; 20180167042; 20180167092; 20180167093; 20180180420; 20180191448; 20180219566; 20180254769; 20180262370; 20180269988; 20180279197; 20180294879; 20180294884; 20180302111; 20180309465; 20180316320; 20180331814; 20180333580; 20180367219; 20190007075; 20190013867; 20190013874; 20190013991; 20190020415; 20190028131; 20190030334; 20190036622; and 20190042536.

5G REFERENCES

U.S. Pat. Nos. 6,675,125; 6,778,966; 7,027,981; 7,190,292; 7,206,420; 7,212,640; 7,558,391; 7,865,177; 8,085,943; 8,599,014; 8,725,706; 8,776,625; 8,898,567; 8,989,762; 9,160,579; 9,203,654; 9,235,268; 9,401,823; 9,432,564; 9,460,617; 9,531,427; 9,544,006; 9,564,927; 9,565,045; 9,613,408; 9,621,387; 9,660,851; 9,680,670; 9,686,112; 9,712,238; 9,712,350; 9,712,354; 9,713,019; 9,722,318; 9,729,281; 9,729,378; 9,742,521; 9,749,083; 9,774,476; 9,859,981; 9,871,679; 9,876,530; 9,877,206; 9,882,608; 9,893,919; 9,899,182; 9,900,048; 9,900,122; 9,900,123; 9,900,190; 9,912,436; 9,929,755; 9,942,074; 9,998,172; 9,998,187; 10,003,364; 10,027,397; 10,027,427; 10,027,523; 10,033,107; 10,033,108; 10,050,815; 10,051,483; 10,051,488; 10,062,970; 10,063,354; 10,069,467; 10,069,535; 10,079,652; 10,084,562; 10,090,594; 10,096,883; 10,103,777; 10,123,217; 10,129,057; 10,135,145; 10,148,016; 10,148,360; 10,168,501; 10,170,840; 10,171,158; 10,191,376; 10,198,582; 10,200,106; 10,205,212; 10,205,231; 10,205,482; 10,205,655; 10,211,855; 10,212,014; 10,218,405; 10,224,634; 20020051546; 20020085725; 20020103619; 20020172374; 20020172376; 20020172378; 20030035549; 20030055635; 20030098805; 20030112088; 20090221257; 20110238690; 20110249024; 20110252320; 20110288457; 20120112908; 20130110974; 20130201316; 20140226035; 20150146805; 20150146806; 20150230105; 20150280945; 20150310739; 20160093029; 20160149665; 20160149731; 20160197642; 20160218891; 20160226681; 20160352361; 20160352362; 20160352419; 20170012862; 20170018851; 20170018852; 20170019131; 20170026095; 20170032129; 20170033465; 20170033466; 20170033953; 20170033954; 20170063430; 20170078400; 20170085003; 20170085336; 20170093693; 20170104617; 20170110795; 20170110804; 20170111805; 20170134205; 20170201288; 20170229782; 20170230083; 20170245157; 20170269481; 20170271117; 20170288917; 20170295048; 20170311307; 20170317781; 20170317782; 20170317783; 20170317858; 20170318482; 20170331899; 20180013452; 20180034912; 20180048497; 20180054232; 20180054233; 20180054234; 20180054268; 20180062886; 20180069594; 20180069731; 20180076947; 20180076979; 20180076982; 20180076988; 20180091195; 20180115040; 20180115058; 20180123256; 20180123257; 20180123749; 20180123836; 20180123856; 20180123897; 20180124181; 20180131406; 20180131541; 20180145411; 20180145412; 20180145414; 20180145415; 20180151957; 20180152262; 20180152330; 20180152925; 20180159195; 20180159196; 20180159197; 20180159228; 20180159229; 20180159230; 20180159232; 20180159240; 20180159243; 20180159615; 20180166761; 20180166784; 20180166785; 20180166787; 20180167105; 20180167148; 20180175892; 20180175978; 20180198668; 20180205399; 20180205481; 20180227158; 20180248592; 20180254754; 20180254924; 20180262243; 20180278693; 20180278694; 20180294897; 20180301812; 20180302145; 20180309206; 20180323826; 20180324005; 20180324006; 20180324021; 20180324601; 20180331413; 20180331720; 20180331721; 20180331871; 20180343304; 20180351687; 20180358678; 20180359126; 20180375940; 20190013577; 20190013837; 20190013838; 20190020530; 20190036222; 20190052505; 20190074563; 20190074564; 20190074565; 20190074568; 20190074580; 20190074584; 20190074597; 20190074598; 20190074864; 20190074865; and 20190074878.

The invention claimed is:

1. A distortion-compensating processor, comprising:
an input port configured to receive a distorted signal y(n) representing information x(n) distorted by a channel h;
at least one automated processor, configured to:

decompose the distorted signal y(n) as a Volterra series expansion $$y(n) = \sum_{d=0}^{D}\sum_{k=0}^{P} b_{kd} x(n-d)|x(n-d)|^{k-1};$$

and implement an equalizer operating on separate terms of the Volterra series expansion to produce an output z(n) having reduced distortion with respect to the distorted signal y(n), the equalizer comprising a deep neural network comprising a plurality of neural network hidden layers trained with respect to distortion of the channel h to provide an input-output response and $$z(n) = \sum_{k=1}^{P}\sum_{d_1=0}^{D} \cdots \sum_{d_k=0}^{D} f_{d_1,\ldots,d_k} \prod_{i=1}^{k} r(n-d_i);$$

and
an output port configured to present the output, wherein:
r(n) is a response of the channel h to the nonlinearly distorted radio frequency signal y(n);
p is a respective nonlinearity order;
d is a memory depth parameter;
D is a total memory length;
P is a total nonlinearity order;
k is a nonlinear order; and
$b_{kd}$ are nonlinear response parameters.

2. The distortion-compensating processor according to claim 1, wherein the distorted signal is received from a radio receiver.

3. The distortion-compensating processor according to claim 1, wherein the distorted signal is distorted by amplification by a radio frequency power amplifier and transmission through a radio frequency communication channel.

4. The distortion-compensating processor according to claim 1, wherein:

the undistorted radio frequency signal x(n) is distorted by an analog process to produce the nonlinearly distorted radio frequency signal y(n), which passes through the channel h;

$$r(n) = \sum_{\ell=0}^{L} h_\ell y(n-\ell) + v(n)$$

is a response signal sequence, wherein r(n) is stacked together into M+1 dimensional vectors r(n)=[r(n), ..., r(n−M)]$^T$, where (•)$^T$ denotes transpose, such that r(n)=HG(n)x(n)+v(n);

$h_\ell$ is a set of finite-impulse response channel coefficients;
$\ell$ is an equalization delay;
v(n) is an additive white Gaussian noise component signal sequence;
H is an (M+1)×(M+L+1) dimensional channel matrix $$H = \begin{bmatrix} h_o & \cdots & h_L & & \\ & \ddots & & \ddots & \\ & & h_o & \cdots & h_L \end{bmatrix};$$

$G(n) = \text{diag}\{V_{y(n)}e^{j\psi_{y(n)}}, \ldots, V_{n(y-M-L)}e^{j\psi_{y(n-M-L)}}\}$ is an (M+L+1)×(M+L+1) dimensional diagonal matrix of the nonlinear responses, $x(n)=[x(n), \ldots, x(n-M-L)]^T$, and $v(n)=[v(n), \ldots, v(n-M)]^T$;

$f^T=G'(n)[f_0, \ldots, f_M]$, where $[f_0, \ldots, f_M]H \approx [0, \ldots, 1, \ldots, 0]$ is computed by the equalizer to equalize the channel h;

$$G'(n) = \frac{1}{V_{y(n-d)}} e^{-j\psi_{y(n-d)}}$$

is computed by the equalizer to equalize the analog process;
r̂(n) is a resulting sequence after linear channel equalization;
z(n)=f$^T$ r(n)≈x(n−d) represents the output with equalization delay d; and $$z(n) = \sum_{d=0}^{D}\sum_{p=0}^{P} g_{kd} \hat{r}(n-d)|\hat{r}(n-d)|^{k-1}$$

is a Volterra series model of the equalizer with coefficients $g_{kd}$ such that z(n)≈x(n−$\ell$) for some equalization delay $\ell$, wherein:
coefficients $g_{kd}$ are determined according to $$\min_{\{g_{kd}\}} \sum_{n=L}^{N} \left| x(n-L) - \sum_{d=0}^{D}\sum_{k=1}^{P} g_{kd} \hat{r}(n-d)|\hat{r}(n-d)|^{k-1} \right|^2$$

with training symbols x(n) and received samples r̂(n),
z(n)=arg min$_{\forall x(n)}$|r̂(n)−V$_y$e$^{j\psi_y}$x(n)|$^2$ is a maximum likelihood estimation operator for a nonlinear equalization output signal sequence having reduced distortion,
V$_y$ is an amplitude of a signal sequence y(n),
$\psi_y$ is a phase change of the signal sequence y(n); and
the deep neural network equalizer is trained to determine the channel coefficients $h_\ell$, analog process responses V$_y$, $\psi_y$, and the channel equalizer f$^T$.

5. The distortion-compensating processor according to claim 4, wherein:

vector $a = [g_{00}, g_{01}, \ldots, g_{PD}]^T$, vector $x = [x(0); \ldots, x(N-L)]^T$, vector $B = \begin{bmatrix} \hat{r}(L) & \hat{r}(L)|\hat{r}(L)| & \cdots & \hat{r}(L-D)|\hat{r}(L-D)|^{P-1} \\ \vdots & & & \vdots \\ \hat{r}(N) & \hat{r}(N)|\hat{r}(N)| & \cdots & \hat{r}(N-D)|\hat{r}(N-D)|^{P-1} \end{bmatrix}$, and $$\min_{\{g_{kd}\}} \sum_{n=L}^{N} \left| x(n-L) - \sum_{d=0}^{D}\sum_{k=1}^{P} g_{kd} \hat{r}(n-d)|\hat{r}(n-d)|^{k-1} \right|^2 \approx \min_a \|x - Ba\|^2,$$

having solution a=B$^+$x, where B$^+$=(B$^H$B)$^{-1}$B is the pseudo-inverse of the matrix B.

6. The distortion-compensating processor according to claim 1, wherein the Volterra series expansion comprises at least fifth order terms, and the deep neural network comprises at least two convolutional network layers.

7. The distortion-compensating processor according to claim 1, wherein the deep neural network comprises at least three one-dimensional layers, each layer having at least 10 feature maps, and a fully connected layer subsequent to the at least three layers.

8. The distortion-compensating processor according to claim 1, wherein the distorted signal comprises a transmitted orthogonal frequency multiplexed radio frequency signal.

9. The distortion-compensating processor according to claim 1, further comprising a demodulator, configured to demodulate the output as the set of symbols representing the information.

10. A method of compensating for a distortion, comprising:
receiving a distorted signal y(n) representing information x(n) distorted and communicated through a channel h;
decomposing the distorted signal y(n) with a Volterra processor to produce a Volterra series expansion of form $$y(n) = \sum_{d=0}^{D}\sum_{k=0}^{P} b_{kd} x(n-d)|x(n-d)|^{k-1};$$

and
equalizing the distorted signal y(n) with an automated nonlinear equalizer, comprising a deep neural network having a plurality of neural network hidden layers trained with respect to distortion of the channel h to have an input-output response $$z(n) = \sum_{k=1}^{P}\sum_{d_1=0}^{D}\cdots\sum_{d_k=0}^{D} f_{d_1,\ldots,d_k} \prod_{i=1}^{k} r(n-d_i),$$

which receives the Volterra series expansion, and produces an output z(n) having reduced distortion with respect to the distorted signal y(n),
wherein:
r(n) is a response of channel h to the nonlinearly distorted radio frequency signal y(n);
p is a respective nonlinearity order;
d is a memory depth parameter;
D is a total memory length;
P is a total nonlinearity order;
k is a nonlinear order; and
$b_{kd}$ are nonlinear response parameters.

11. The method according to claim 10, wherein the input comprises a radio frequency orthogonal frequency multiplexed signal amplified and distorted by a radio frequency power amplifier, received though a radio receiver.

12. The method according to claim 10, further comprising:
computing a maximum likelihood estimation for a nonlinear equalization $z(n)=\arg\min_{\forall x(n)}|(\hat{f}(n) - V_y e^{j\psi_y} x(n)|^2$, to produce the output $z(n)=f^T r(n) \approx x(n-d)$, with equalization delay d;
training the deep neural network to determine the channel coefficients $h_\ell$ of the channel h, having a channel amplitude response $V_y$, a channel phase response $\psi_y$, and a channel equalization response $f^T$;
approximating G'(n) with a Volterra series model $$z(n) = \sum_{d=0}^{D}\sum_{k=0}^{P} g_{kd}\hat{r}(n-d)|\hat{r}(n-d)|^{k-1},$$

with coefficients $g_{kd}$ designed such that $z(n) \approx x(n-\ell)$ for equalization delay $\ell$, and estimated according to $$\min_{\{g_{kd}\}} \sum_{n=L}^{N}\left| x(n-L) - \sum_{d=0}^{D}\sum_{k=1}^{P} g_{kd}\hat{r}(n-d)|\hat{r}(n-d)|^{k-1} \right|^2,$$

with training symbols x(n) and received samples r̂(n);
wherein:
channel h, produces response $$r(n) = \sum_{\ell=0}^{L} h_\ell y(n-\ell) + v(n)$$

from y(n);
$h_\ell$ is a set of finite-impulse response channel coefficients;
$\ell$ is an equalization delay;
v(n) is an additive white Gaussian noise component;
r(n) is stacked together into M+1 dimensional vectors $r(n)=[r(n), \ldots, r(n-M)]^T$, where $(\bullet)^T$ denotes transpose, such that $r(n)=HG(n)x(n)+v(n)$;
H is an (M+1)×(M+L+1) dimensional channel matrix $$H = \begin{bmatrix} h_o & \ldots & h_L & & \\ & \ddots & & \ddots & \\ & & h_o & \ldots & h_L \end{bmatrix};$$

$G(n)=\text{diag}\{V_{y(n)}e^{j\psi_{y(n)}}, \ldots, V_{n(y-M-L)}e^{j\psi_{y(n-M-L)}}\}$ is an (M+L+1)×(M+L+1) dimensional diagonal matrix which consists of the nonlinear responses, $x(n)=[x(n), \ldots, x(n-M-L)]^T$, and $v(n)=[v(n), \ldots, v(n-M)]^T$;
$f^T=G'(n)[f_0, \ldots, f_M]$, where $[f_0, \ldots, f_M]H \approx [0, \ldots, 1, \ldots, 0]$ represents a channel equalization;

$$G'(n) = \frac{1}{V_{y(n-d)}} e^{-j\psi_{y(n-d)}}$$

represents an analog processor equalization; and
f̂(n) is a linearized representation of r(n).

13. The method according to claim 12, wherein:

vector $a = [g_{00}, g_{01}, \ldots, g_{PD}]^T$, vector $x = [x(0); \ldots, x(N-L)]^T$, $$\text{vector } B = \begin{bmatrix} \hat{r}(L) & \hat{r}(L)|\hat{r}(L)| & \ldots & \hat{r}(L-D)|\hat{r}(L-D)|^{P-1} \\ \vdots & & & \vdots \\ \hat{r}(N) & \hat{r}(N)|\hat{r}(N)| & \ldots & \hat{r}(N-D)|\hat{r}(N-D)|^{P-1} \end{bmatrix}, \text{and}$$

$$\min_{\{g_{kd}\}} \sum_{n=L}^{N}\left| x(n-L) - \sum_{d=0}^{D}\sum_{k=1}^{P} g_{kd}\hat{r}(n-d)|\hat{r}(n-d)|^{k-1} \right|^2 \approx \min_a \|x - Ba\|^2,$$

having solution $a=B^+x$, where $B^+=(B^HB)^{-1}B$ is the pseudo-inverse of the matrix B.

14. The method according to claim 10, wherein:
the Volterra series expansion comprises at least fifth order terms; and
the deep neural network comprises at least three layers, each layer having at least 10 feature maps, and a fully connected layer subsequent to the at least three layers.

15. The method according to claim 10, further comprising demodulating the output z(n) as the set of information symbols.

16. A non-linear distortion-compensating processor, comprising:
an input configured to receive a non-linearly distorted radio frequency signal r(n) representing information x(n) distorted by a radio frequency communication system to produce a distorted signal y(n) communicated through a channel h;
at least one automated processor, configured to:
decompose the non-linearly distorted radio frequency signal r(n) received from the channel h as a Volterra series expansion $$y(n) = \sum_{d=0}^{D}\sum_{k=0}^{P} b_{kd} x(n-d)|x(n-d)|^{k-1};$$

process the Volterra series expansion with a deep neural network comprising a plurality of neural network hidden layers trained with respect to the distortion of the radio frequency communication system comprising the non-linear distortion and channel distortion, to equalize the distortion, the process having an input-output response $$z(n) = \sum_{k=1}^{P}\sum_{d_1=0}^{D} \cdots \sum_{d_k=0}^{D} f_{d_1, \cdots, d_k} \prod_{i=1}^{k} r(n-d_i);$$

and
demodulate z(n) to extract the information x(n) modulated in the non-linearly distorted radio frequency signal r(n),
wherein:
p is a respective nonlinearity order;
d is a memory depth parameter;
D is a total memory length;
P is a total nonlinearity order;
k is a nonlinear order; and
$b_{kd}$ are nonlinear response parameters.

17. The non-linear distortion-compensating processor according to claim 16, wherein the non-linearly distorted radio frequency signal is an orthogonal frequency multiplexed signal which is distorted by amplification by a power amplifier and transmission over the communication channel h.

18. The non-linear distortion-compensating processor according to claim 16, wherein the deep neural network comprises at least three convolutional network layers, each layer having at least 10 feature maps, and a fully connected layer subsequent to the at least three layers.

19. The non-linear distortion-compensating processor according to claim 16, wherein the deep neural network is trained with data comprising symbol-specific pairs of the information x(n) and the corresponding non-linearly distorted radio frequency signal r(n) representing the non-linearly distorted information y(n) communicated through the channel h.

20. The non-linear distortion-compensating processor according to claim 16, wherein the response r(n) of the channel h is $$r(n) = \sum_{\ell=0}^{L} h_\ell y(n-\ell) + v(n);$$

and
the at least one automated processor is further configured to:
compute a maximum likelihood estimation for a nonlinear equalization $z(n)=\arg\ \min_{\forall x(n)}|\hat{r}(n)-V_y e^{j\psi_y} x(n)|^2$, to produce output $z(n)=f^T r(n) \approx x(n-d)$, with equalization delay d;
train the deep neural network equalizer to determine a set of finite-impulse response channel coefficients $h_\ell$ of the channel h, having a channel amplitude response $V_y$, a channel phase response $\psi_y$, and a channel equalization response $f^T$; and
approximate G'(n) with a Volterra series model $$z(n) = \sum_{d=0}^{D}\sum_{k=0}^{P} g_{kd}\hat{r}(n-d)|\hat{r}(n-d)|^{k-1},$$

with $g_{kd}$ designed such that $z(n) \approx x(n-\ell)$ for equalization delay $\ell$, and coefficients $g_{kd}$ estimated according to $$\min_{\{g_{kd}\}} \sum_{n=L}^{N} \left| x(n-L) - \sum_{d=0}^{D}\sum_{k=1}^{P} g_{kd}\hat{r}(n-d)|\hat{r}(n-d)|^{k-1} \right|^2,$$

with training symbols x(n) and received samples $\hat{r}(n)$;
wherein:
$\ell$ is an equalization delay;
v(n) is an additive white Gaussian noise component;
r(n) is stacked together into M+1 dimensional vectors $r(n)=[r(n), \ldots, r(n-M)]^T$, where $(\bullet)^T$ denotes transpose, such that r(n)=HG(n)x(n)+v(n);
H is an (M+1)×(M+L+1) dimensional channel matrix $$H = \begin{bmatrix} h_o & \cdots & h_L & & \\ & \ddots & & \ddots & \\ & & h_o & \cdots & h_L \end{bmatrix};$$

$G(n)=\text{diag}\ \{V_{y(n)}e^{j\psi_{y(n)}}, \ldots, V_{n(y-M-L)}e^{j\psi_{y(n-m-L)}}\}$ is an (M+L+1)×(M+L+1) dimensional diagonal matrix which consists of the nonlinear responses, $x(n)=[x(n), \ldots, x(n-M-L)]^T$, and $v(n)=[v(n), \ldots, v(n-M)]^T$; $f^T=G'(n)[f_0, \ldots, f_M]$, where $[f_0, \ldots, f_M]H \approx [0, \ldots, 1, \ldots, 0]$ represents a channel equalization, and $$G'(n) \approx \frac{1}{V_{y(n-d)}} e^{-j\psi_{y(n-d)}}$$

represents an analog processor equalization; and
$\hat{r}(n)$ is a linearized representation of r(n).

* * * * *